United States Patent
Momohara

(10) Patent No.: US 6,750,527 B1
(45) Date of Patent: Jun. 15, 2004

(54) SEMICONDUCTOR INTEGRATED CIRCUIT DEVICE HAVING A PLURALITY OF WELLS, TEST METHOD OF TESTING THE SEMICONDUCTOR INTEGRATED CIRCUIT DEVICE, AND TEST DEVICE WHICH EXECUTES THE TEST METHOD

(75) Inventor: Tomomi Momohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/511,620

(22) Filed: Feb. 23, 2000

Related U.S. Application Data

(63) Continuation of application No. 08/865,371, filed on May 29, 1997, now Pat. No. 6,055,655.

(30) Foreign Application Priority Data

May 30, 1996 (JP) .............................. 8-136892
May 1, 1997 (JP) .............................. 9-113900

(51) Int. Cl.[7] .......................... H01L 29/76; H01L 29/94; H01L 31/062; H01L 31/113; H01L 31/119
(52) U.S. Cl. .................... 257/511; 257/500; 257/501; 257/512; 257/355
(58) Field of Search .................. 287/500, 501, 287/511, 512, 525, 357, 364, 355, 398, 392, 393

(56) References Cited

U.S. PATENT DOCUMENTS

| | | | |
|---|---|---|---|
| 4,467,400 A | | 8/1984 | Stopper ...................... 361/403 |
| 4,742,385 A | | 5/1988 | Kohmoto ..................... 357/74 |
| 4,910,735 A | | 3/1990 | Yamashita ................. 371/22.4 |
| 5,239,197 A | * | 8/1993 | Yamamoto ................... 257/500 |
| 5,336,915 A | * | 8/1994 | Fujita et al. ................. 257/369 |
| 5,373,476 A | * | 12/1994 | Jeon ........................... 365/226 |
| 5,438,542 A | | 8/1995 | Atsumi et al. .............. 365/182 |
| 5,473,183 A | * | 12/1995 | Yonemoto ................... 257/371 |
| 5,491,358 A | | 2/1996 | Miyata |
| 5,514,889 A | * | 5/1996 | Cho et al. ................... 257/316 |
| 5,517,132 A | | 5/1996 | Ohara |
| 5,525,912 A | | 6/1996 | Momohara ................... 324/754 |
| 5,608,335 A | | 3/1997 | Tailliet ....................... 324/763 |
| 5,610,550 A | * | 3/1997 | Furutani ..................... 327/543 |
| 5,663,901 A | | 9/1997 | Wallace et al. ............... 365/52 |
| 5,668,755 A | * | 9/1997 | Hidaka ........................ 365/182 |
| 5,721,445 A | | 2/1998 | Singh et al. ................ 257/369 |
| 5,802,270 A | | 9/1998 | Ko et al. ................ 395/183.03 |
| 5,818,099 A | * | 10/1998 | Burghartz .................... 257/548 |
| 5,818,249 A | | 10/1998 | Momohara ................... 324/762 |
| 5,894,145 A | * | 4/1999 | Chen et al. .................. 257/296 |
| 5,900,665 A | * | 5/1999 | Tobita ......................... 257/357 |
| 5,936,282 A | * | 8/1999 | Baba et al. .................. 257/355 |
| 6,025,621 A | * | 2/2000 | Lee et al. .................... 257/296 |
| 6,033,945 A | * | 3/2000 | Ong ............................ 438/200 |
| 6,307,233 B1 | * | 10/2001 | Awaka et al. ............... 257/368 |
| 6,342,719 B1 | * | 1/2002 | Arai ............................ 257/371 |

FOREIGN PATENT DOCUMENTS

EP 0 810 667 A2 * 12/1997 ......... H01L/27/115

* cited by examiner

*Primary Examiner*—Jerome Jackson
*Assistant Examiner*—Jesse A. Fenty
(74) *Attorney, Agent, or Firm*—Hogan & Hartson, LLP

(57) ABSTRACT

A semiconductor device comprises a semiconductor substrate of a first conductivity type, at least one first well of a second conductivity type formed in the semiconductor substrate, and at least one second well of the first conductivity type formed in at least one first well. The semiconductor device is composed of semiconductor circuits each formed in at least one first well and at least one second well.

15 Claims, 52 Drawing Sheets

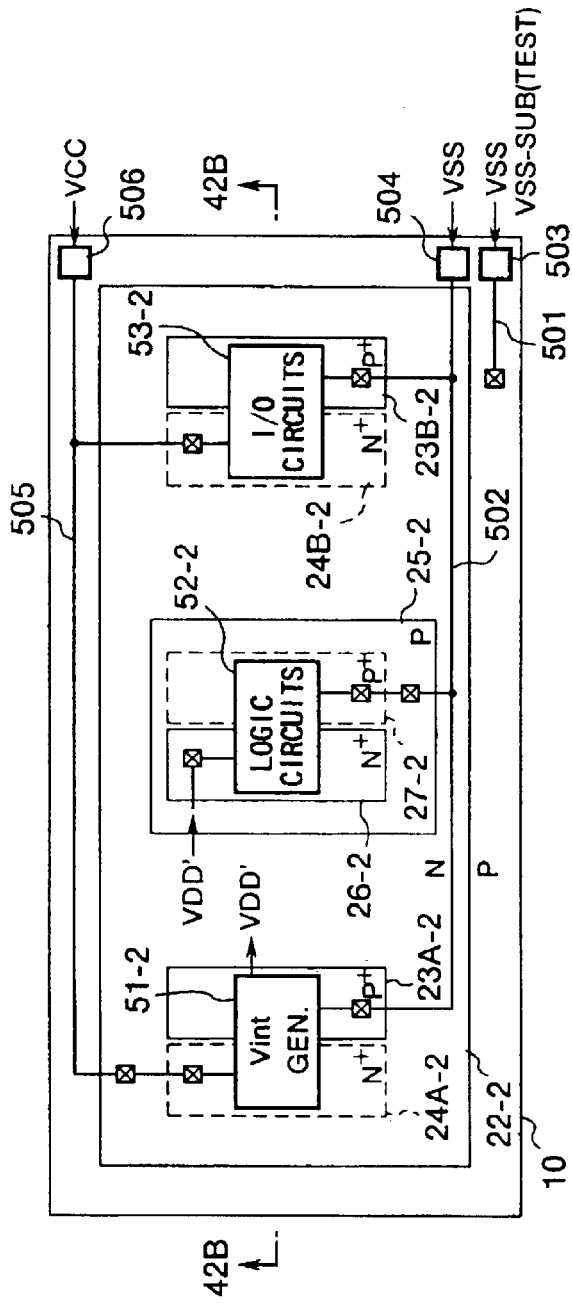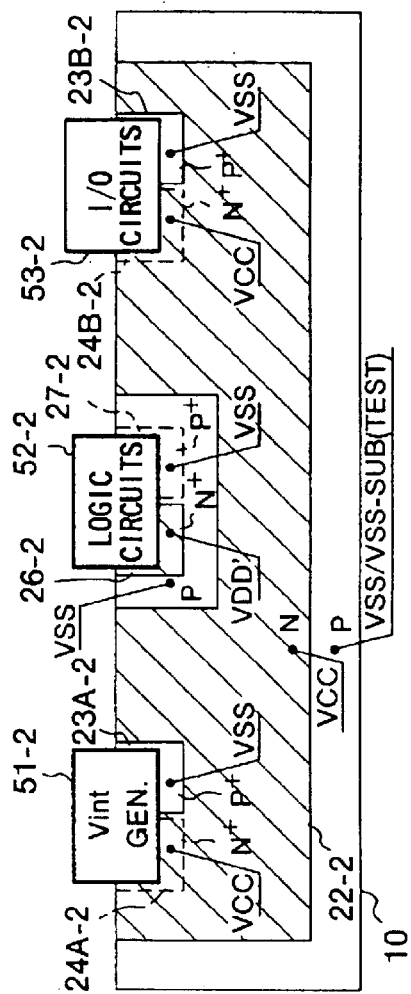
FIG. 42A
FIG. 42B

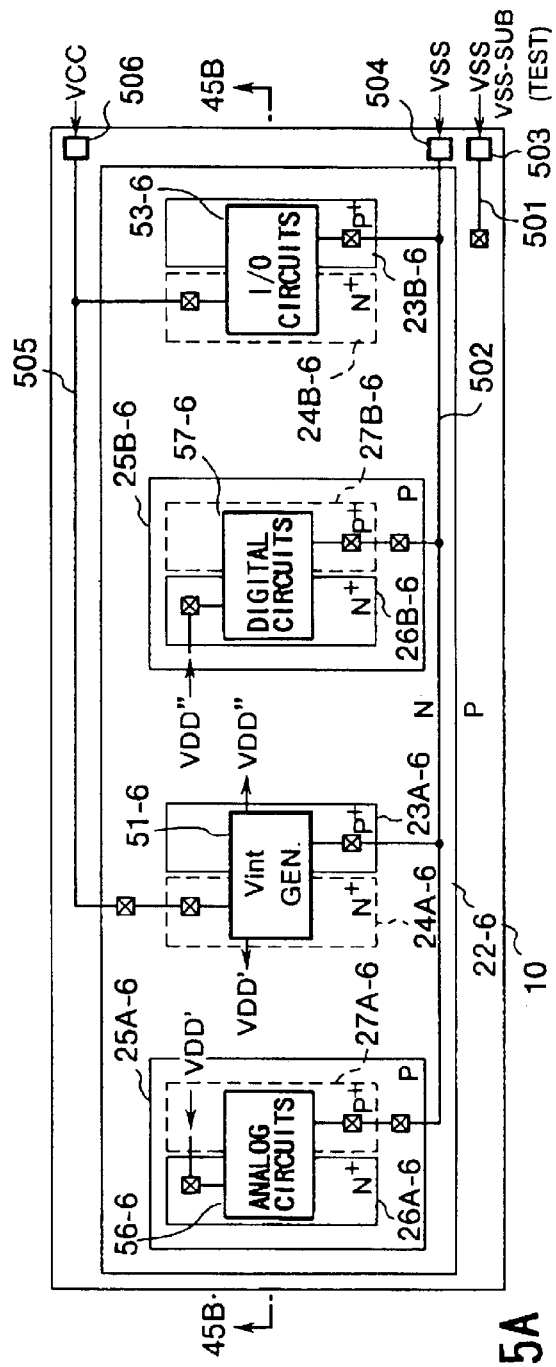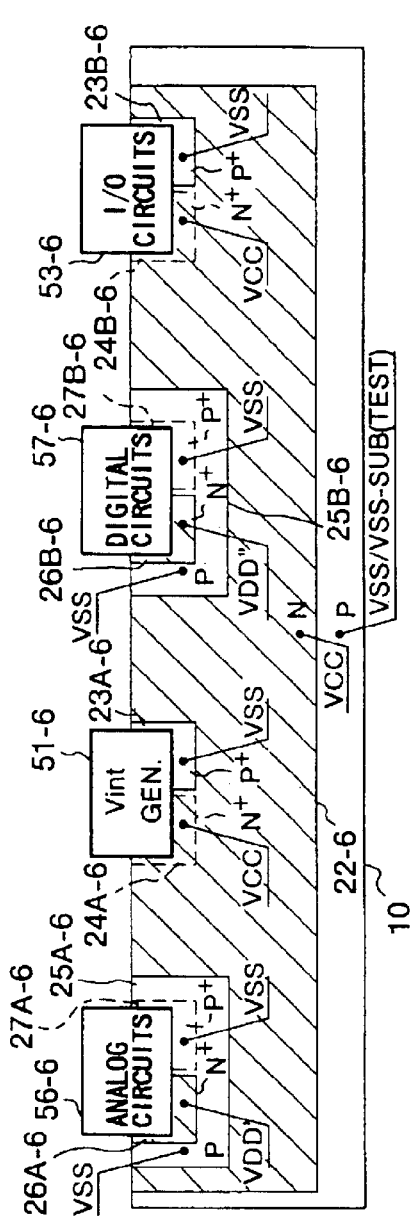
FIG. 45A
FIG. 45B

| VCCA=3.3V VCCB=2.5V | | | VCCA = VCCB = 3.3V | | |
|---|---|---|---|---|---|
| CONT.V | Vbp | Vbn | CONT.V | Vbp | Vbn |
| 1 | 4.5V | -1.5V | 0 | 3.3V (VCCB) | 0V (VSS) |

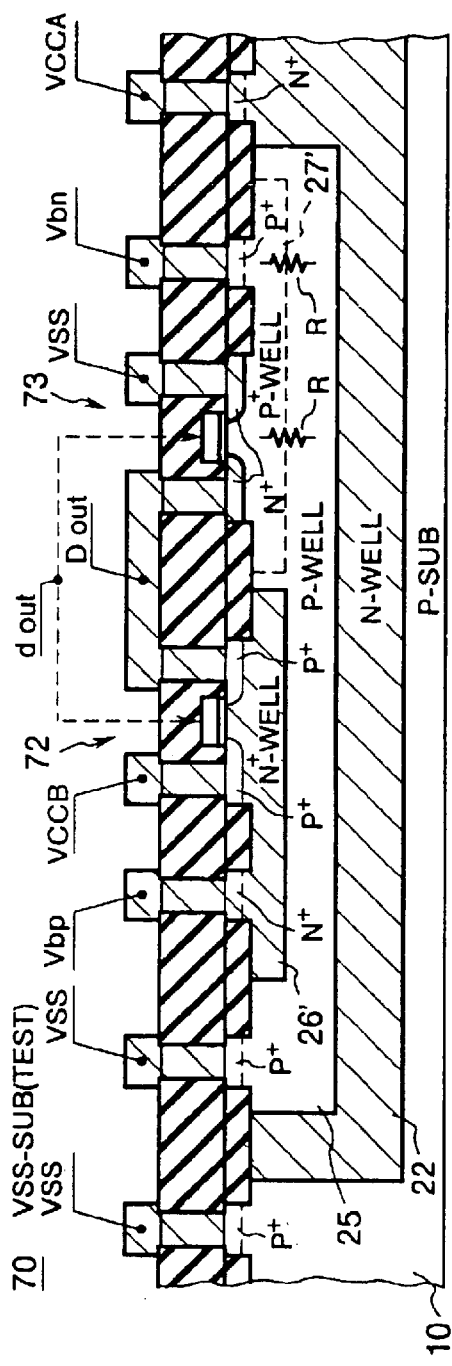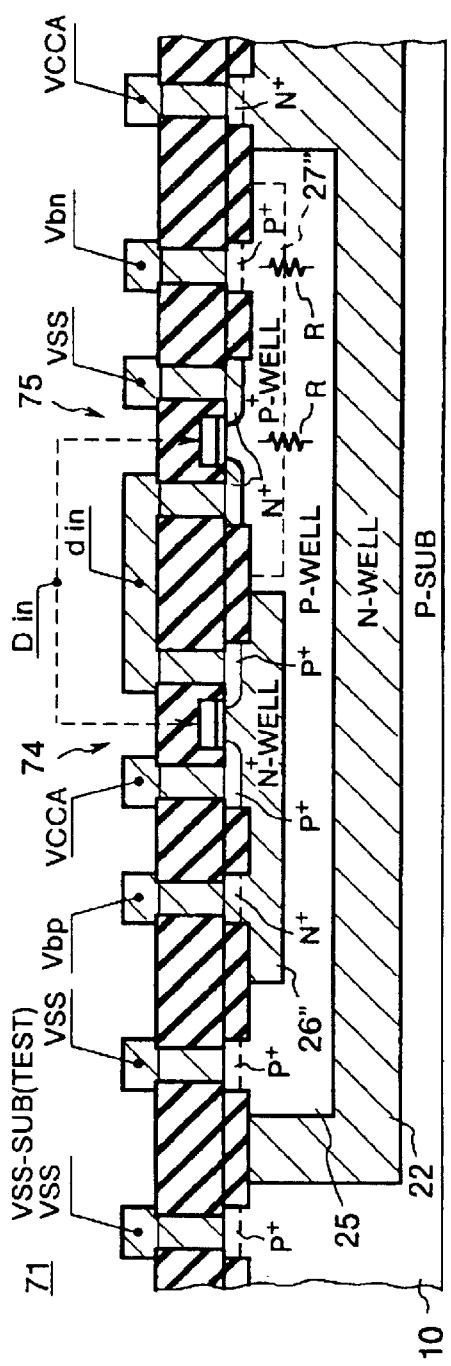
FIG. 52A
FIG. 52B

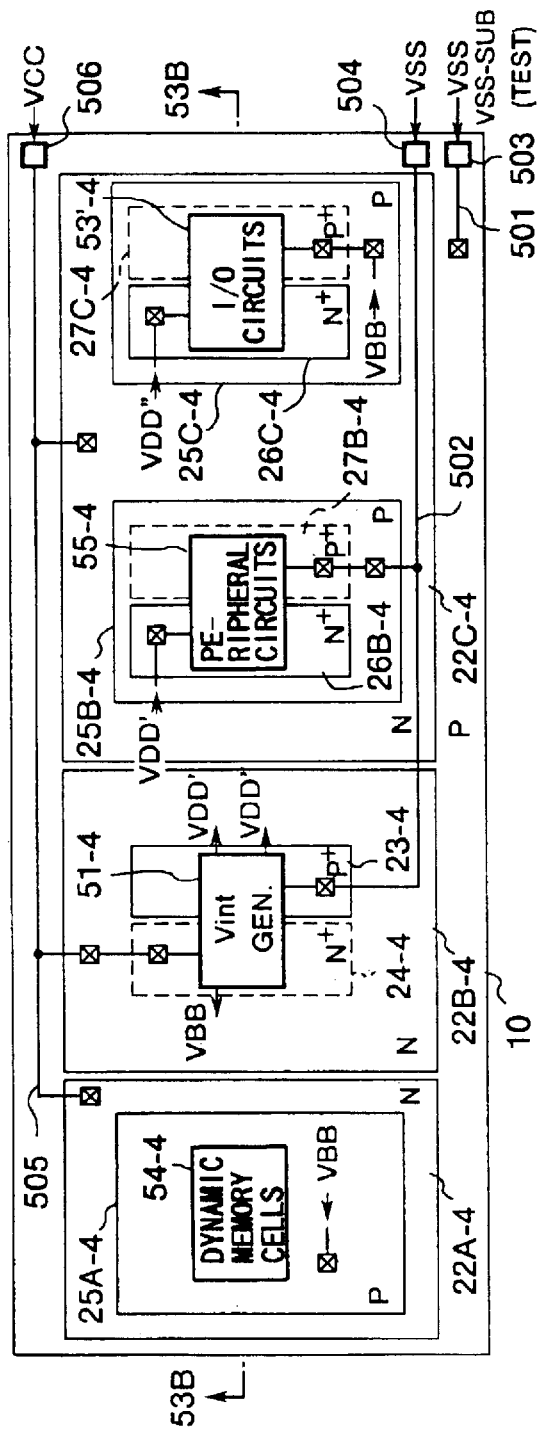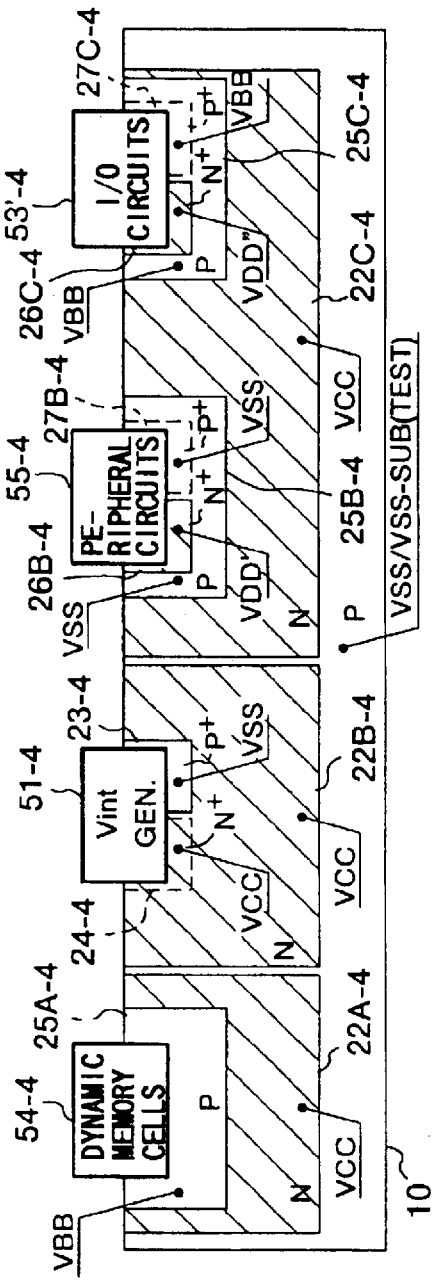
FIG. 53A
FIG. 53B

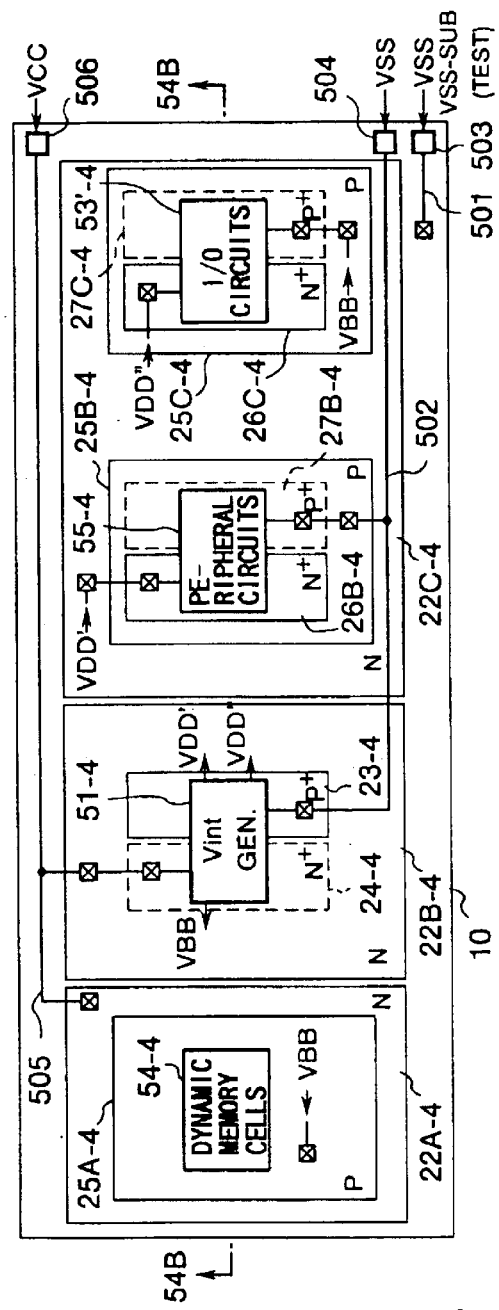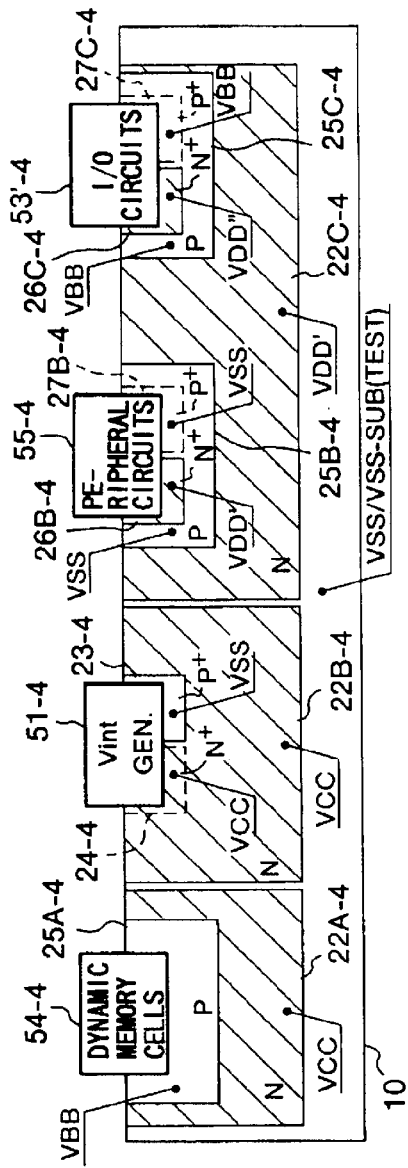
FIG. 54A
FIG. 54B

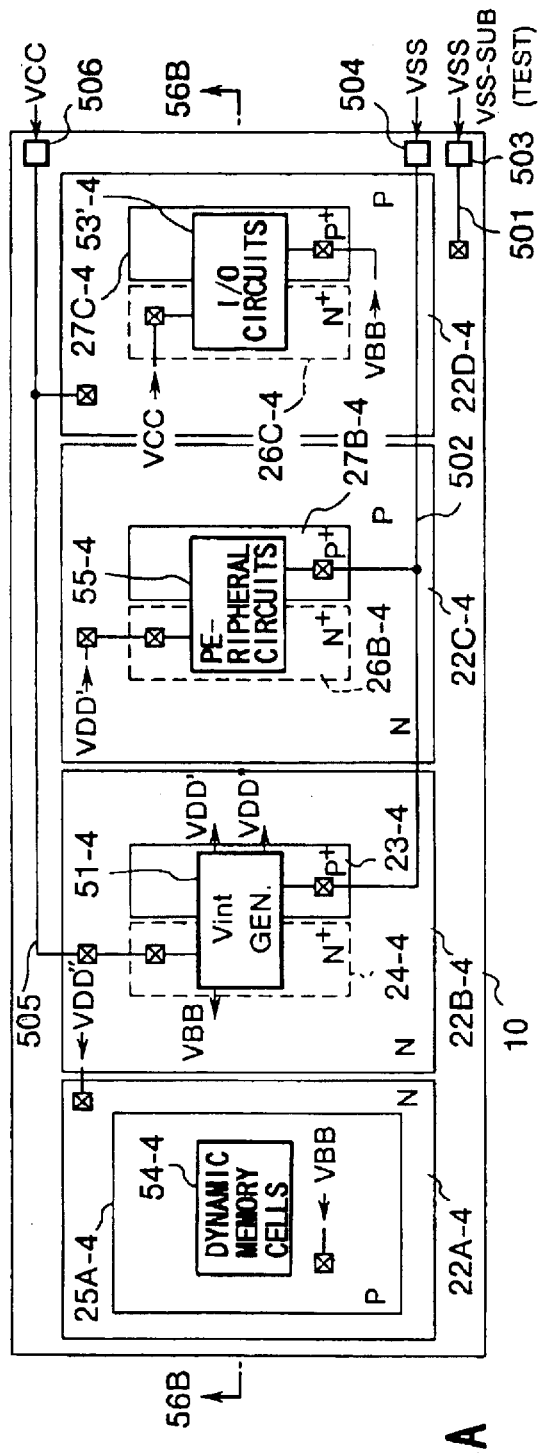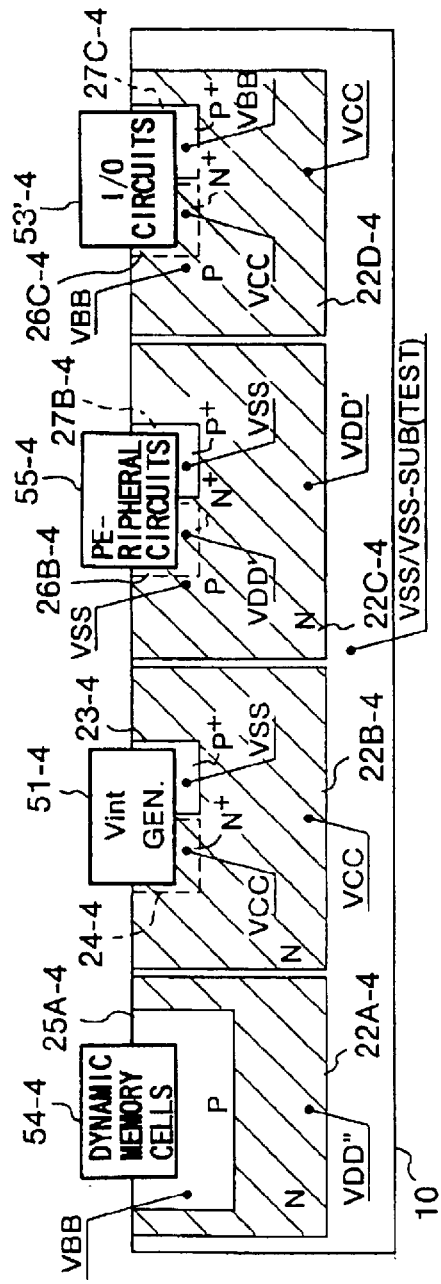
FIG. 56A
FIG. 56B

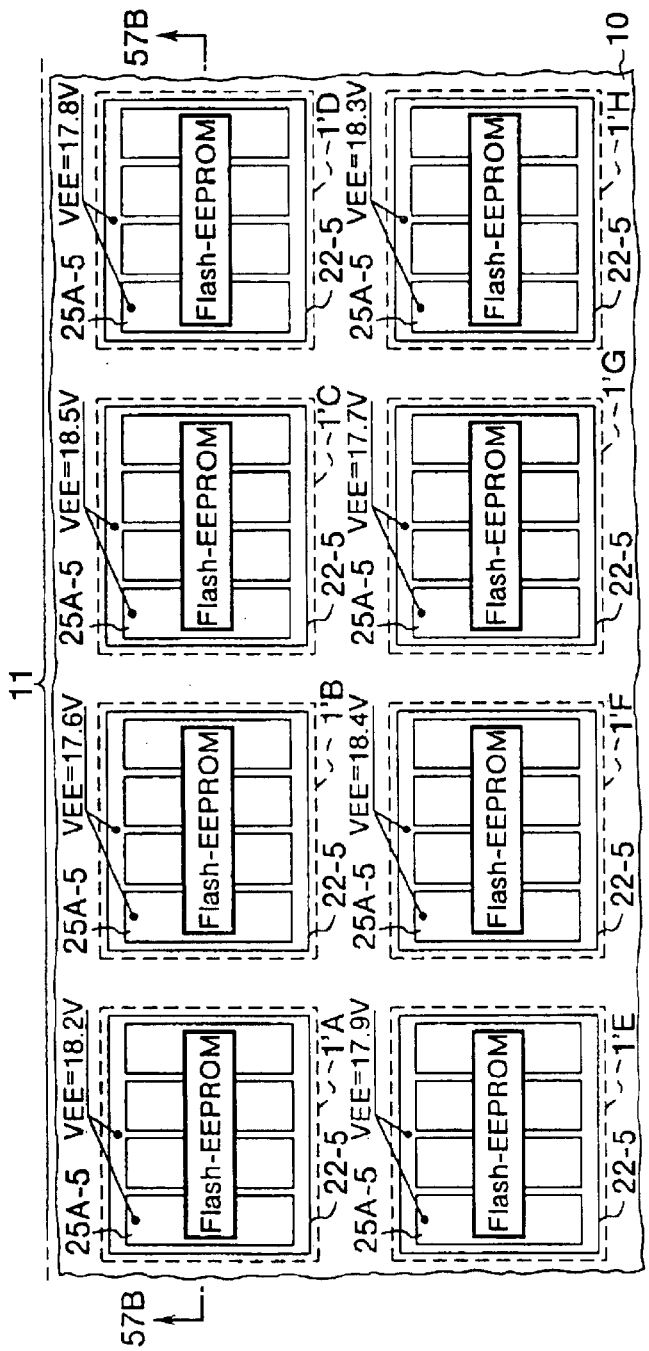
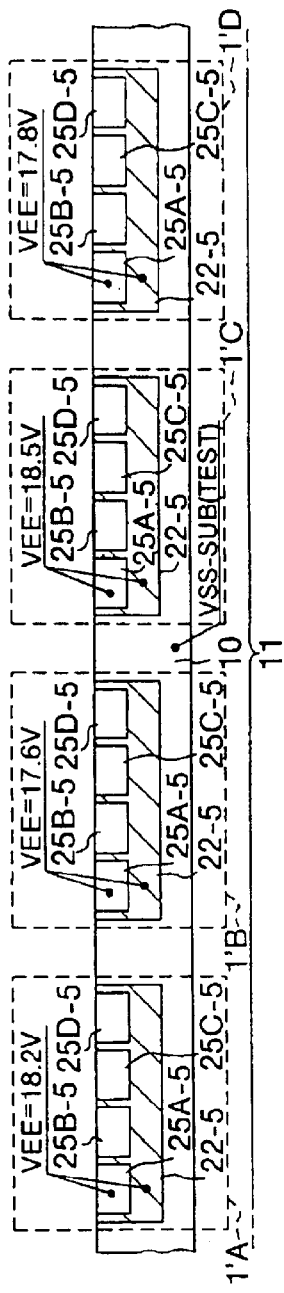
FIG. 57A
FIG. 57B

SEMICONDUCTOR INTEGRATED CIRCUIT DEVICE HAVING A PLURALITY OF WELLS, TEST METHOD OF TESTING THE SEMICONDUCTOR INTEGRATED CIRCUIT DEVICE, AND TEST DEVICE WHICH EXECUTES THE TEST METHOD

This is a continuation of application Ser. No. 08/865,371 filed May 29, 1997 now U.S. Pat. No. 6,055,655, which application is hereby incorporated by reference in its entirety.

BACKGROUND OF THE INVENTION

The present invention relates to a 1-chip type semiconductor integrated circuit (IC) device in which a plurality of functional circuits having different functions are integrated.

In the field of personal computers, mobile phones, game devices, etc. which use semiconductor devices, there is a great demand for an increase in the number of functions and a reduction in size and cost.

As the number of functions increases, the structure of the system becomes complex. As the system comes complex, a semiconductor device having various functions is required and a memory having a large capacity is needed. Thus, the number of single-unit semiconductor devices necessary for constructing the system increases.

There is a tendency that a greater number of functions are integrated in a 1-chip semiconductor device and the size of the 1-chip semiconductor device decreases. The same applies to a memory device. The capacity of a 1-chip memory increases while the size of the 1-chip memory decreases.

However, the increase in the number of functions is rapid while the decrease in size is slow.

Recently, a multi-chip module wherein semiconductor chips with different functions are packed has been developed, thereby advancing the reduction in size of the semiconductor product. In the multi-chip module, good-quality semiconductor chips are packed. As compared to the manufacture of a single-unit semiconductor device, an assembly step for assembling good-quality semiconductor chips needs to be provided. In the assembly step, if a defect in connection occurs, the produced device may become defective even if good-quality semiconductor chips are contained, and the reduction in manufacturing cost is prevented. This being the case, it cannot be said that the multi-chip module meets the demand for reduction in cost.

Under the circumstances, a so-called "system-on-silicone" technique, in which a plurality of functional circuits having different functions are integrated into only one semiconductor chip, has recently been developed. It is possible that the system-on-silicon technique will meet all requirements for the increase in the number of functions and the reduction in size and cost.

BRIEF SUMMARY OF THE INVENTION

A semiconductor device according to an aspect of the present invention comprises: a semiconductor substrate of a first conductivity type; at least one first well of a second conductivity type formed in the semiconductor substrate; and at least one second well of the first conductivity type formed in at least one first well, wherein the semiconductor device is composed of semiconductor circuits each formed in at least one first well and at least one second well.

BRIEF DESCRIPTION OF THE SEVERAL VIEWS OF THE DRAWING

FIG. 42A is a plan view of a semiconductor IC device according to a 16th embodiment of the invention;

FIG. 42B is a cross-sectional view taken along line 42B—42B in FIG. 42A;

FIG. 45A is a plan view of a semiconductor IC device according to a 19th embodiment of the invention;

FIG. 45B is a cross-sectional view taken along line 45B—45B in FIG. 45A;

FIG. 52A is a cross-sectional view of the output circuit shown in FIG. 51;

FIG. 52B is a cross-sectional view of the input circuit shown in FIG. 51;

FIG. 53A is a plan view of a semiconductor IC device according to a 23rd embodiment of the invention;

FIG. 53B is a cross-sectional view taken along line 53B—53B in FIG. 53A;

FIG. 54A is a plan view of a semiconductor IC device according to a 24th embodiment of the invention;

FIG. 54B is a cross-sectional view taken along line 54B—54B in FIG. 54A;

FIG. 56A is a plan view of a semiconductor IC device according to a 26th embodiment of the invention;

FIG. 56B is a cross-sectional view taken along line 56B—56B in FIG. 56A;

FIG. 57A is a plan view of a wafer on which a plurality of non-volatile chips are formed, illustrating a multi-test method for the non-volatile according to a 27th embodiment of the invention; and FIG. 57B is across-sectional view taken along line 57B—57B in FIG. 57A.

DETAILED DESCRIPTION OF THE INVENTION

Figure 1A:
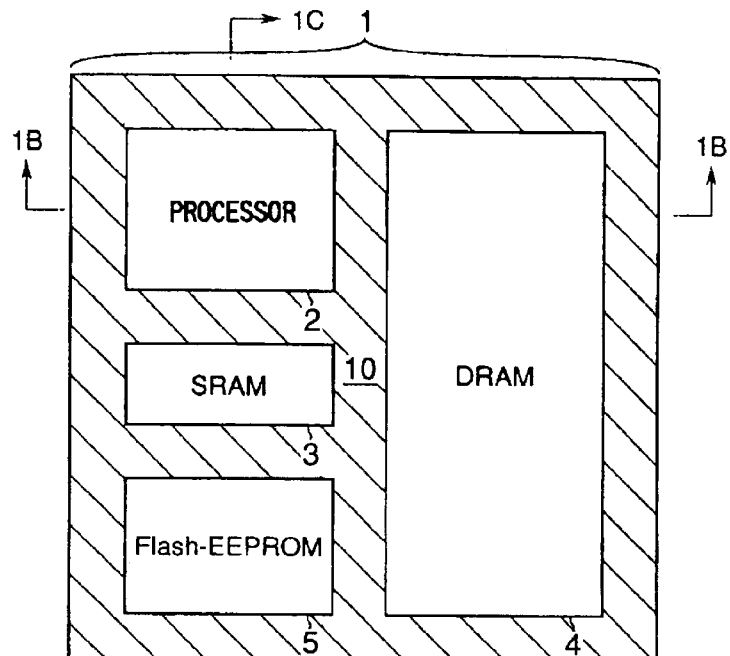
FIG. 1A is a plan view showing a semiconductor integrated circuit (IC) device according to a first embodiment of the present invention.
Figure 1B:
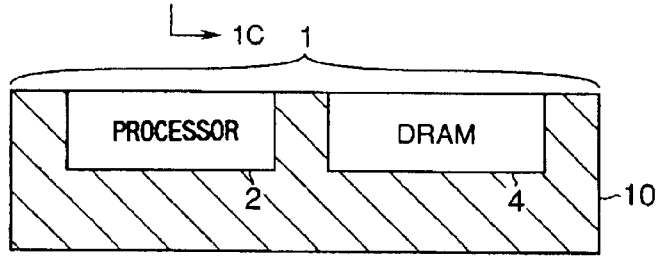
FIG. 1B is a cross-sectional view taken along line 1B—1B in FIG. 1A.
Figure 1C:
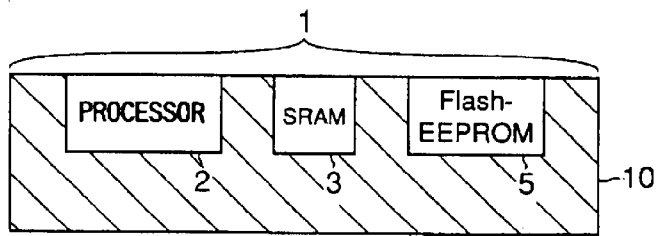
FIG. 1C is a cross-sectional view taken along line 1C—1C in FIG. 1A.

FIGS. 1A to 1C show a semiconductor integrated circuit (IC) device according to a first embodiment of the present invention, in which FIG. 1A is a plan view, FIG. 1B is a cross-sectional view taken along line 1B—1B in FIG. 1A, and FIG. 1C is a cross-sectional view taken along line 1C—1C in FIG. 1A.

As is shown in FIGS. 1A to 1C, a processor 2, an SRAM 3, a DRAM 4 and a flash-EEPROM 5 are mounted, as functional circuits, on a semiconductor IC chip 1. These functional circuits are isolated from one another by an isolating region 10 provided on the chip 1. The isolating region 10 is put in contact with the entire side surfaces of the chip 1.

In the first embodiment of the present invention, the processor 2 is defined as including, in addition to a microprocessor, circuits basically constituted by logic circuits, for example, control circuits such as a CPU (Central Processing Unit) and a DSP (Digital Signal Processor), arithmetic circuits, etc.

Similarly, the SRAM 3 is defined as including, in addition to an SRAM, a memory circuit basically constituted by a logic circuit, such as a cross-couple type latch circuit.

The DRAM 4 is defined as including a synchronous control type DRAM, etc. in addition to an asynchronous control type DRAM.

The flash-EEPROM 5 is defined as including a NAND circuit, etc. in addition to a NOR circuit.

Figure 2:
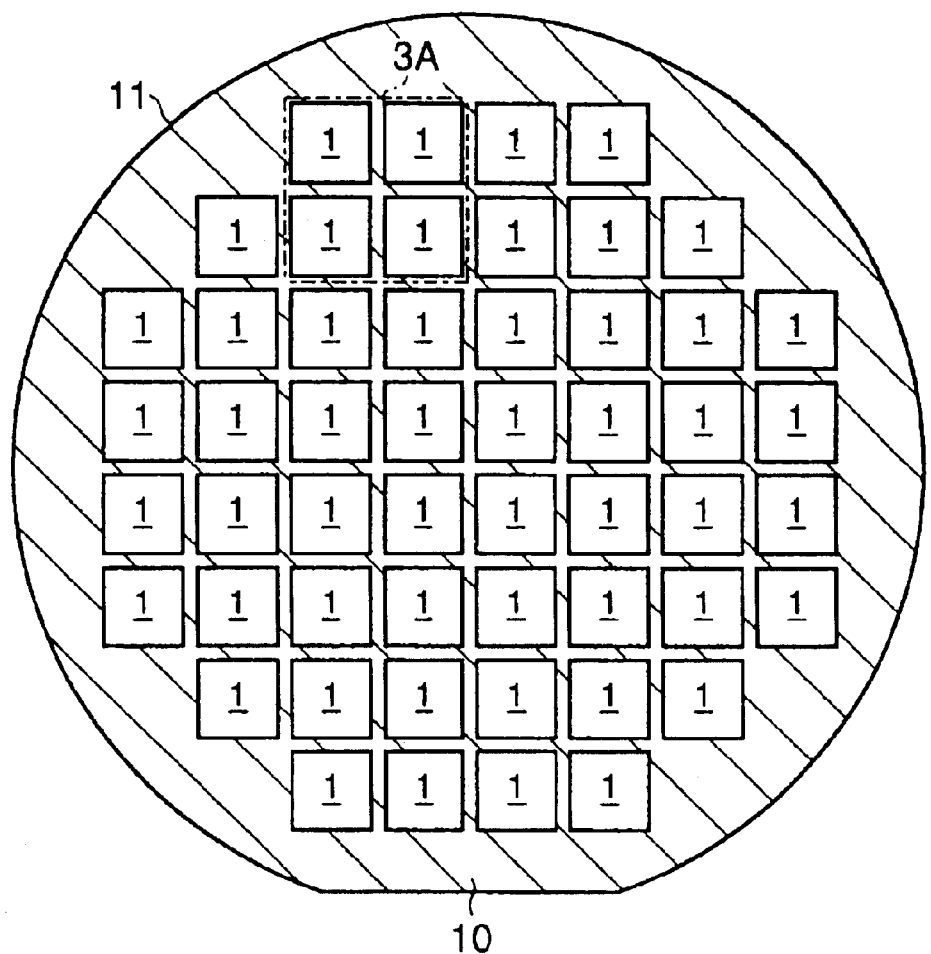
FIG. 2 is a plan view of a wafer on which semiconductor IC chips according to the first embodiment are formed.

FIG. 2 is a plan view of a wafer on which semiconductor IC chips 1 according to the first embodiment are formed.

In the state in which the chips 1 are formed on the silicon wafer 11, as shown in FIG. 2, the isolating region 10 is put in contact with the entire side surfaces of each chip 1. Thus, the chips 1 are isolated from one another by the isolate regions 10.

Figure 3A:
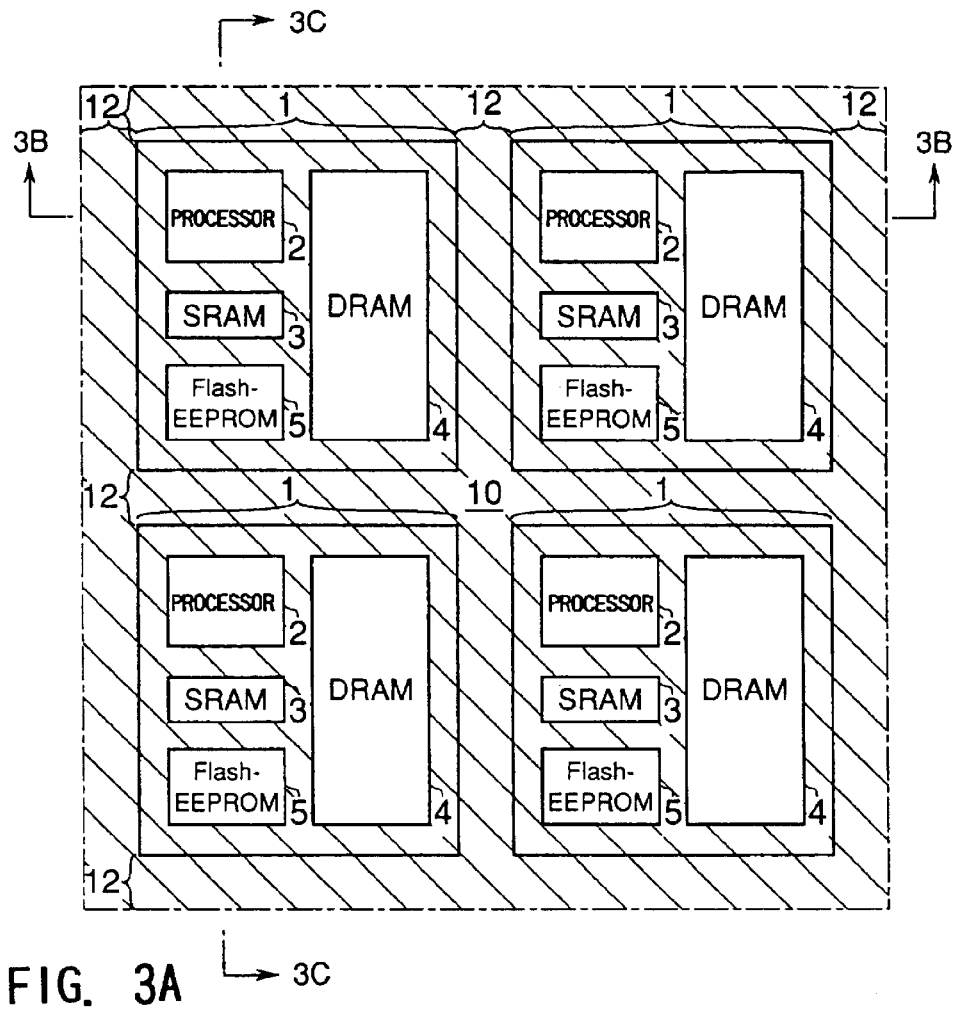
FIG. 3A is a plan view of a region shown by a dot-and-dash-line in FIG. 2.
Figure 3B:
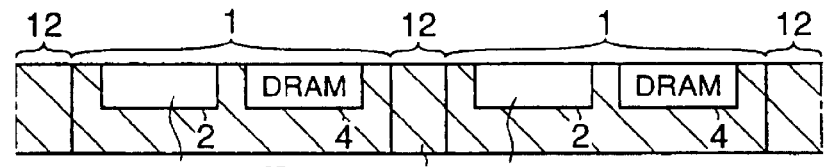
FIG. 3B is a cross-sectional view taken along line 3B—3B in FIG. 3A.
Figure 3C:
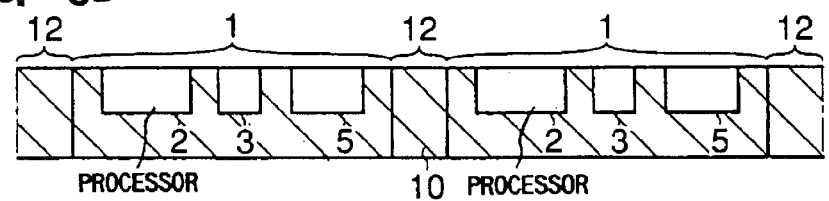
FIG. 3C is a cross-sectional view taken along line 3C—3C in FIG. 3A.

FIGS. 3A to 3C are enlarged views of the wafer shown in FIG. 2. FIG. 3A is a plan view of a region shown by a dot-and-dash-line in FIG. 2. FIG. 3B is a cross-sectional view taken along line 3B—3B in FIG. 3A, and FIG. 3C is a cross-sectional view taken along line 3C—3C in FIG. 3A.

As is shown in FIGS. 3A to 3C, dicing lines 12 are provided among the chips 1. The wafer 11 are diced along the dicing lines 12. Thereby, each chip 1 is cut out of the wafer 11. In this case, the isolating region 10 is provided on the dicing lines 12 and thus the isolating region 10 is put in contact with the entire side surfaces of each chip 1.

Figure 4:
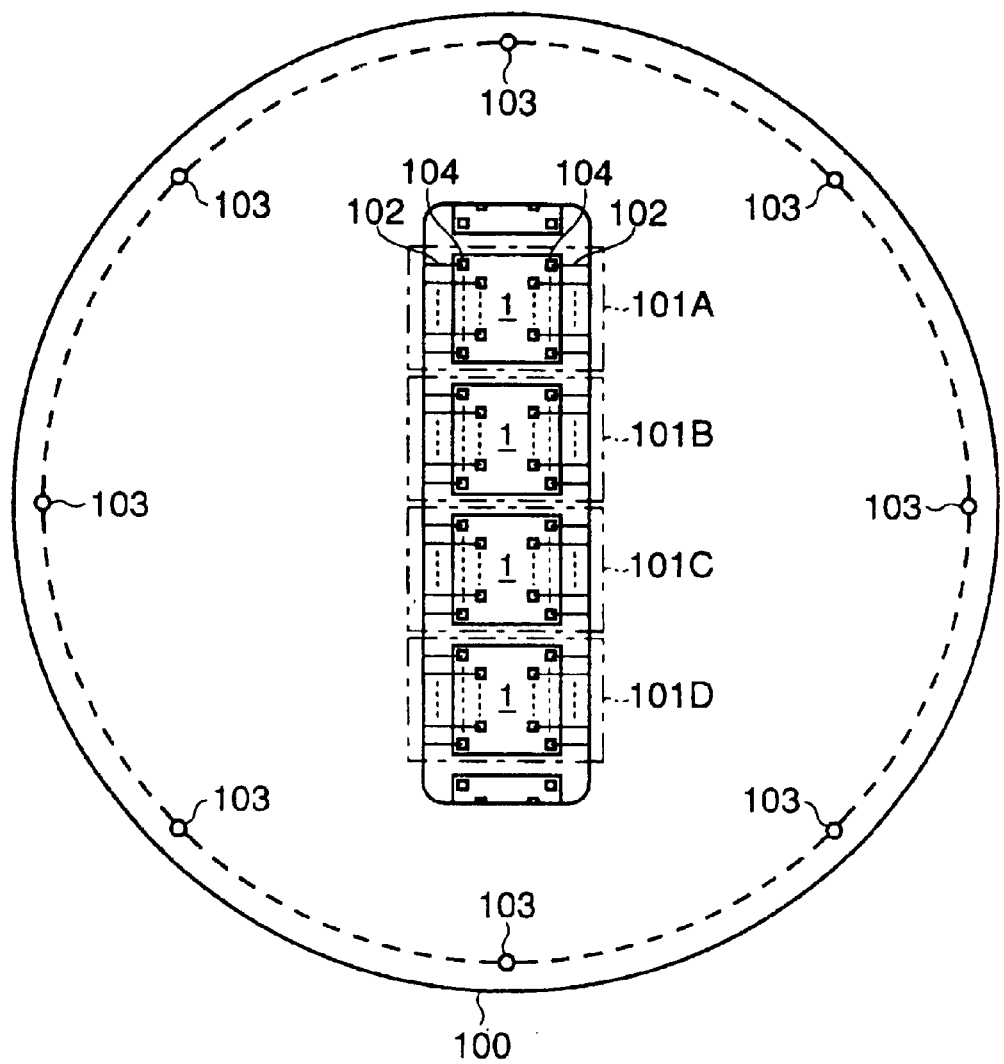
FIG. 4 is a plan view of the semiconductor IC device according to the first embodiment, which is being tested.

FIG. 4 is a plan view of the semiconductor IC device according to the first embodiment, which is being tested.

As is shown in FIG. 4, a probe card 100 has measuring units 101A to 101D associated with four chips 1. Probes 102 extend from each of the measuring units 101A to 101D. Contacts 103 are provided for electric contact with a wafer prober (not shown). The probes 102 are put in electric contact with pads 104 of each chip 1. The wafer prober supplies an operating voltage and a test pattern to the four chips 1 simultaneously via the probes 102. Thereby, the four chips 1 are tested at the same time and the characteristics thereof are measured to determine the pass or fail of each chip 1.

Figure 5:
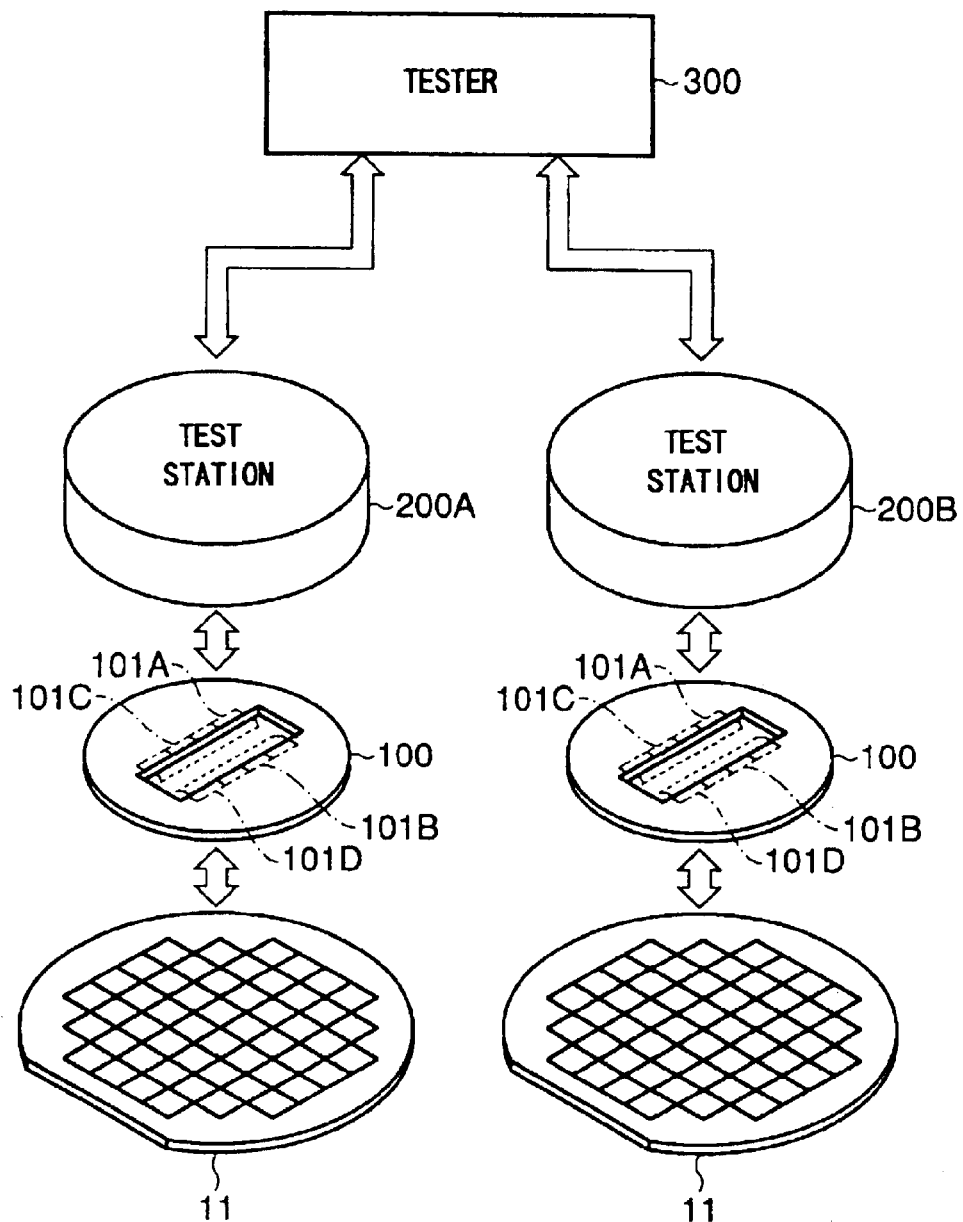
FIG. 5 shows a wafer probing test system.

FIG. 5 shows a wafer probing test system.

In a regular test system, one test station is assigned to one test apparatus (single-station type test system). By contrast, in a system shown in FIG. 5, a plurality of stations, for example, two stations 200A and 200B, are assigned to one test apparatus 300. This system is called a multi-station type test system. As compared to the single-station type system, a test time per chip is shortened. The IC device according to the first embodiment of the invention is tested by using the single-station type test system or the multi-station type test system shown in FIG. 5.

In the device according to the first embodiment, the functional circuits of processor 2, SRAM 3, DRAM 4 and flash-EEPROM 5 are isolated from one another by means of the isolating region 10. Thus, each functional circuit can be tested without influence of the other functional circuits. Accordingly, the characteristics of the functional circuits with different functions, which are provided on the single chip, can be exactly measured.

The isolating region 10 is put in contact with the entire periphery of the chip 1. Thus, even if the chips 1 are simultaneously tested in the state shown in FIG. 4, each functional circuit of one chip 1 can be tested without influence of the functional circuits of the other chips 1. Accordingly, the characteristics of the functional circuits with different functions, which are provided on the single chip, can be exactly measured.

A semiconductor integrated circuit (IC) device according to a second embodiment of the present invention will now be described.

Figure 6:
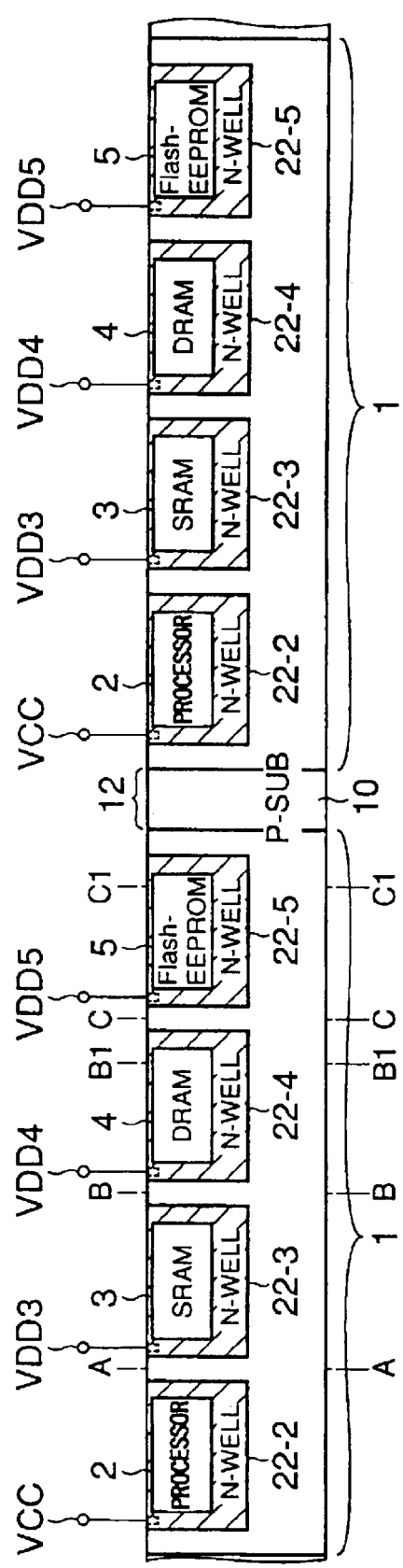
FIG. 6 is a cross-sectional view of a semiconductor IC device according to a second embodiment of the invention.

FIG. 6 is a cross-sectional view of the semiconductor device according to the second embodiment.

The cross-sectional view of FIG. 6 shows the state wherein chips 1 are formed in a silicon wafer.

In the device according to the second embodiment, as shown in FIG. 6, an isolating region 10 is formed of a P-type silicon substrate (P-SUB). The P-type silicon substrate 10 is, for example, a wafer itself. A plurality of large N-wells 22 are provided in the substrate 10. In the device of the second embodiment, large wells 22-2 to 22-5 are provided. A processor 2, an SRAM 3, a DRAM 4 and a flash-EEPROM 5 are formed in the four wells 22-2 to 22-5, respectively. Optimal power potentials for respective functional circuits are supplied to the large wells 22-2 to 22-5. In the semiconductor IC device of the second embodiment, a high potential power VCC is supplied to the well 22-2, a high potential power VDD3 to the well 22-3, a high potential power VDD4 to the well 22-4, and a high potential power VDD5 to the well 22-5. The high potential power VCC, along with a low potential power VSS (not shown), is an external power provided from the outside of the chip 1. The high potential powers VDD3 to VDD5 are internal powers generated by voltage-converting the external power VCC within the chip 1. The voltage conversion includes operations of lowering and raising the level of the external power. The P-type silicon substrate 10 is grounded at the time of use and the time of tests.

The cross-sectional structure of each well will now be described, following which a power supply system of the device of the second embodiment will be described.

Figure 7:
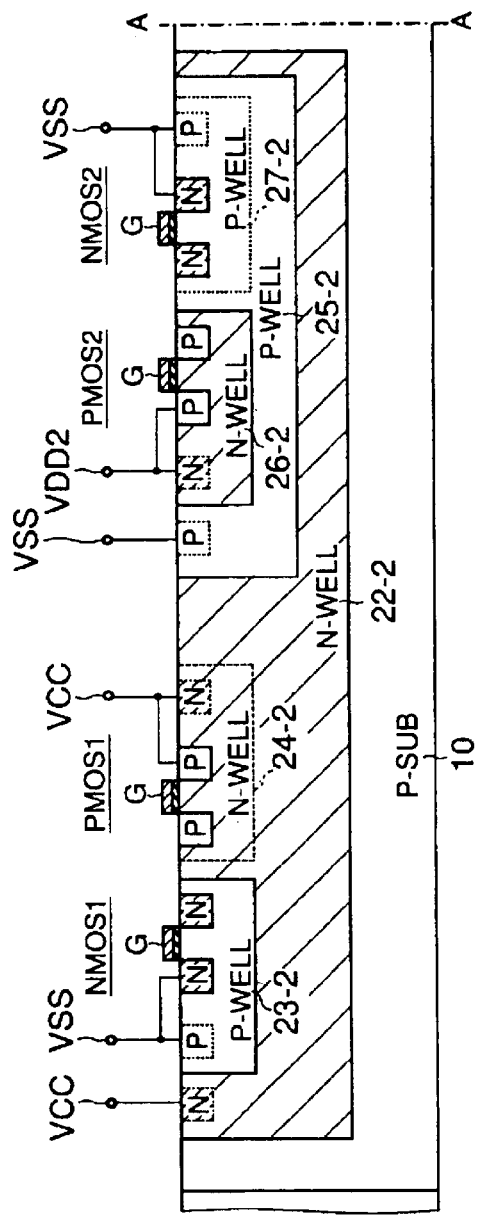
FIG. 7 is a cross-sectional view of a well 22-2 in FIG. 6.

FIG. 7 is a cross-sectional view of the well 22-2 shown in FIG. 6.

As is shown in FIG. 7, a P-well 23-2 and an N-well 24-4 are provided in the large N-well 22-2. A low potential power VSS (ground potential) is supplied to the P-well 23-2. An N-channel MOSFET (hereinafter referred to as "NMOS") 1 is formed in the P-well 23-2. The N-well 24-2, like large N-well 22-2, is supplied with high potential power VCC. A P-channel MOSFET (hereinafter referred to as "PMOS") 1 formed in the N-well 24-2. The N-well 24-2 has an impurity concentration higher than that of the large N-well 22-2. Thereby the PMOS 1 can be reduced in size. The N-well 24-2 may not be provided.

A P-well 25-2 is formed in the large N-well 22-2. The P-type well 25-2 is supplied with low potential power VSS (ground potential). An N-well 26-2 and a P-well 27-2 are formed in the P-well 25-2. The N-well 26-2 is supplied with a high potential power VDD2. The high potential power VDD 2 differs from the power VCC and is an internal power generated by voltage-converting the external power potential within the chip 1. A PMOS 2 is formed in the N-well 26-2. The P-well 27-2 is supplied with low potential power VSS. An NMOS 2 is formed in the P-well 27-2. The P-well 27-2 has an impurity concentration higher than that of the P-well 25-2. The P-well 27-2, like the N-well 24-2, may not be provided.

The processor 2 basically comprises the NMOS 1, NMOS 2, PMOS 1 and PMOS 2. However, the processor 2 may be constituted by the NMOS 2 and PMOS 2 alone which are driven by the internal power VDD2. In this case, the NMOS 1 and PMOS 1 which are driven by the external power VCC may preferably be used, for example, in a voltage generating circuit for generating the internal power VDD2 from the external power VCC. In addition, a plurality of P-wells, which are similar to the P-well 25-2, may be formed in the large N-well 22-2.

In FIG. 7, reference character G denotes a gate of each MOSFET.

Figure 8:
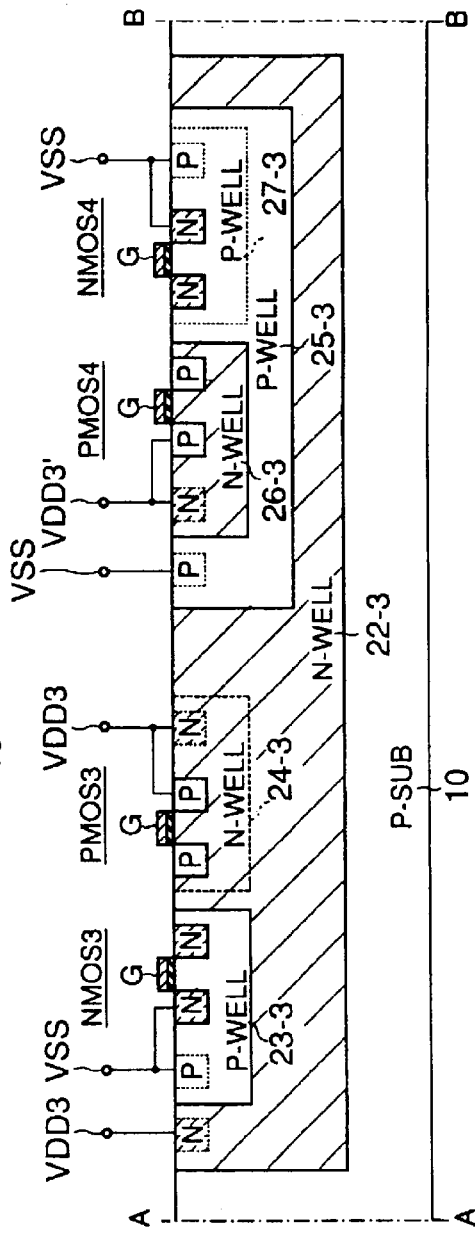
FIG. 8 is a cross-sectional view of a well 22-3 in FIG. 6.

FIG. 8 is a cross-sectional view of the well 22-3 shown in FIG. 6.

As is shown in FIG. 8, a P-well 23-3 and an N-well 24-3 are formed in the large N-well 22-3. The P-well 23-3 is supplied with a low potential power VSS (ground potential). An NMOS 3 is formed in the P-well 23-3. The N-well 24-3, like the large N-well 22-3, is supplied with a high potential internal power VDD 3. A PMOS 3 is formed in the N-well 24-3. The N-well 24-3 has an impurity concentration higher than that of the large N-well 22-3. The N-well 24-3 may not be provided.

A P-well 25-3 is formed in the large N-well 22-3. The P-well 25-3 is supplied with a low potential power VSS (ground potential). An N-well 26-3 and a P-well 27-3 are formed in the P-well 25-3. The N-well 26-3 is supplied with a high potential internal power VDD3'. The internal power VDD3' is generated by voltage-converting the internal power VDD3 within the chip 1. A PMOS 4 is formed in the N-well 26-3. The P-well 27-3 is supplied with a low potential power VSS. An NMOS 4 is formed in the P-well 27-3. The P-well 27-3 has an impurity concentration higher than that of the P-well 25-3. The P-well 27-3, like the N-well 24-3, may not be provided.

The SRAM 3 basically comprises the NMOS 3, NMOS 4, PMOS 3 and PROS 4. However, the SRAM 3 may be constituted by the NMOS 4 and PMOS 4 alone which are driven by the internal power VDD3'. In this case, the NMOS 3 and PMOS 3 which are driven by the internal power VDD3 may preferably be used, for example, in a voltage generating circuit for generating the internal power VDD3' from the internal power VDD3. In addition, a plurality of P-wells, which are similar to the P-well 25-3, may be formed in the large N-well 22-3.

In FIG. 8, reference character G denotes a gate of each MOSFET.

Figures 9A, 9B:
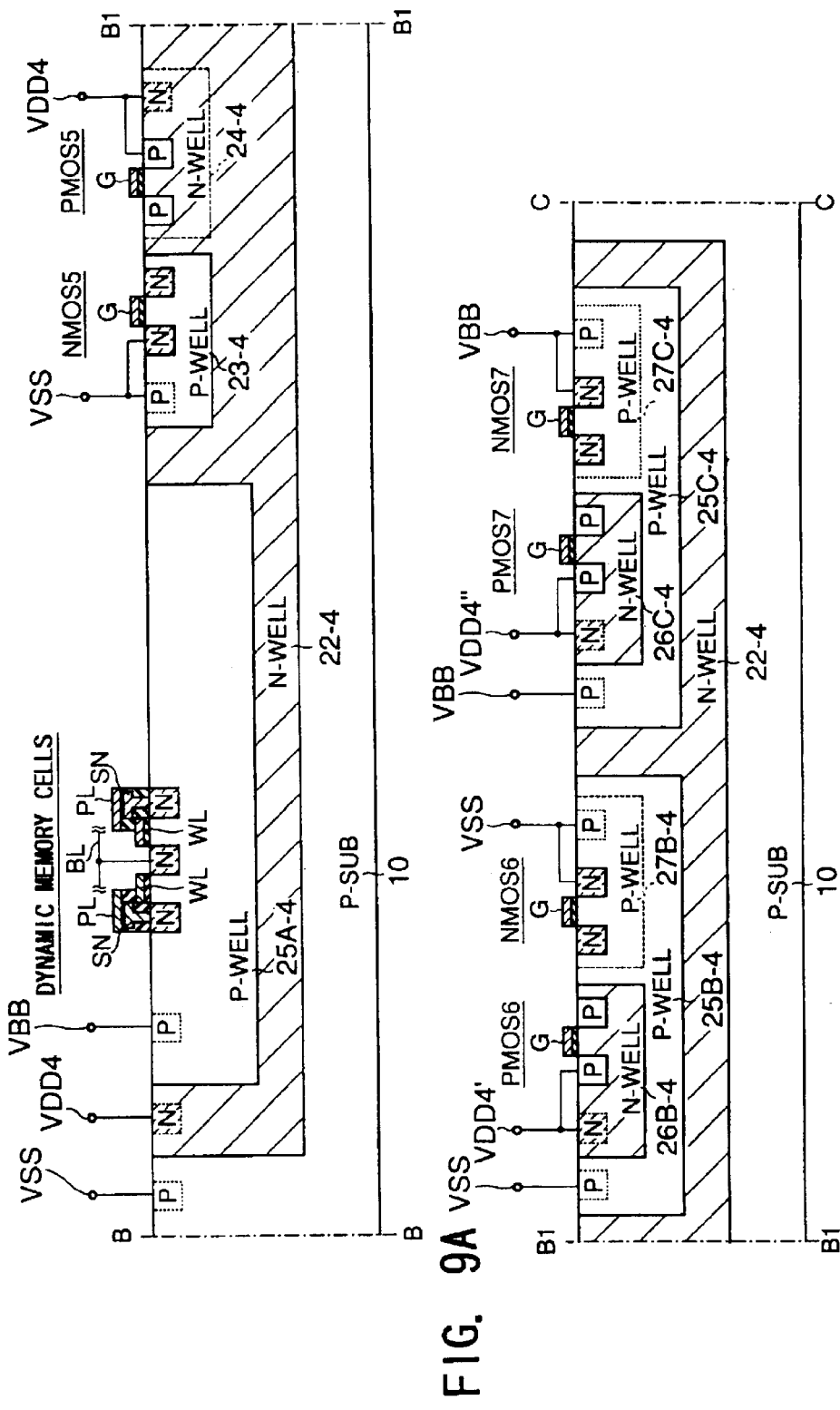
FIG. 9A is a cross-sectional view of a well 22-4 in FIG. 6.
FIG. 9B is a cross-sectional view of the well 22-4 in FIG. 6.

FIGS. 9A and 9B are cross-sectional views of the well 22-4 shown in FIG. 6.

As is shown in FIGS. 9A and 9B, a P-well 23-4 and an N-well 24-4 are formed in the large N-well 22-4. The P-well 23-4 is supplied with a low potential power VSS (ground potential). An NMOS 5 is formed in the P-well 23-4. The N-well 24-4, like the large N-well 22-4, is supplied with high potential internal power VDD 4. A PMOS 5 is formed in the N-well 24-4. The N-well 24-4 has an impurity concentration higher than that of the large N-well 22-4. The N-well 24-4 may not be provided.

In addition, three P-wells 25A-4, 25B-4 and 25C-4 are formed in the large N-well 22-4.

The first P-well 25A-4 is supplied with a negative potential power VBB (about −2 to −3 v). The negative potential power VBB is generated by voltage-converting the internal power VDD 4 within the chip 1. A dynamic memory cell transistor is formed in the P-well 25A-4.

The second P-well 25B-4 is supplied with a low potential power VSS (ground potential). An N-well 26B-4 and a P-well 27B-4 are formed in the P-well 25B-4. A high potential internal power VDD4' is supplied to the N-well 26B-4. The internal power VDD4' is generated by voltage-converting the internal power VDD4 within the chip 1. A PMOS 6 is formed in the N-well 26B-4. The P-well 27B-4 is supplied with a low potential power VSS. An NMOS 6 is formed in the P-well 27B-4. The P-well 27B-4 has an impurity concentration higher than that of the P-well 25B-4. The P-well 27B-4, like the N-well 24-4, may not be provided.

The third P-well 25C-4 is supplied with a negative potential power VBB (about −2 to −3 v). An N-well 26C-4 and a P-well 27C-4 are formed in the P-well 25C-4. A high potential internal power VDD4" is supplied to the N-well 26C-4. The internal power VDD4" is generated by voltage-converting the internal power VDD4 within the chip 1. A PMOS 7 is formed in the N-well 26C-4. The P-well 27C-4 is supplied with a negative potential power VBB. An NMOS 7 is formed in the P-well 27C-4. The P-well 27C-4 has an impurity concentration higher than that of the P-well 25C-4. The P-well 27C-4, like the N-well 24-4, may not be provided.

A memory cell array of the DRAM 4 comprises dynamic memory cell transistors, and peripheral circuits of the DRAM 4 are constituted by NMOS 5, NMOS 6, PMOS 5 and PMOS 6. The peripheral circuits of the DRAM 4 may be constituted by the NMOS 6 and PMOS 6 alone, which are driven by the internal power VDD4'. In this case, the NMOS 5 and PMOS 5, which are driven by the internal power VDD4, may preferably be used, for example, in a voltage generating circuit for generating the internal powers VDD4', VDD4" and VBB from the internal power VDD4.

The peripheral circuits of the DRAM 4 include a circuit using a boost potential VPP, for example, a word line driver. In order to constitute such a circuit, an N-well to be supplied with boost potential VPP may be formed in the P-well 25B-4. The NMOS 7 and PMOS 7, which are formed in the p-well 25C-4 supplied with the negative potential power VBB, may preferably be used, for example, in an input/output circuit for exchanging signals with the outside of the chip 1, or an internal interface circuit for exchanging signals with another functional circuit which is formed in the chip 1 and driven by a different power supply, such as processor 2 formed in another well. It is possible that a surge may be input to the input/output circuit or internal interface circuit. In order to clamp such a surge, a negative potential VBB is supplied to the P-well 25C-4. The P-well supplied with such a negative potential may be provided not only in the N-well 22-4 but also in the N-wells 22-2, 22-3 and 22-5, respectively. It is preferable that the input/output circuit for exchanging signals with the outside of chip 1 or the internal interface circuit for exchanging signals with some other functional circuit be formed in the P-well supplied with the negative potential.

In FIGS. 9A and 9B, reference character G denotes a gate of the MOSFET, reference character BL a bit line, reference character WL a word line, character PL a plate electrode of a memory capacitor, and character SN a storage electrode of the memory capacitor.

Figures 10A, 10B:
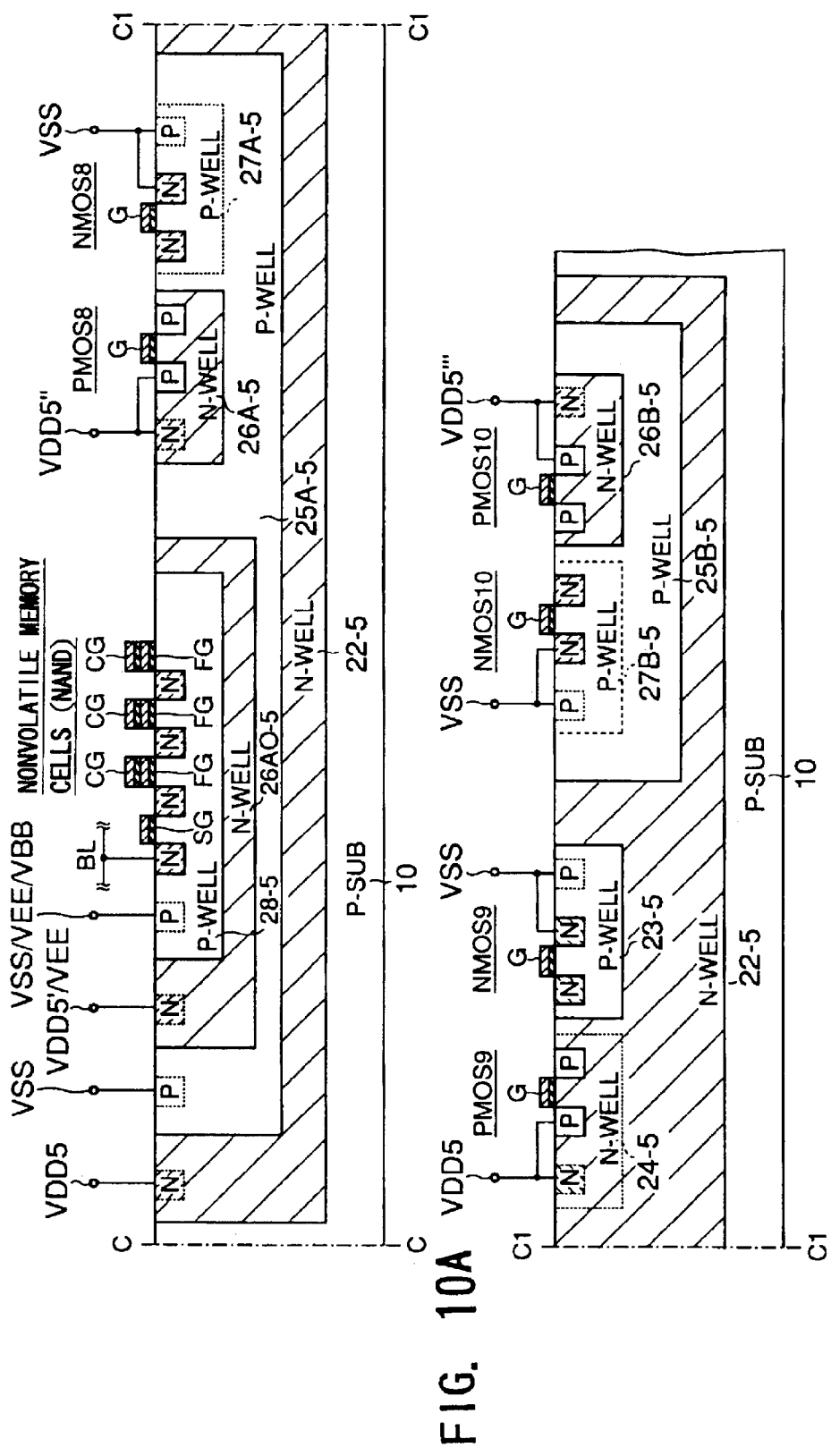
FIG. 10A is a cross-sectional view of a well 22-5 in FIG. 6.
FIG. 10B is a cross-sectional view of the well 22-5 in FIG. 6.

FIGS. 10A and 10B are cross-sectional views of the well 22-5 shown in FIG. 6.

As is shown in FIGS. 10A and 10B, a P-well 23-5 and an N-well 24-5 are formed in the large N-well 22-5. The P-well 23-5 is supplied with a low potential power VSS (ground voltage). An NMOS 9 is formed in the P-well 23-5. The N-well 24-5, like the large N-well 22-5, is supplied with a high potential internal power VDD5. A PMOS 9 is formed in the N-well 24-5. The N-well 24-5 has an impurity concentration higher than that of the large N-well 22-5. The N-well 24-5 may not be provided.

Two P-wells 25A-5 and 25B-5 are formed in the large N-well 22-5.

The first P-well 25A-5 is supplied with a low potential power VSS (ground potential). An N-well 26A-5 and a P-well 27A-5 are formed in the P-well 25A-5. The N-well 26A-5 is supplied with a high potential internal power VDD5". The internal power VDD5" is generated by voltage-converting the internal power VDD5 within the chip 1. A PMOS 8 is formed in the N-well 26A-5. The P-well 27A-5 is supplied with a low potential power VSS. An NMOS 8 is formed in the P-well 27A-5. The P-well 27A-5 has an impurity concentration higher than that of the P-well 25A-5. The P-well 27A-5, like the N-well 24-5, may not be provided.

In addition, an N-well 26A0-5 is formed in the first P-well 25A-5. The N-well 26A0-5 is selectively supplied with a high potential internal power VDD5' and a boost potential VEE. The internal power VDD5' and boost potential VEE are generated by voltage-converting the internal power VDD5 within the chip 1. A P-well 28-5 is formed in the N-well 26A0-5. The P-well 28-5 is selectively supplied with a low potential power VSS, a boost potential VEE and a drop potential VBB. The drop potential VBB is generated by voltage-converting the internal power VDD5 within the chip 1. NAND type memory cell transistors are formed in the P-well 28-5. When data in the NAND type memory cell transistors is to be erased, the control gates CG are grounded and both the N-well 26A0-5 and P-well 28-5 are supplied with boost potential VEE. Thereby, electrons are drawn out from a floating gate FG into the P-well 28-5, and the data is erased. On the other hand, when data is to be written in the NAND type memory cell transistors, a program voltage is applied to control gates CG, potential VDD5' is supplied to the N-well 26A0-5, and drop voltage VBB is supplied to the P-well 28-5. Thereby, electrons are injected in floating gates FG from a channel under the floating gates FG. When data stored in the NAND type memory cell transistors is to be read out, a readout voltage is applied to the control gates CG, potential VDD5' is supplied to theN-well 26A0-5, and a low potential VSS is supplied to the P-well 28-5. Thereby, "0/1" data represented by the conduction/non-conduction of a channel current is determined on the basis of the charged state of the floating gate FG, and the data is read out to the bit line BL.

The second P-well 25B-5 is supplied with low potential power VSS (ground potential). An N-well 26B-5 and a P-well 27B-5 are formed in the P-well 25B-5. The N-well 26B-5 is supplied with a high potential internal power VDD 5'". The internal power VDD5'" is generated by voltage-converting the internal power VDD5 within the chip 1. A PMOS 10 is formed in the N-well 26B-5. The P-well 27B-5 is supplied with low potential power VSS. An NMOS 10 is formed in the P-well 27B-5. The P-well 27B-5 has an impurity concentration higher than that of the P-well 25B-5. The P-well 27B-5, like the N-well 24-5, may not be provided.

A memory cell array of the flash-EEPROM 5 comprises NAND type memory cell transistors, and peripheral circuits of the flash-EEPROM5 are constituted by NMOS 8, NMOS 9, NMOS 10, PMOS 8, PMOS 9 and PMOS 10. The peripheral circuits of the flash-EEPROM 5 may be constituted by the NMOS 8, NMOS 10, PMOS 8, and PMOS 10 alone, which are driven by the internal powers VDD" and VDD'". In this case, the NMOS 9 and PMOS 9, which are driven by the internal power VDD5, may preferably be used, for example, in a voltage generating circuit for generating the internal powers VDD5', VDD5", VDD'", VBB and VEE from the internal power VDD5.

In FIGS. 10A and 10B, reference character G denotes a gate of each MOSFET.

Figure 11:
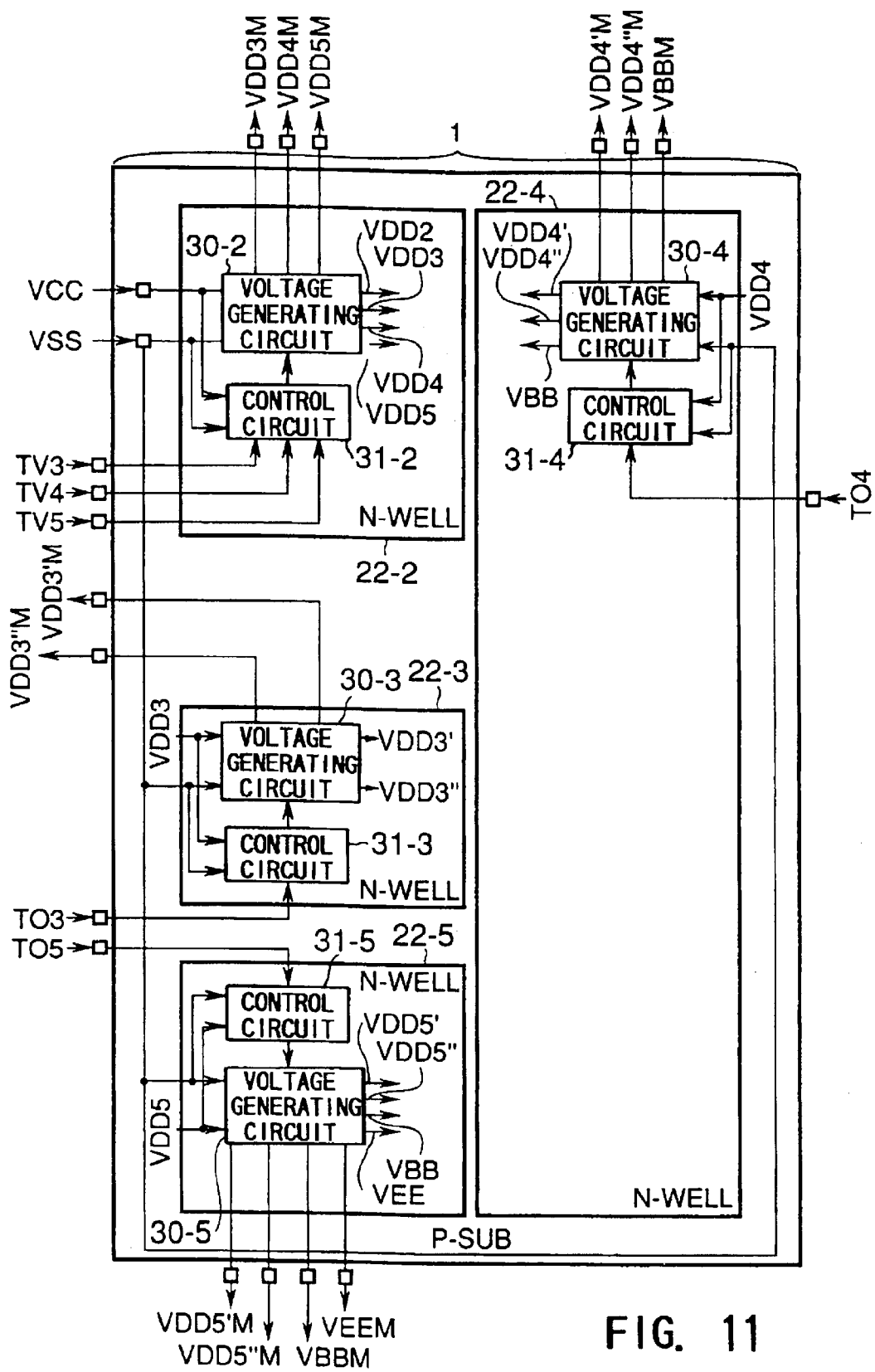
FIG. 11 is a block diagram of a power supply system provided in the device according to the second embodiment of the invention.

FIG. 11 is a block diagram of a power supply system provided in the device according to the second embodiment of the invention.

As is shown in FIG. 11, the large N-well 22-2 is provided with a voltage generating circuit 30-2 which is driven by the external powers VCC and VSS to generate the internal powers VDD2, VDD3, VDD4 and VDD5 from the external power VCC. The internal power VDD2 is a high potential power used in a part, or in the entire structure, of the processor 2. The internal power VDD3 is a high potential power to be supplied to the large N-well 22-3, the internal power VDD4 is a high potential power to be supplied to the large N-well 22-4, and the internal power VDD5 is a high potential power to be supplied to the large N-well 22-5. The large N-well 22-2 is provided with a control circuit 31-2, driven by external powers VCC and VSS, for controlling generation of internal powers VDD3, VDD4 and VDD5 by means of control signals TV3, TV4 and TV5. In addition, the voltage generating circuit 30-2 is connected to internal power monitor terminals VDD3M to VDD5M. The level of a voltage actually generated by the voltage generating circuit 30-2 can be monitored via the monitor terminals.

The large N-well 22-3 is provided with a voltage generating circuit 30-3 driven by an internal power VDD3 and an external power VSS to generate internal powers VDD3' and VDD3" from the internal power VDD3. The internal powers VDD3' and VDD3" are high potential powers, respectively, for use in a part or the entire body of the SRAM 3 (in FIG. 8, the internal power VDD3" shown in FIG. 11 is omitted). In addition, the large N-well 22-3 is provided with a control circuit 31-3, driven by the internal power VDD3 and external power VSS, for controlling generation of the internal powers VDD3' and VDD3" by means of a control signal TO3. The voltage generating circuit 30-3 is connected to internal power monitor terminals VDD3'M and VDD3"M. The level of a voltage actually generated by the voltage generating circuit 30-3 can be monitored via the monitor terminals.

The large N-well 22-4 is provided with a voltage generating circuit 30-4, driven by an internal power VDD4 and an external power VSS, for generating internal powers VDD4', VDD4" and VBB from the internal power VDD4. The internal powers VDD4' and VDD4" are high potential powers, respectively, for use in a part or the entire body of the DRAM 4. The internal power VBB is a negative potential power for use in the DRAM 4. In addition, the large N-well 22-4 is provided with a control circuit 31-4 driven by an internal power VDD4 and an external power VSS to control generation of the internal powers VDD4', VDD4" and VBB by means of a control signal TO4. The voltage generating circuit 30-4 is connected to internal power monitor terminals VDD4'M and VDD4'M. The level of a voltage actually generated by the voltage generating circuit 30-4 can be monitored via the monitor terminals.

The large N-well 22-5 is provided with a voltage generating circuit 30-5 driven by an internal power VDD5 and an external power VSS to generate internal powers VDD5', VDD5", VBB and VEE from the internal power VDD5. The internal powers VDD5' and VDD5" are high potential powers, respectively, for use in a part or the entire body of the flash-EEPROM 5 (in FIG. 11, the internal power VDD5'" shown in FIG. 11 is omitted). The internal power VBB is a negative potential power for use in the flash-EEPROM 5, and the internal power VEE is a boost potential power for use in the flash-EEPROM 5. The large N-well 22-5 is also provided with a control circuit 31-5 driven by an internal power VDD5 and an external power VSS to control generation of the internal powers VDD5', VDD5", VBB and VEE by means of a control signal TO5. The voltage generating circuit 30-5 is connected to internal power monitor terminals VDD5'M, VDD5"M, VBBM and VEEM. The level of a voltage actually generated by the voltage generating circuit 30-5 can be monitored via the monitor terminals.

It should suffice if the control signal input terminals and monitor terminals are provided, at least, at the time of tests. Thus, the control signal input terminals and monitor terminals may be provided, for example, on a dicing line, and not on the chip 1.

Figure 12A:
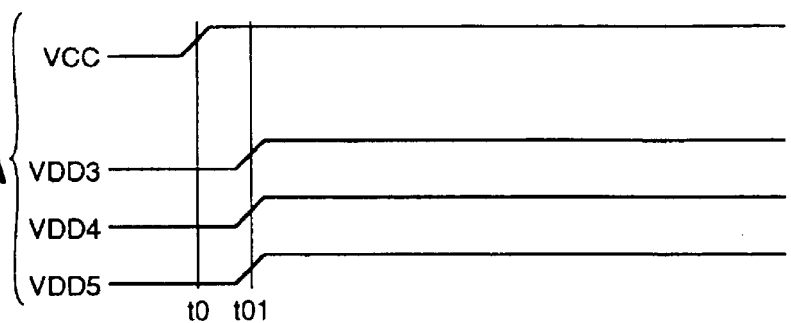
FIG. 12A is a timing chart illustrating the generation timing of external and internal powers at the time of use.
Figure 12B:
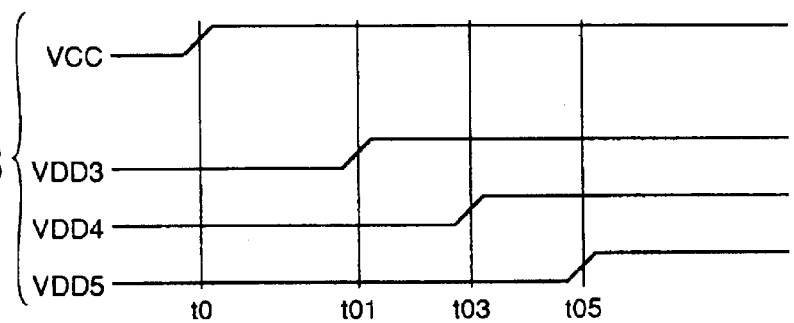
FIG. 12B is a timing chart illustrating the generation timing of external and internal powers at the time of tests.
Figure 12C:
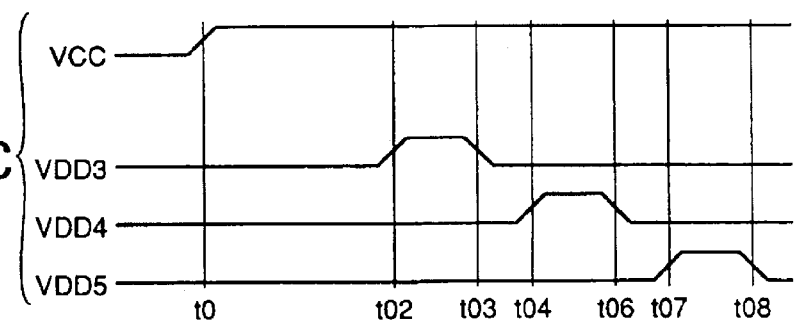
FIG. 12C is a timing chart illustrating the generation timing of external and internal powers at the time of tests.

FIGS. 12A to 12C are timing charts illustrating the generation timing of the external and internal powers. FIG. 12A shows a generation timing at the time of use, and FIGS. 12B and 12C show generation timings at the time of tests.

In the power supply system shown in FIG. 11, at the time of actual use, external power VCC is received at time t0, as is shown in FIG. 12A, and then internal powers VDD3 to VDD5, which are to be supplied to the wells 22-3 to 22-5, are simultaneously generated at time t1. Thereby, all the wells 22-2 to 22-5 are supplied with potentials and all the functions possessed by the chip 1 can be performed.

By contrast, as shown in FIGS. 12B and 12C, at the time of tests, external power VCC is received at time t0 and then internal powers VDD3 to VDD5, which are to be supplied to the wells 22-3 and 22-5, are generated at given times (t01 to t08) by the input of control signals TV3 to TV5. Thereby, the wells 22-3 to 22-5 are supplied with desired potentials, and only a selected one of functional circuits included in the chip 1 can be operated. For example, the internal power VDD4 is generated, while the generation of internal powers VDD3 and VDD5 is stopped. As a result, the DRAM 4 is supplied with power and rendered operable, whereas the SRAM 3 and flash-EEPROM 5 are not supplied with power and thus not rendered operable.

The control signals TO3 to TO5, like control signals TV3 to TV5, control the generation timing of the internal powers. According to this technique, only a selected one of circuit blocks constituting the functional circuits can be operated. For example, only the internal power VDD3' is generated, while the generation of the internal power VDD3' is stopped. Thereby, only the circuit block in the SRAM 3, which uses the internal power VDD3', is supplied with power and rendered operable. On the other hand, the circuit block which uses the internal power VDD3" is not supplied with power and thus not rendered operable.

In the device according to the second embodiment, such functional circuits as processor 2, SRAM 3, DRAM 4 and flash-EEPROM 5 are formed in the N-wells 22-2 to 22-5, and the functional circuits are insulated from one another by means of PN junctions between the N-wells 22-2 to 22-5 and the P-type silicon substrate 10. Thus, each functional circuit can be tested without influence of the other functional circuits. Thereby, the characteristics of the functional circuits with different functions, which are mounted on single chip 1, can be exactly measured.

Since the P-type silicon substrate 10 is a wafer itself, the functional circuits are isolated among the chips, too. Accordingly, a plurality of chips 1 can be tested at a time such that each functional circuit included in chip 1 is not influenced by functional circuits included in other chips. Thereby, the characteristics of the functional circuits with different functions, which are mounted on each of chips 1, can be exactly measured at a time with respect to all the chips 1.

Since the wells 22-2 to 22-5 are supplied with different potentials, it is possible to supply the functional circuits with such potentials as to bring out the characteristics of each functional circuit as much as possible.

In the power system possessed by the device of the second embodiment, the generation of internal power can be voluntarily stopped during tests. Specifically, only a selected one of the functional circuits can be operated, or only a selected one of circuit blocks constituting the functional circuits can be operated. In particular, in a testing step, only a functional circuit to be tested can be operated while the other functional circuits are not operated. If the test is carried out in this way, the characteristics can be exactly measured since the functional circuit to be tested is not influenced by the other functional circuits. For example, as regards a circuit with a large memory capacity such as a DRAM 4 or a flash-EEPROM 5, a testing step for identifying a defective row or a defective column needs to be performed. In this case, if the power of the other functional circuits is turned off, the defective row or column can be identified with higher precision.

When the operation of the processor 2 which is accessing the DRAM 4 is tested, power is supplied to the processor 2 or DRAM 4 alone, while no power is supplied to the other functional circuits, i.e. SRAM 3 and flash-EEPROM 5. In this case, the processor 2 and DRAM 4 are not influenced by the other functional circuits and thus the precision in tests can be improved. Similarly, when the operation of the processor 2 which is accessing the SRAM 3 is tested or when the operation of the processor 2 which is accessing the flash-EEPROM 5 is tested, no power is supplied to the other functional circuits. Thus, the precision in tests can be enhanced.

Suppose that while a number of chips 1 are measured simultaneously, there is a defective chip 1 and a large current flows to the substrate 10. In this case, the other chips 1 may be influenced, and exact measurement may not be carried out. To solve this problem, the above-described power system is used and the power to the functional circuits included in the defective chip 1 is turned off. Thereby, the defective chip 1 is prevented from adversely affecting the other chips 1.

A semiconductor integrated circuit (IC) device according to a third embodiment of the invention will now be described.

Figure 13:
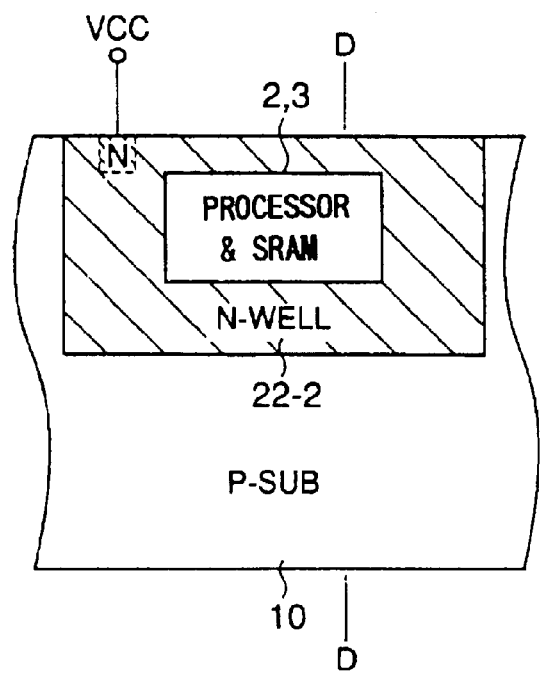
FIG. 13 is a cross-sectional view of a semiconductor IC device according to a third embodiment of the invention.

FIG. 13 is a cross-sectional view of the semiconductor IC device according to the third embodiment.

In the device according to the third embodiment, as is shown in FIG. 13, a processor 2 and an SRAM 3 are formed in a large well 22-2. The well 22-2 is supplied with a high potential power VCC.

Figures 14A, 14B:
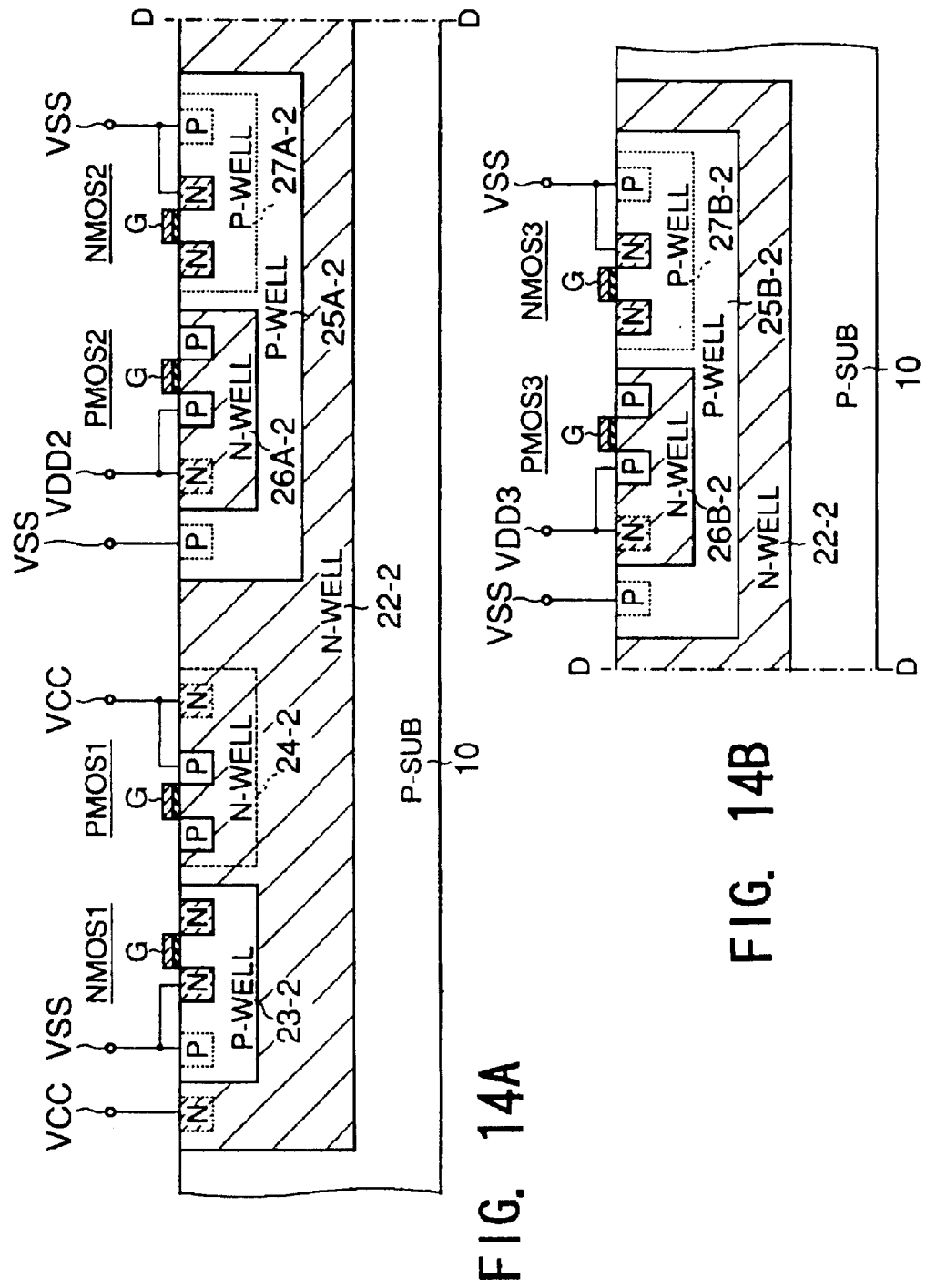
FIG. 14A is a cross-sectional view of a well 22-2 in FIG. 13.
FIG. 14B is a cross-sectional view of the well 22-2 in FIG. 13.

FIGS. 14A and 14B are cross-sectional views of the well 22-2 shown in FIG. 13.

As is shown in FIGS. 14A and 14B, a P-well 23-2 and an N-well 24-2 are formed in the large N-well 22-2. The P-well 23-2 is supplied with low potential power VSS (ground potential). An N-channel MOSFET (hereinafter referred to as "NMOS") 1 is formed in the P-well 23-2. The N-well 24-2, like the large N-well 22-2, is supplied with high potential power VCC. A P-channel MOSFET (hereinafter referred to as "PMOS") 1 is formed in the N-well 24-2. The N-well 24-2 has an impurity concentration higher than that of the large N-well 22-2. The N-well 24-2 may not be formed.

A first P-well 25A-2 and a second P-well 25B-2 are formed in the large N-well 22-2. The P-wells 25A-2 and 25B-2 are supplied with low potential power VSS (ground potential).

An N-well 26A-2 and a P-well 27A-2 are formed in the first P-well 25A-2. The N-well 26A-2 is supplied with high potential power VDD2. The power VDD2 differs from the power VCC and is an internal power generated by voltage-converting an external power potential within the chip 1. A PMOS 2 is formed in the N-well 26A-2. The P-well 27A-2 is supplied with low potential power VSS. An NMOS 2 is formed in the P-well 27A-2. The P-well 27A-2 has an impurity concentration higher than that of the P-well 25A-2. The P-well 27A-2, like the N-well 24-2, may not be provided.

An N-well 26B-2 and a P-well 27B-2 are formed in the second P-well 25B-2. The N-well 26B-2 is supplied with high potential power VDD3. The power VDD3 differs from power VCC and is an internal power generated by voltage-converting the external potential power within the chip 1. A PMOS 3 is formed in the N-well 26B-2. The P-well 27B-2 is supplied with low potential power VSS. An NMOS 3 is formed in the P-well 27B-2. The P-well 27B. The P-well 27B-2 has an impurity concentration higher than that of the P-well 25B-2. The by P-well 27B-2, like the N-well 24-2, may not be provided.

The processor 2 basically comprises the NMOS 1, NMOS 2, PMOS 1 and PMOS 2. The processor 2, however, may be constituted by the NMOS 2 and PMOS 2 alone which are driven by the internal power VDD2. In this case, the NMOS 1 and PMOS 1, which are driven by the external power VCC, should preferably be used, for example, in a voltage generating circuit for generating internal power VDD2 from external power VCC.

The SRAM 3 basically comprises the NMOS 1, NMOS 3, PMOS 1 and PMOS 3. The SRAM 3, however, may be constituted by the NMOS 3 and PMOS 3 alone which are driven by the internal power VDD3.

The processor 2 and SRAM 3 may be formed in one N-well 22-2 in this manner.

In FIGS. 14A and 14B, reference character G denotes the gate of each MOSFET.

A semiconductor integrated circuit (IC) device according to a fourth embodiment of the invention will now be described.

Figure 15:
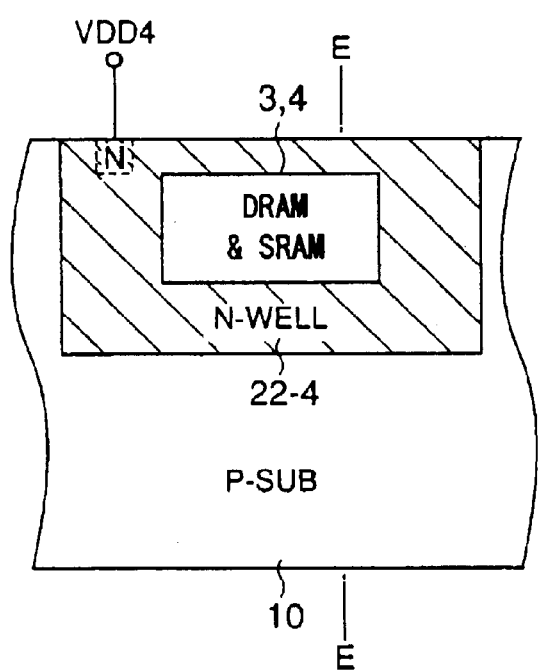
FIG. 15 is a cross-sectional view of a semiconductor IC device according to a fourth embodiment of the invention.

FIG. 15 is a cross-sectional view of the semiconductor IC device according to the fourth embodiment.

In the device according to the fourth embodiment, as is shown in FIG. 15, an SRAM 3 and a DRAM 4 are formed in a large well 22-4. The well 22-4 is supplied with an internal power VDD4.

Figures 16A, 16B:
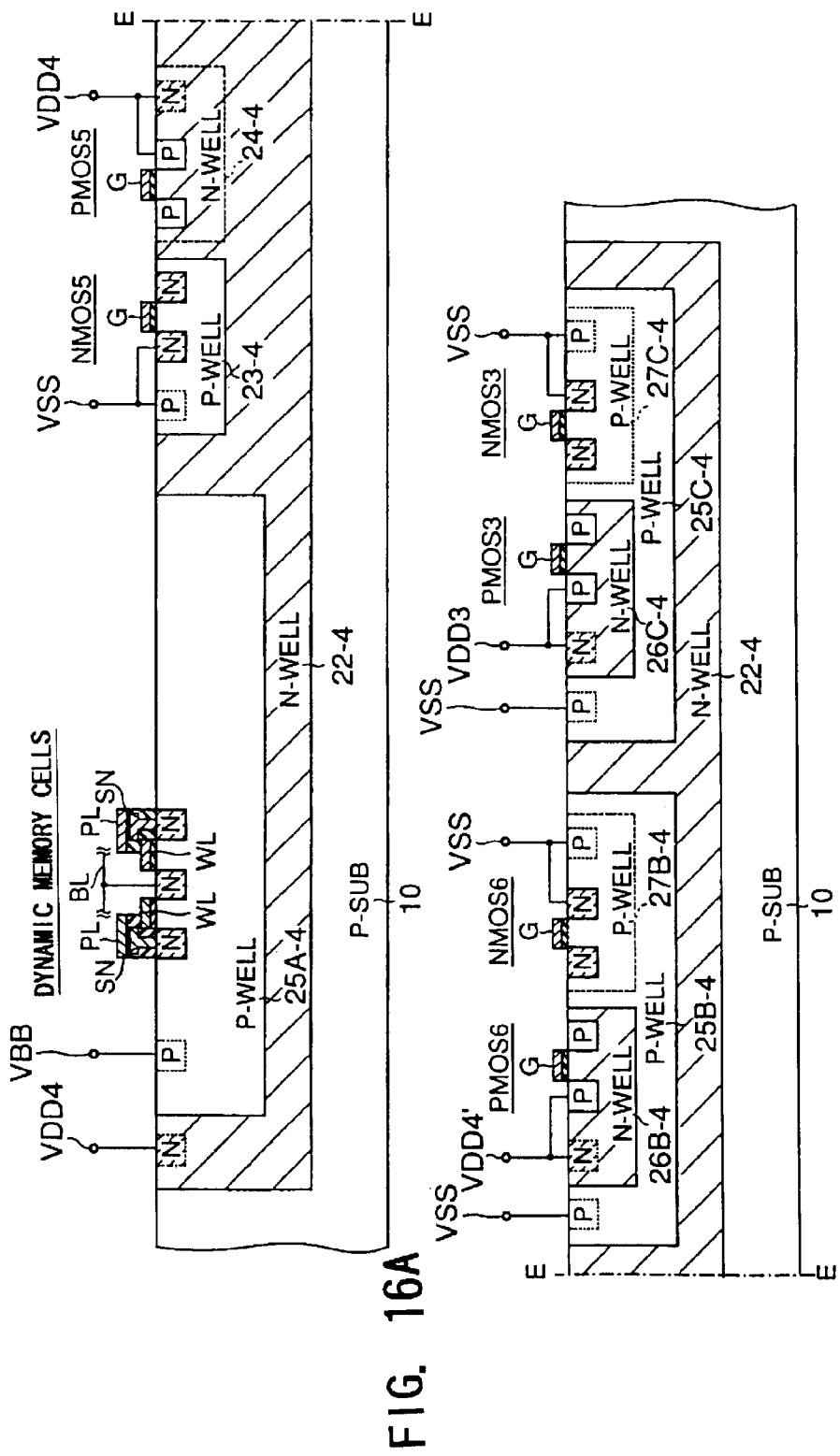
FIG. 16A is a cross-sectional view of a well 22-4 in FIG. 15.
FIG. 16B is a cross-sectional view of the well 22-4 in FIG. 15.

FIGS. 16A and 16B are cross-sectional views of the well 22-4 shown in FIG. 15.

As is shown in FIGS. 16A and 16B, a P-well 23-4 and an N-well 24-4 are formed in the large N-well 22-4. The P-well 23-4 is supplied with low potential power VSS (ground potential). An NMOSFET 5 is formed in the P-well 23-4. The N-well 24-4, like the large N-well 22-4, is supplied with high potential internal power VDD4. A PMOSFET 5 is formed in the N-well 24-4. The N-well 24-4 has an impurity concentration higher than that of the large N-well 22-4. The N-well 24-4 may not be formed.

A first P-well 25A-4, a second P-well 25B-4 and a third P-well 25C-4 are formed in the large N-well 22-4.

The first P-well 25A-4 is supplied with negative potential power VBB (about −2 to −3 V). The negative potential power VBB is generated by voltage-converting the internal power VDD4 within the chip 1. A dynamic memory cell transistor is formed in the P-well 25A-4.

The second P-well 25B4 is supplied with low potential power VSS (ground potential). An N-well 26B-4 and a P-well 27B-4 are formed in the P-well 25B-4. The N-well 26B-4 is supplied with high potential internal power VDD4'. The internal power VDD4' is generated by voltage-converting the internal power VDD4 within the chip 1. A PMOS 6 is formed in the N-well 26B-4. The P-well 27B-4 is supplied with low potential power VSS. An NMOS 6 is formed in the P-well 27B-4. The P-well 27B-4 has an impurity concentration higher than that of the P-well 25B-4. The P-well 27B-4, like the N-well 24-4, may not be provided.

The third P-well 25C-4 is supplied with low potential power VSS (ground potential). An N-well 26C-4 and a P-well 27C-4 are formed in the P-well 25C-4. The N-well 26C-4 is supplied with high potential internal power VDD3. The internal power VDD3 is generated by voltage-converting internal power VDD4 within the chip 1. A PMOS 3 is formed in the N-well 26C-4. The P-well 27C-4 is supplied with low potential power VSS. An NMOS 3 is formed in the P-well 27C-4. The P-well 27C-4 has an impurity concentration higher than that of the P-well 25C-4. The P-well 27C-4, like the N-well 24-4, may not be provided.

A memory cell array of the DRAM 4 comprises dynamic memory cell transistors, and peripheral circuits of the DRAM 4 are constituted by NMOS 5, NMOS 6, PMOS 5 and PMOS 6. The peripheral circuits of the DRAM 4 may be constituted by the NMOS 6 and PMOS 6 alone, which are driven by the internal power VDD4'. In this case, the NMOS 5 and PMOS 5, which are driven by the internal power VDD4, may preferably be used, for example, in a voltage generating circuit for generating the internal powers VDD4 and VDD3 from the internal power VDD4.

The SRAM 3 basically comprises the NMOS 3, NMOS 5, PMOS 3 and PMOS 5. The SRAM 3, however, may be constituted by the NMOS 3 and PMOS 3 alone which are driven by the internal power VDD3.

The processor 2 and SRAM 3 may be formed in one N-well 22-4 in this manner.

In FIGS. 16A and 16B, reference character G denotes the gate of each MOSFET, character BL a bit line, character WL a word line, character PL a plate electrode of a memory capacitor, and character SN a storage electrode of the memory capacitor.

A semiconductor integrated circuit (IC) device according to a fifth embodiment of the invention will now be described.

Figure 17:
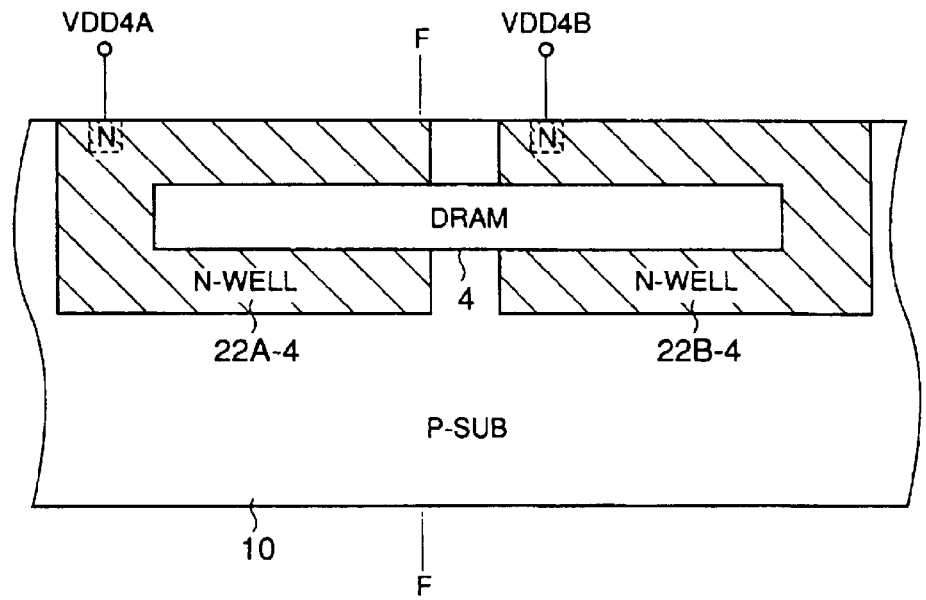
FIG. 17 is a cross-sectional view of a semiconductor IC device according to a fifth embodiment of the invention.

FIG. 17 is a cross-sectional view of the semiconductor IC device according to the fifth embodiment.

In the device according to the fifth embodiment, as is shown in FIG. 17, a DRAM 4 is formed dividedly in two large wells 22A-4 and 22B-4. The well 22A-4 is supplied with internal power VDD4A, and the well 22B-4 is supplied with internal power VDD4B.

Figures 18A, 18B:
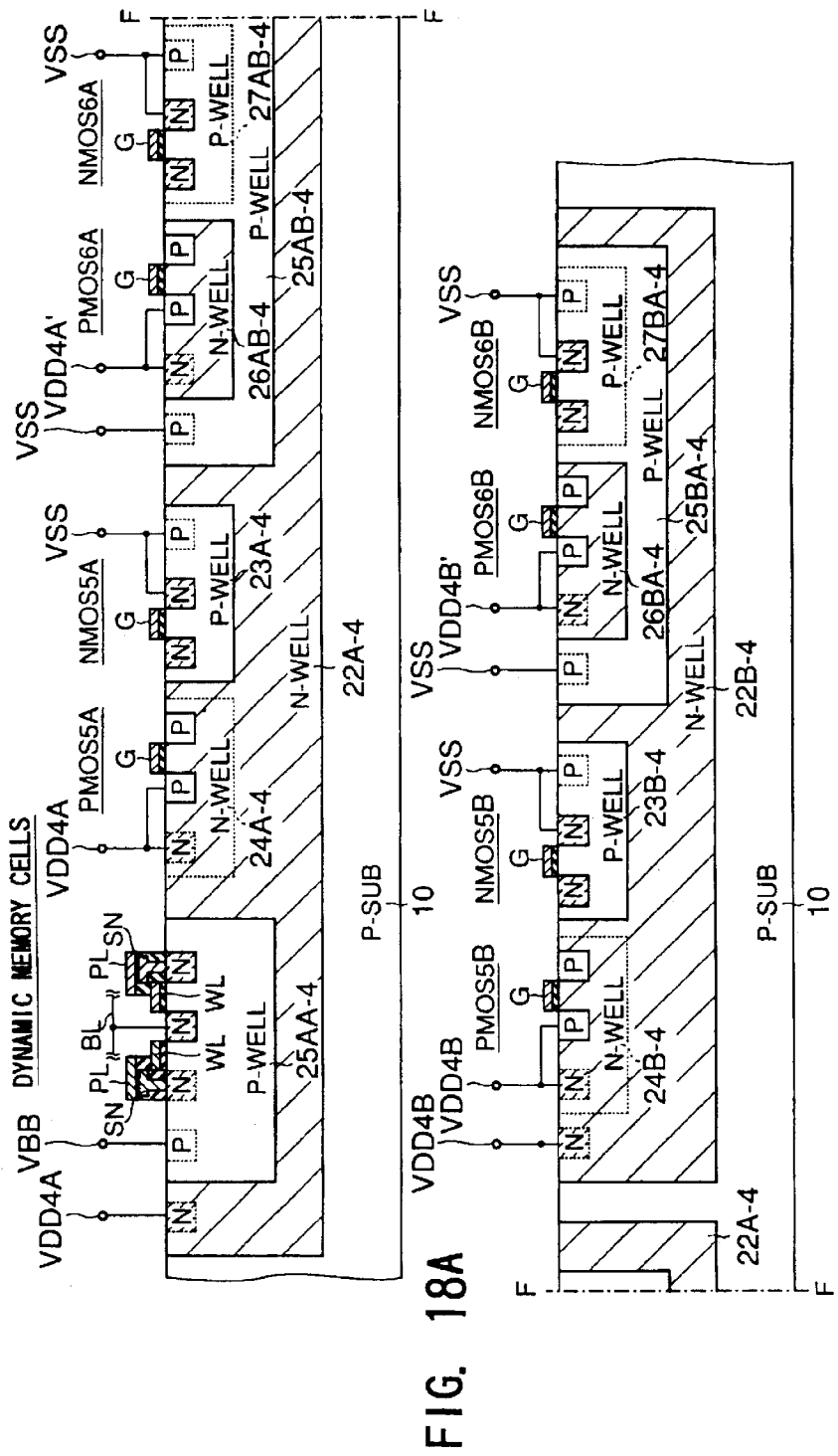
FIG. 18A is a cross-sectional view of wells 22A-4 and 22B-4 in FIG. 17.
FIG. 18B is a cross-sectional view of the wells 22A-4 and 22B-4 in FIG. 17.

FIGS. 18A and 18B are cross-sectional views of the wells 22A-4 and 22B-4 shown in FIG. 17.

As is shown in FIGS. 18A and 18B, a P-well 23A-4 and an N-well 24A-4 are formed in the large N-well 22A-4. The P-well 23A-4 is supplied with low potential power VSS (ground potential). An NMOS 5A is formed in the P-well 23A-4. The N-well 24A-4, like the large N-well 22A-4, is supplied with high potential internal power VDD4A. A PMOS 5A is formed in the N-well 24A-4. The N-well 24A-4 has an impurity concentration higher than that of the large N-well 22A-4. The N-well 24A-4 may not be provided.

In addition, two P-wells 25AA-4 and 25AB-4 are formed in the large N-well 22A-4.

The first P-well 25AA-4 is supplied with negative potential power VBB (about −2 to −3 V). The negative potential power VBB is generated by voltage-converting internal power VDD4A within the chip 1. A dynamic memory cell transistor is formed in the P-well 25AA-4.

The second P-well 25AB-4 is supplied with low potential power VSS (ground potential). An N-well 26AB-4 and a P-well 27AB-4 are formed in the P-well 25AB-4. The N-well 26AB-4 is supplied with high potential internal power VDD4A'. The internal power VDD4A' is generated by voltage-converting internal power VDD4A within the chip 1. A PMOS 6A is formed in, the N-well 26AB-4. The P-well 27AB-4 is supplied with low potential power VSS. An NMOS 6A is formed in the P-well 27AB-4. The P-well 27AB-4 has an impurity concentration higher than that of the P-well 25AB-4. The P-well 27AB-4, like the N-well 24A-4, may not be provided.

A P-well 23B-4 and an N-well 24B-4 are formed in the large N-well 22B-4. The P-well 23B-4 is supplied with low potential power VSS (ground potential). An NMOS 5B is formed in the P-well 23B-4. The N-well 24B-4, like the large N-well 22B-4, is supplied with high potential internal power VDD4B. A PMOS 5B is formed in the N-well 24B-4. The N-well 24B-4 has an impurity concentration higher than that of the large N-well 22B-4. The N-well 24B-4 may not be provided.

A P-well 25BA-4 is formed in the large N-well 22B-4. The P-well 25BA-4 is supplied with low potential power VSS (ground potential). An N-well 26BA-4 and a P-well 27BA-4 are formed in the P-well 25BA-4. The N-well 26BA-4 is supplied with high potential internal power VDD4B'. The internal power VDD4B' is generated by voltage-converting internal power VDD4B within the chip 1. A PMOS 6B is formed in the N-well 26BA-4. The P-well 27BA-4 is supplied with low potential power VSS. An NMOS 6B is formed in the P-well 27BA-4. The P-well 27BA-4 has an impurity concentration higher than that of the P-well 25BA-4. The P-well 27BA-4, like the N-well 24B-4, may not be provided.

A memory cell array of the DRAM 4 comprises dynamic memory cell transistors, and peripheral circuits of the DRAM 4 are constituted by NMOS 5A, NMOS 6A, NMOS 5B, NMOS 6B, PMOS 5A, PMOS 6A, PMOS 5B and PMOS 6B. The peripheral circuits of the DRAM 4 may be constituted by the NMOS 6A, NMOS 6B, PMOS 6A and PMOS 6B alone, which are driven by the internal powers VDD4A' and VDD4B'. In this case, the NMOS 5A and PMOS 5A, which are driven by the internal power VDD4, may preferably be used, for example, in a voltage generating circuit for generating the internal power VDD4A' from the internal power VDD4A. In addition, the NMOS 5B and PMOS 5B, which are driven by the internal power VDD4B, may preferably be used, for example, in a voltage generating circuit for generating the internal power VDD4B' from the internal power VDD4B.

The dRAM 3 may be formed dividedly in the two N-wells 22A-4 and 22B-4.

In FIGS. 18A and 18B, reference character G denotes the gate of each MOSFET, character BL a bit line, character WL a word line, character PL a plate electrode of a memory capacitor, and character SN a storage electrode of the memory capacitor.

A semiconductor integrated circuit (IC) device according to a sixth embodiment of the invention will now be described.

Figure 19:
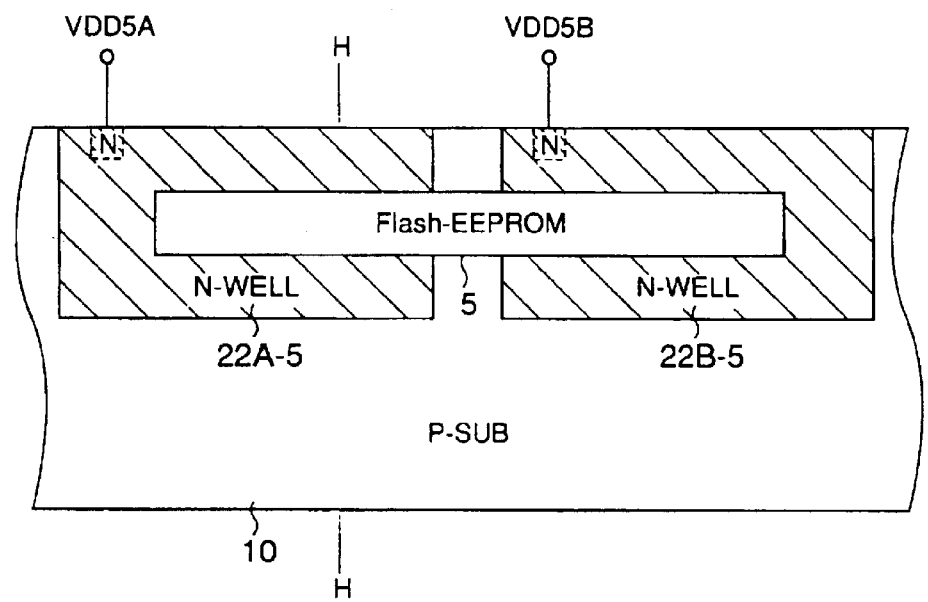
FIG. 19 is a cross-sectional view of a semiconductor IC device according to a sixth embodiment of the invention.

FIG. 19 is a cross-sectional view of the semiconductor IC device according to the sixth embodiment.

In the device according to the sixth embodiment, as is shown in FIG. 19, a flash-EEPROM 5 is formed dividedly in two large wells 22A-5 and 22B-5. The well 22A-5 is supplied with internal power VDD5A, and the well 22B-5 is supplied with internal power VDD5B.

Figures 20A, 20B:
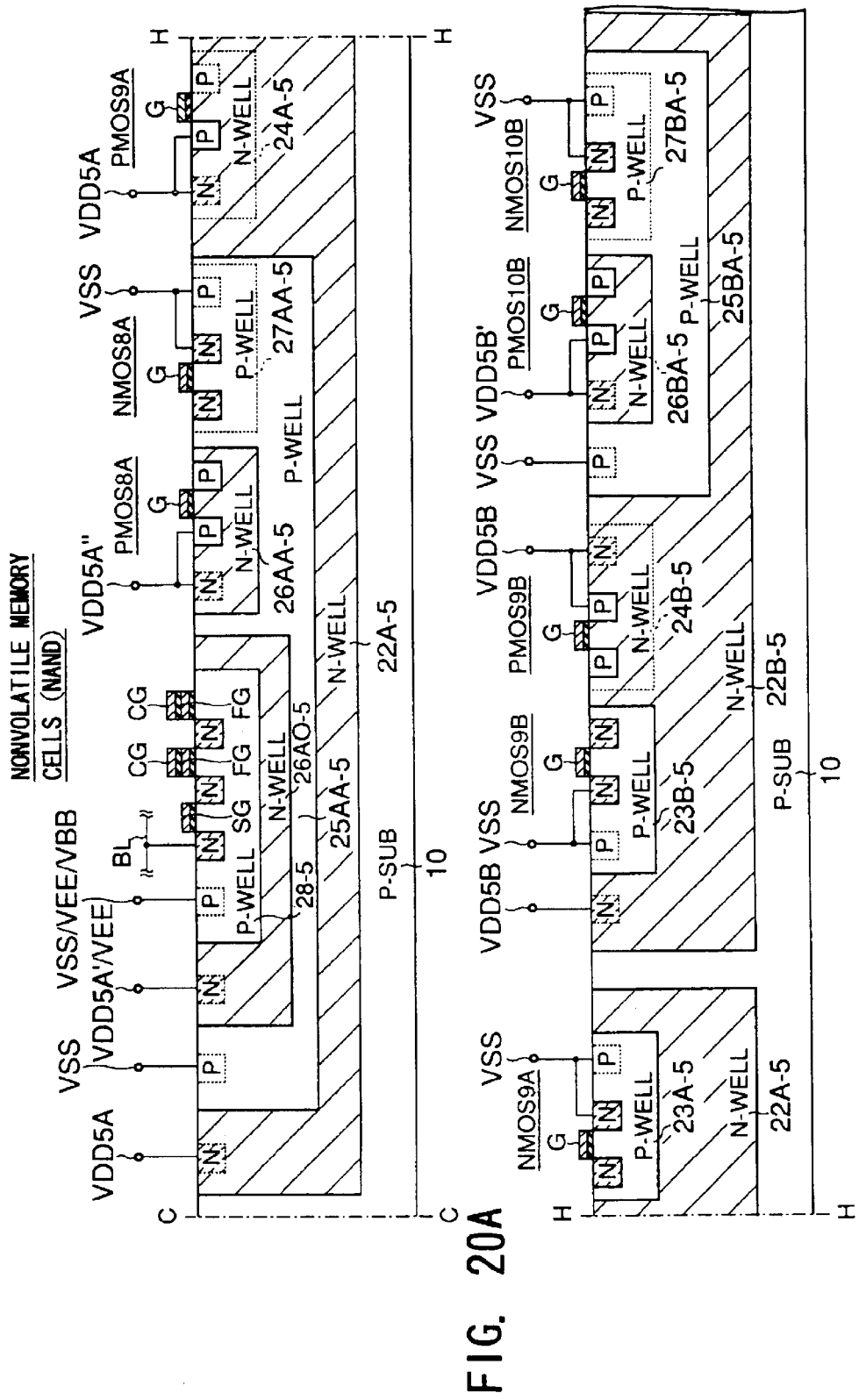
FIG. 20A is a cross-sectional view of wells 22A-5 and 22B-5 in FIG. 19.
FIG. 20B is a cross-sectional view of the wells 22A-5 and 22B-5 in FIG. 19.

FIGS. 20A and 20B are cross-sectional views of the wells 22A-5 and 22B-5 shown in FIG. 17.

As is shown in FIGS. 20A and 20B, a P-well 23A-5 and an N-well 24A-5 are formed in the large N-well 22A-5. The P-well 23A-5 is supplied with low potential power VSS (ground potential). An NMOS 9A is formed in the P-well 23A-5. The N-well 24A-5, like the large N-well 22A-5, is supplied with high potential internal power VDD5A. A PMOS 9A is formed in the N-well 24A-5. The N-well 24A-5 has an impurity concentration higher than that of the large N-well 22A-5. The N-well 24A-5 may not be provided.

A P-well 25AA-5 is formed in the large N-well 22A-4. The P-well 25AA-5 is supplied with low potential power VSS (ground potential). An N-well 26AA-5 and a P-well 27AA-5 are formed in the P-well 25AA-5. The N-well 26AA-5 is supplied with high potential internal power VDD5A'. The internal power VDD5A' is generated by voltage-converting the internal power VDD5A within the chip 1. A PMOS 8A is formed in the N-well 26AA-5. The P-well 27AA-5 is supplied with low potential power VSS. An NMOS 8A is formed in the P-well 27AA-5. The P-well 27AA-5 has an impurity concentration higher than that of the P-well 25AA-5. The P-well 27AA-5, like the N-well 24A-5, may not be provided.

An N-well 26AO-5 is formed in the P-well 25AA-5. The N-well 26AO-5 is selectively supplied with high potential internal power VDD5A' and boost potential VEE. The internal power VDD5A' and boost potential VEE are generated by voltage-converting internal power VDD5A within the chip 1. A P-well 28-5 is formed in the N-well 26AO-5. The P-well 28-5 is selectively supplied with low potential internal power VSS, boost potential VEE and drop potential VBB. The drop potential is generated by voltage-converting internal power VDD5A within the chip 1. A NAND type memory cell transistor is formed in the P-well 28-5.

A P-well 23B-5 and an N-well 24B-5 are formed in the large N-well 22B-5. The P-well 23B-5 is supplied with low potential power VSS (ground potential). An NMOS 9B is formed in the P-well 23B-5. The N-well 24B-5, like the large N-well 22B-5, is supplied with high potential internal power VDD5B. A PMOS 9B is formed in the N-well 24B-5. The N-well 24B-5 has an impurity concentration higher than that of the large N-well 22B-5. The N-well 24B-5 may not be provided.

A P-well 25BA-5 is formed in the large N-well 22B-4. The P-well 25BA-5 is supplied with low potential power VSS (ground potential). An N-well 26BA-5 and a P-well 27BA-5 are formed in the P-well 25BA-5. The N-well 26BA-5 is supplied with high potential internal power VDD5B'. The internal power VDD5B' is generated by voltage-converting internal power VDD5B within the chip 1. A PMOS 10B is formed in the N-well 26BA-5. The P-well 27BA-5 is supplied with low potential power VSS. An NMOS 10B is formed in the P-well 27BA-5. The P-well 27BA-5 has an impurity concentration higher than that of the P-well 25BA-5. The P-well 27BA-5, like the N-well 24B-5, may not be provided.

A memory cell array of the flash-EEPROM 5 comprises NAND type memory cell transistors, and peripheral circuits of the flash-EEPROM 5 are constituted by NMOS 8A, NMOS 9A, NMOS 9B, NMOS 10B, PMOS 8A, PMOS 9A, PMOS 9B and PMOS 10B. The peripheral circuits of the flash-EEPROM 5 may be constituted by the NMOS 8A, NMOS 10B, PMOS 8A and PMOS 10B alone, which are driven by the internal powers VDD5A" and VDD5B'. In this case, the NMOS 9A and PMOS 9A, which are driven by the internal power VDD5A, may preferably be used, for example, in a voltage generating circuit for generating the internal powers VDD5A', VDD5A", VBB and VEE from the internal power VDD5A. In addition, the NMOS 9B and PMOS 9B, which are driven by the internal power VDD5B, may preferably be used, for example, in a voltage generating circuit for generating the internal power VDD5B' from the internal power VDD5B.

The flash-EEPROM 5 may be formed dividedly in the two N-wells 22A-5 and 22B-5, as has been described above.

In FIGS. 20A and 20B, reference character G denotes the gate of each MOSFET, character BL a bit line, character CG a control gate, and character FG a floating gate.

Figure 21A:
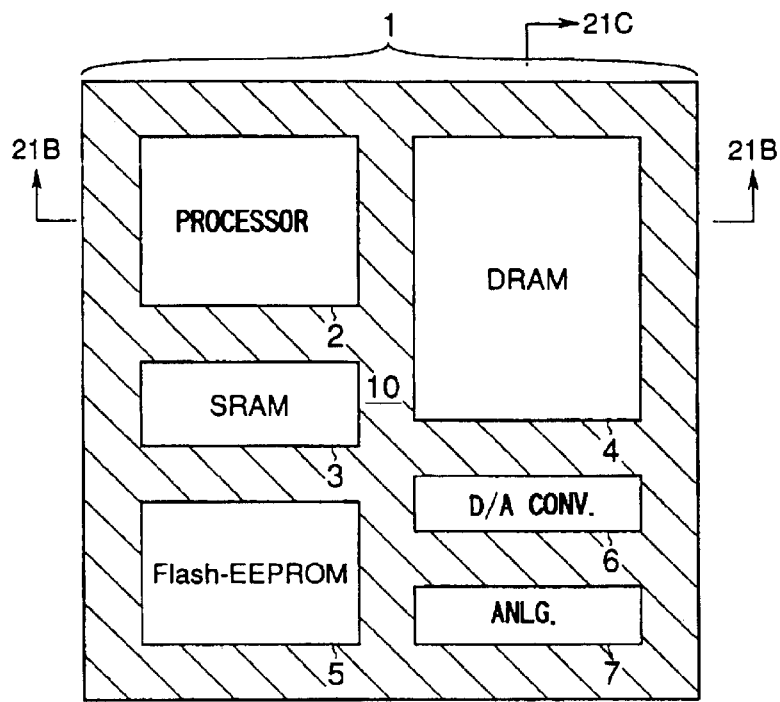
FIG. 21A is a plan view of a semiconductor IC device according to a seventh embodiment of the invention.
Figure 21B:
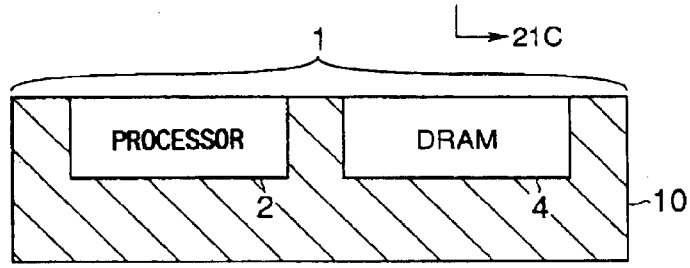
FIG. 21B is a cross-sectional view taken along line 21B—21B in FIG. 21A.
Figure 21C:
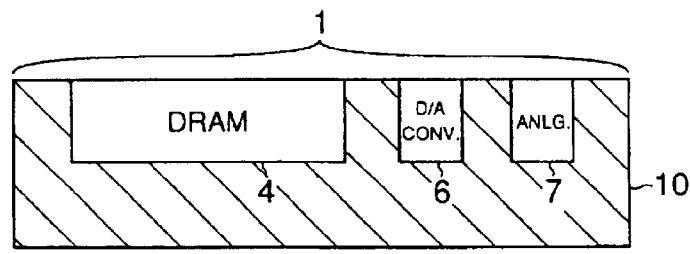
FIG. 21C is a cross-sectional view taken along line 21C—21C in FIG. 21A.

FIGS. 21A to 21C show a semiconductor integrated circuit (IC) device according to a seventh embodiment of the present invention. FIG. 21A is a plan view, FIG. 21B is a cross-sectional view taken along line 21B—21B in FIG. 21A, and FIG. 21C is a cross-sectional view taken along line 21C—21C in FIG. 21A.

As is shown in FIGS. 21A to 21C, a processor 2, an SRAM 3, a DRAM 4, a flash-EEPROM 5, a D/A converter 6, and an analog circuit 7 are formed, as functional circuits, in a semiconductor IC chip 1. These functional circuits are isolated from one another by means of an isolating region 10 provided on the chip 1. In addition, the isolating region 10 is put in contact with the entire periphery of the chip 1.

A semiconductor integrated circuit (IC) device according to an eighth embodiment of the invention will now be described.

Figure 22A:
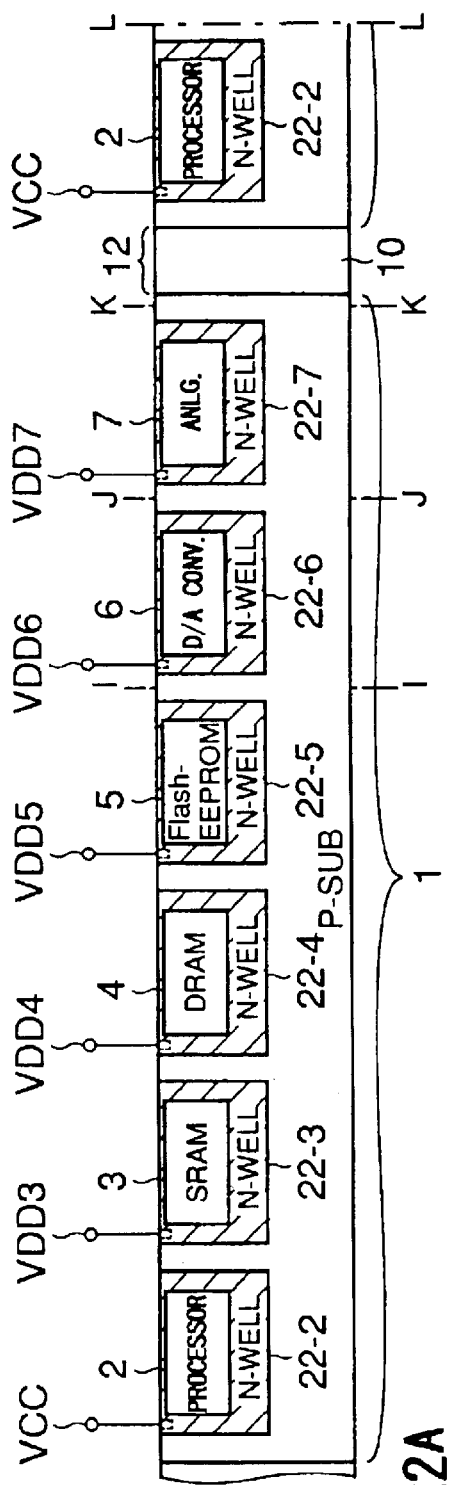
FIG. 22A is a cross-sectional view of a semiconductor IC device according to an eighth embodiment of the invention.
Figure 22B:
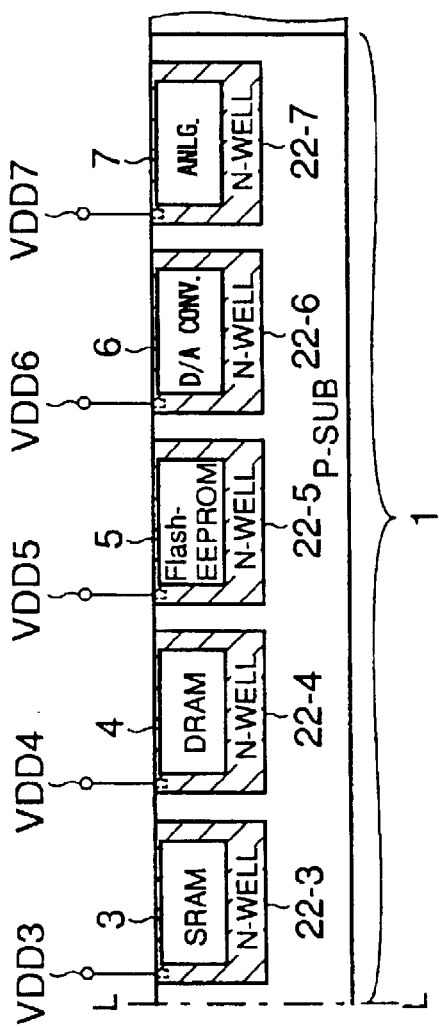
FIG. 22B is a cross-sectional view of the semiconductor IC device according to the eighth embodiment of the invention.

FIGS. 22A and 22B are cross-sectional views of the semiconductor IC device according to the eighth embodiment.

In the cross-sections shown in FIGS. 22A and 22B, the chip 1 is formed in a silicon wafer.

In the device according to the eighth embodiment, as shown in FIGS. 22A and 22B, the isolating region 10 is formed of a P-silicon substrate (P-SUB). For example, the P-silicon substrate 10 is the silicon wafer itself. A plurality of N-wells (N-WELL) 22 are provided in the substrate 10. In the device according to the eighth embodiment, there are provided six large wells 22-2 to 22-7. A processor 2, an SRAM 3, a DRAM 4, a flash-EEPROM 5, a D/A converter 6, and an analog circuit 7 are formed in the six large wells 22-2 to 22-7. The large wells 22-2 to 22-7 are supplied with optimal power potentials for the respective functional circuits. In the semiconductor IC device according to the eighth embodiment, the well 22-2 is supplied with high potential power VCC, the well 22-3 with high potential power VDD3, the well 22-4 with high potential power VDD4, the well 22-5 with high potential power VDD5, the well 22-6 with high potential power VDD6, and the well 22-7 with high potential power VDD7. The high potential power VCC is an external power which is, like low potential power VSS (not shown), supplied from the outside of the chip 1. The high potential powers VDD3 to VDD7 are internal powers generated by voltage-converting the external potential within the chip 1.

Figure 23:
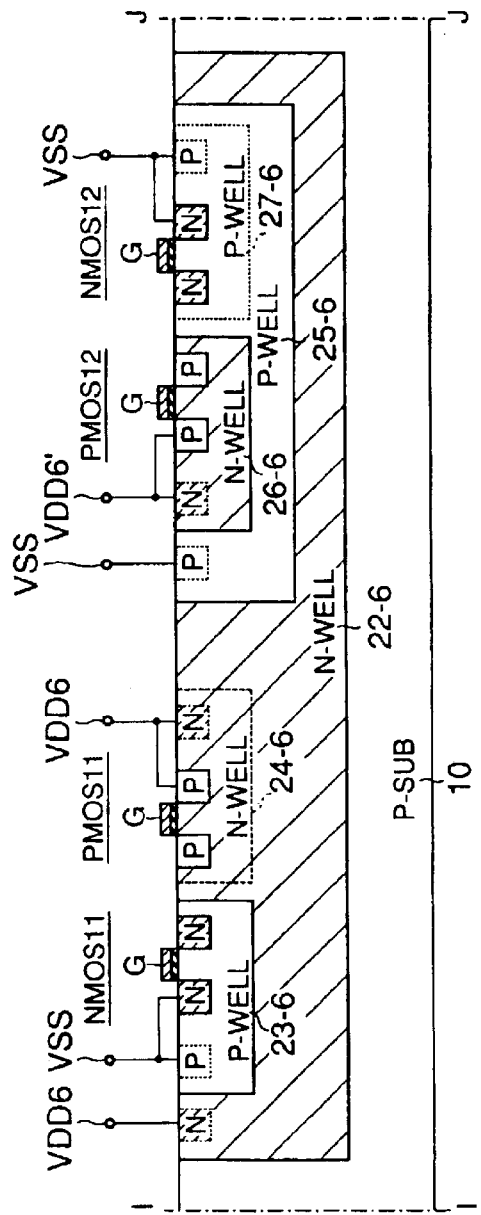
FIG. 23 is a cross-sectional view of a well 22-6 shown in FIGS. 22A and 22B.

FIG. 23 is a cross-sectional view of the well 22-6 shown in FIGS. 22A and 22B.

As is shown in FIG. 23, a P-well 23-6 and an N-well 24-6 are formed in the large N-well 22-6. The P-well 23-6 is supplied with low potential power VSS (ground potential). An NMOS 11 is formed in the P-well 23-6. The N-well 24-6, like the large N-well 22-6, is supplied with high potential power VDD6. A PMOS 11 is formed in the N-well 24-6. The N-well 24-6 has an impurity concentration higher than that of the large N-well 22-6. The N-well 24-6 may not be provided.

A P-well 25-6 is formed in the large N-well 22-6. The P-well 25-6 is supplied with low potential power VSS (ground potential). An N-well 26-6 and a P-well 27-6 are formed in the P-well 25-6. The N-well 26-6 is supplied with high potential power VDD6'. The power VDD' is an internal power generated by voltage-converting the power VDD6 within the chip 1. A PMOS 12 is formed in the N-well 26-6. The P-well 27-6 is supplied with low potential power VSS. An NMOS 12 is formed in the P-well 27-6. The P-well 27-6 has an impurity concentration higher than that of the P-well 25-6. The P-well 27-6, like the N-well 24-6, may not be provided.

The D/A converter 6 basically comprises the NMOS 11, NMOS 12, PMOS 11 and PMOS 12. The D/A converter 6 may be constituted by the NMOS 12 and PMOS 12 alone which are driven by the internal power VDD6'. In this case, the NMOS 11 and PMOS 11, which are driven by the internal power VDD6, may preferably be used, for example, in a voltage generating circuit for generating the internal power VDD6' from the internal power VDD6. In addition, a plurality of P-wells similar to the P-well 25-6 may be formed in the large N-well 22-6.

In FIG. 23, reference character G denotes a gate of each MOSFET.

Figure 24:
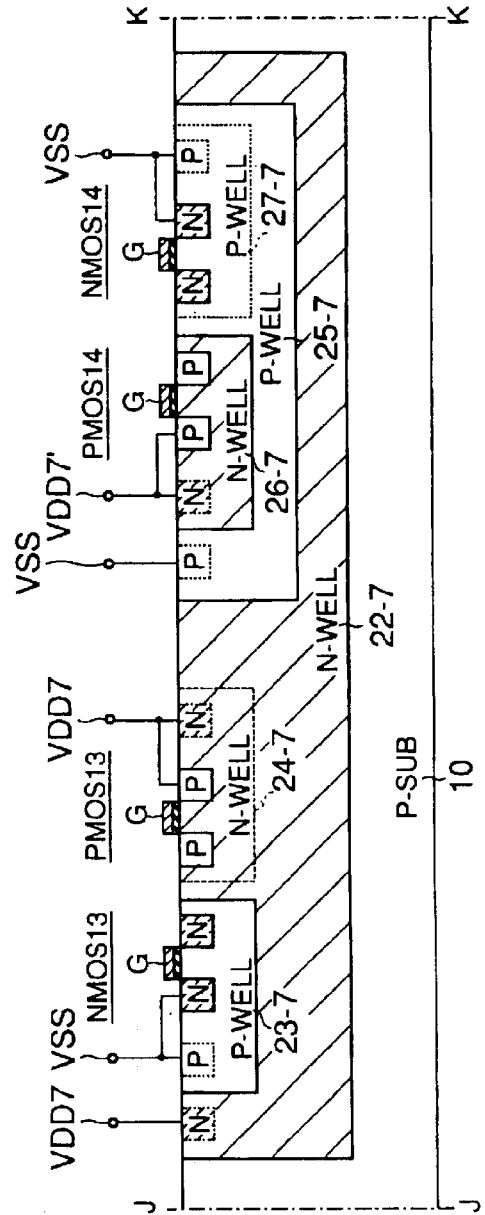
FIG. 24 is a cross-sectional view of a well 22-7 in FIGS. 22A and 22B.

FIG. 24 is a cross-sectional view of the well 22-7 shown in FIGS. 22A and 22B.

As is shown in FIG. 24, a P-well 23-7 and an N-well 24-7 are formed in the large N-well 22-7. The P-well 23-7 is supplied with low potential power VSS (ground potential). An NMOS 13 is formed in the P-well 23-7. The N-well 24-7, like the large N-well 22-7, is supplied with high potential internal power VDD7. A PMOS 13 is formed in the N-well 24-7. The N-well 24-7 has an impurity concentration higher than that of the large N-well 22-7. The N-well 24-7 may not be provided.

A P-well 25-7 is formed in the large N-well 22-7. The P-well 25-7 is supplied with low potential power VSS (ground potential). An N-well 26-7 and a P-well 27-7 are formed in the P-well 25-7. The N-well 26-7 is supplied with high potential power VDD7'. The power VDD7' is an internal power generated by voltage-converting the power VDD7 within the chip 1. A PMOS 14 is formed in the N-well 26-7. The P-well 27-7 is supplied with low potential power VSS. An NMOS 14 is formed in the P-well 27-7. The P-well 27-7 has an impurity concentration higher than that of the P-well 25-7. The P-well 27-7, like the N-well 24-7, may not be provided.

The analog circuit 7 basically comprises the NMOS 13, NMOS 14, PMOS 13 and PMOS 14. The analog circuit 7 may be constituted by the NMOS 14 and PMOS 14 alone which are driven by the internal power VDD7'. In this case, the NMOS 13 and PMOS 13, which are driven by the internal power VDD7, may preferably be used, for example, in a voltage generating circuit for generating the internal power VDD7' from the internal power VDD7. In addition, a plurality of P-wells similar to the P-well 25-7 may be formed in the large N-well 22-7.

In FIG. 24, reference character G denotes a gate of each MOSFET.

Figure 25A:
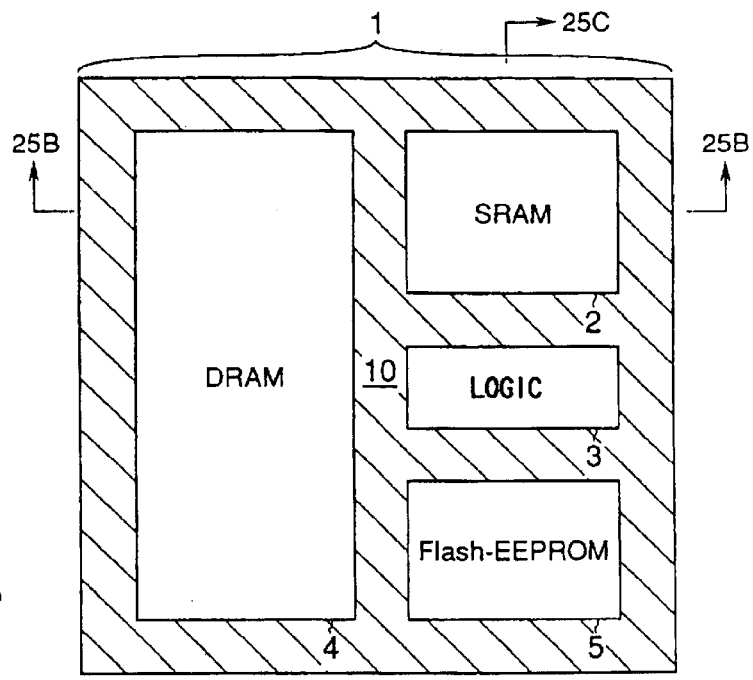
FIG. 25A is a plan view of a semiconductor IC device according to a ninth embodiment of the invention.
Figure 25B:
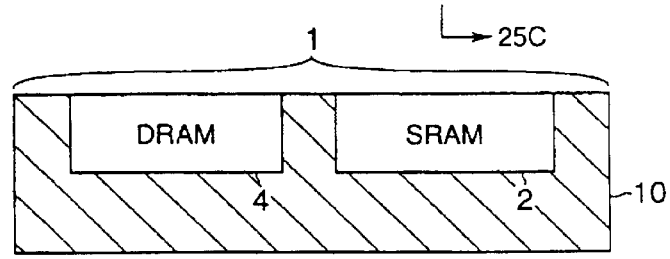
FIG. 25B is a cross-sectional view taken along line 25B—25B in FIG. 25A.
Figure 25C:
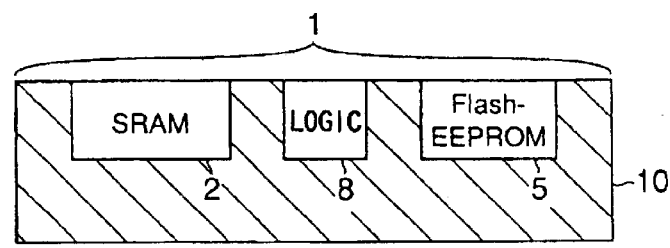
FIG. 25C is a cross-sectional view taken along line 25C—25C in FIG. 25A.

FIGS. 25A to 25C show a semiconductor integrated circuit (IC) device according to a ninth embodiment of the present invention. FIG. 25A is a plan view, FIG. 25B is a cross-sectional view taken along line 25B—25B in FIG. 25A, and FIG. 25C is a cross-sectional view taken along line 25C—25C in FIG. 25A.

As is shown in FIGS. 25A to 25C, an SRAM 3, a DRAM 4, a flash-EEPROM 5, and a logic circuit 8 are formed, as functional circuits, in a semiconductor IC chip 1. These functional circuits are isolated from one another by means of an isolating region 10 provided on the chip 1. In addition, the isolating region 10 is put in contact with the entire periphery of the chip 1.

The logic circuit 8 is, like processor 2, constituted by a logic circuit component, but the scale of circuitry of the logic circuit 8 is less than that of the processor 2.

A semiconductor integrated circuit (IC) device according to a tenth embodiment of the invention will now be described.

Figure 26:
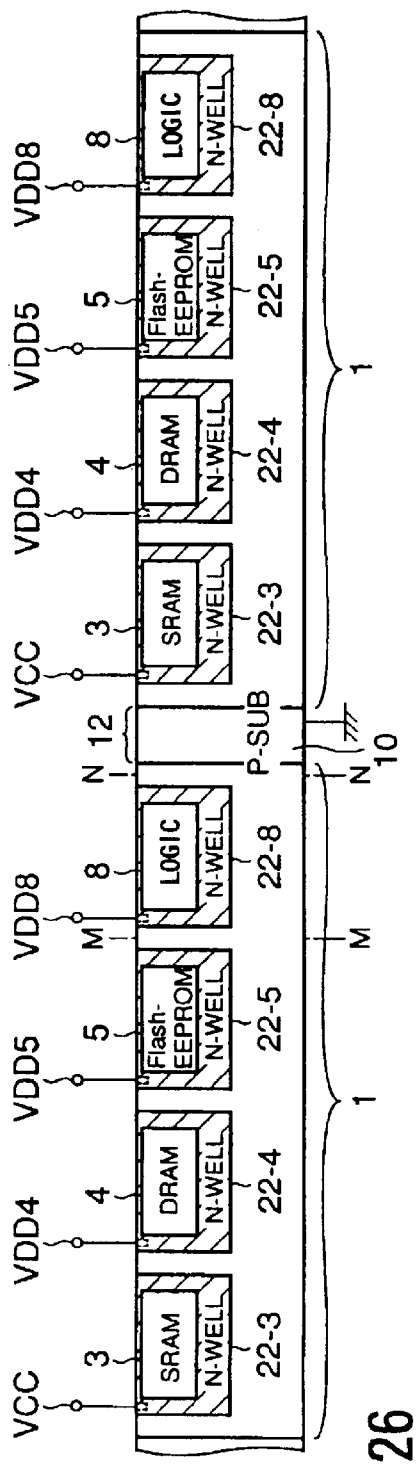
FIG. 26 is a cross-sectional view of a semiconductor IC device according to a tenth embodiment of the invention.

FIG. 26 is a cross-sectional view of the semiconductor IC circuit according to the tenth embodiment of the invention.

In the cross-sections shown in FIG. 26, the chip 1 is formed in a silicon wafer.

In the device according to the tenth embodiment, as shown in FIG. 26, the isolating region 10 is formed of a P-silicon substrate (P-SUB). For example, the P-silicon substrate 10 is the silicon wafer itself. A plurality of N-wells (N-WELL) 22 are provided in the substrate 10. In the device according to the tenth embodiment, there are provided four large wells 22-3 to 22-5 and 22-8. An SRAM 3, a DRAM 4, a flash-EEPROM 5, and a logic circuit 8 are formed in the four large wells 22-3 to 22-5 and 22-8. The large wells 22-3 to 22-5 and 22-8 are supplied with optimal power potentials for the respective functional circuits. In the semiconductor IC device according to the tenth embodiment, the well 22-3 is supplied with high potential power VCC, the well 22-4 with high potential power VDD4, the well 22-5 with high potential power VDD5, and the well 22-8 with high potential power VDD8. The high potential power VCC is an external power which is, like low potential power VSS (not shown), supplied from the outside of the chip 1. The high potential powers VDD4, VDD5 and VDD8 are internal powers generated by voltage-converting the external power potential within the chip 1.

Figure 27:
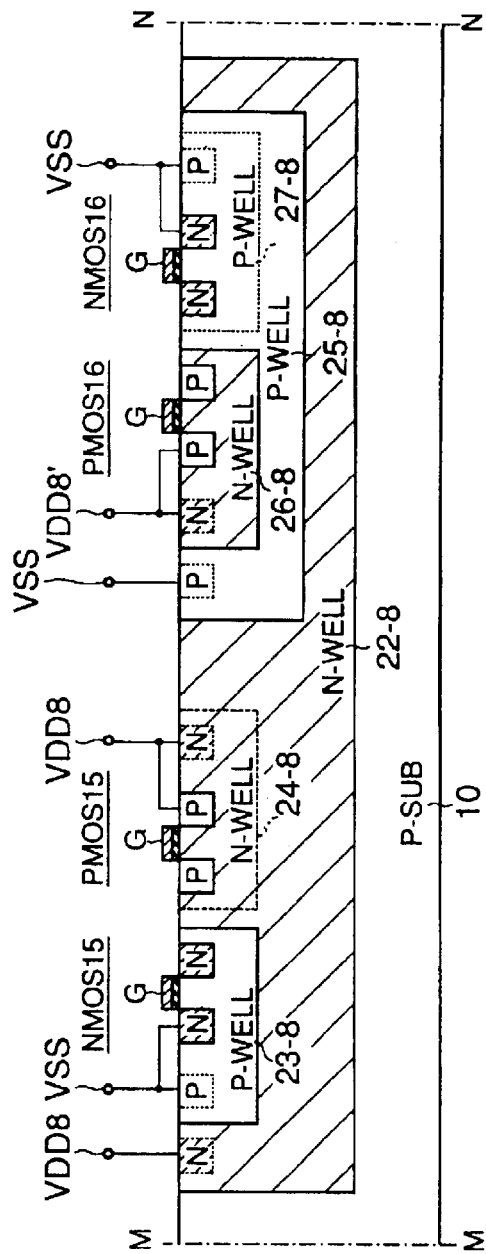
FIG. 27 is a cross-sectional view of a well 22-8 in FIG. 26.

FIG. 27 is a cross-sectional view of the well 22-8 shown in FIG. 26.

As is shown in FIG. 27, a P-well 23-8 and an N-well 24-8 are formed in the large N-well 22-8. The P-well 23-B is supplied with low potential power VSS (ground potential). An NMOS 15 is formed in the P-well 23-8. The N-well 24-8, like the large N-well 22-8, is supplied with high potential power VDD8. A PMOS 15 is formed in the N-well 24-8. The N-well 24-8 has an impurity concentration higher than that of the large N-well 22-8. The N-well 24-6 may not be provided.

A P-well 25-8 is formed in the large N-well 22-8. The P-well 25-8 is supplied with low potential power VSS (ground potential). An N-well 26-8 and a P-well 27-8 are formed in the P-well 25-8. The N-well 26-8 is supplied with high potential power VDD8'. The power VDD8' is an internal power generated by voltage-converting the power VDD8 within the chip 1. A PMOS 16 is formed in the N-well 26-8. The P-well 27-8 is supplied with low potential power VSS. An NMOS 16 is formed in the P-well 27-8. The P-well 27-8 has an impurity concentration higher than that of the P-well 25-8. The P-well 27-8, like the N-well 24-8, may not be provided.

The logic circuit 8 basically comprises the NMOS 15, NMOS 16, PMOS 15 and PMOS 16. The logic circuit 8 may be constituted by the NMOS 16 and PMOS 16 alone which are driven by the internal power VDD8'. In this case, the NMOS 15 and PMOS 15, which are driven by the internal power VDD8, may preferably be used, for example, in a voltage generating circuit for generating the internal power VDD8' from the internal power VDD8. In addition, a plurality of P-wells similar to the P-well 25-6 may be formed in the large N-well 22-8.

In FIG. 23, reference character G denotes a gate of each MOSFET.

A semiconductor integrated circuit (IC) device according to an eleventh embodiment of the present invention.

Figure 28:
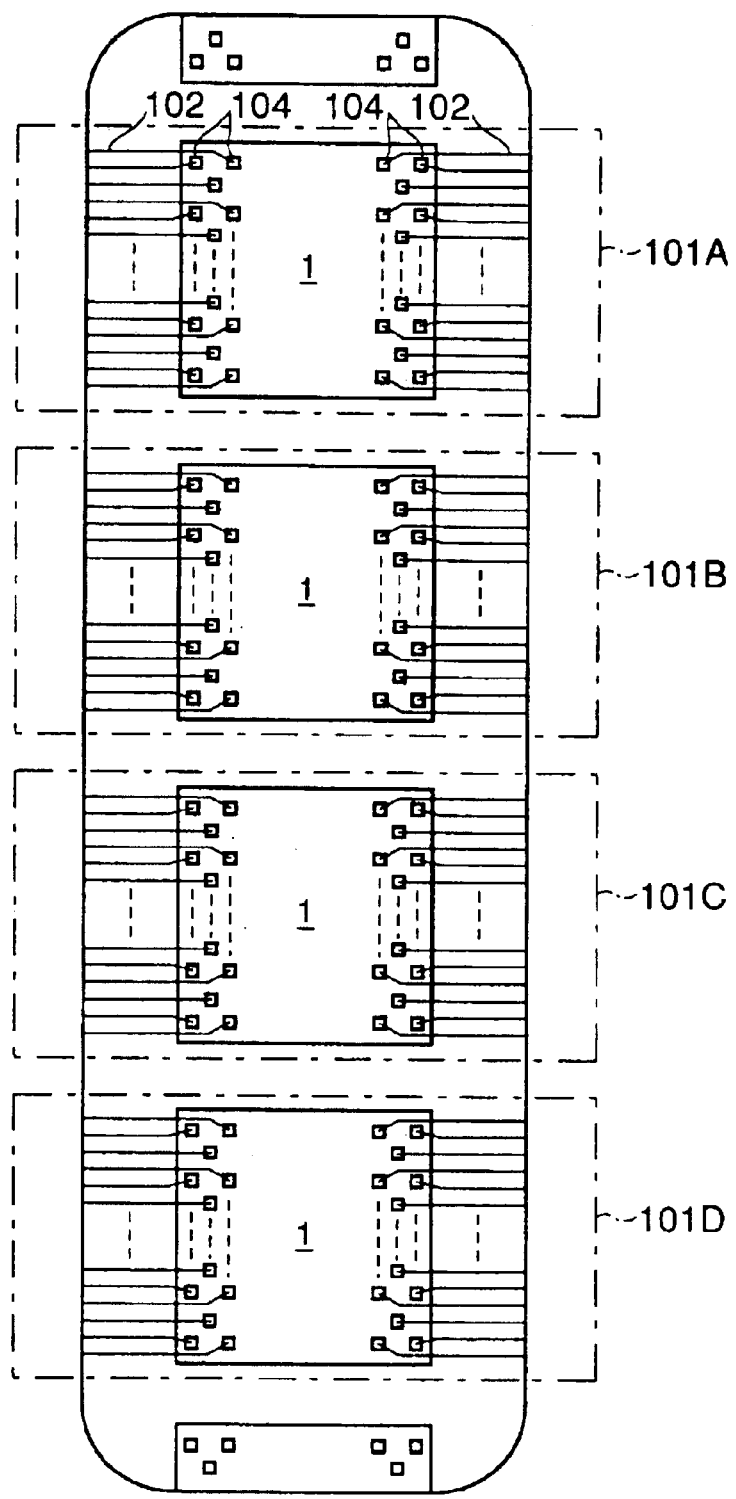
FIG. 28 is a plan view showing the state in which a semiconductor IC device according to an eleventh embodiment is being tested.

FIG. 28 is a plan view showing the state in which the semiconductor IC device according to the eleventh embodiment is being tested.

As is shown in FIG. 28, pads 104 may be arranged in a staggering manner in three rows.

The embodiments of the present invention have been described above. The present invention, however, may be modified variously. For example, the processor 2, SRAM 3, DRAM 4, flash-EEPROM 5, D/A converter 6, analog circuit 7 and logic circuit 8 are mentioned above as functional circuits. However, other functional circuits may be used, and the functional circuits to be formed in one semiconductor chip may be variously combined.

It is described above that the external potential power VCC is applied to the well in which the processor 2 or SRAM 3 is formed. However, the external potential power VCC may be applied to the wells in which other functional circuits are formed. In addition, it is possible to form a well which is to be supplied with external potential power VCC and to provide this well with a circuit for generating a potential to be supplied to other wells.

A twelfth embodiment of the invention will now be described.

Figure 29:
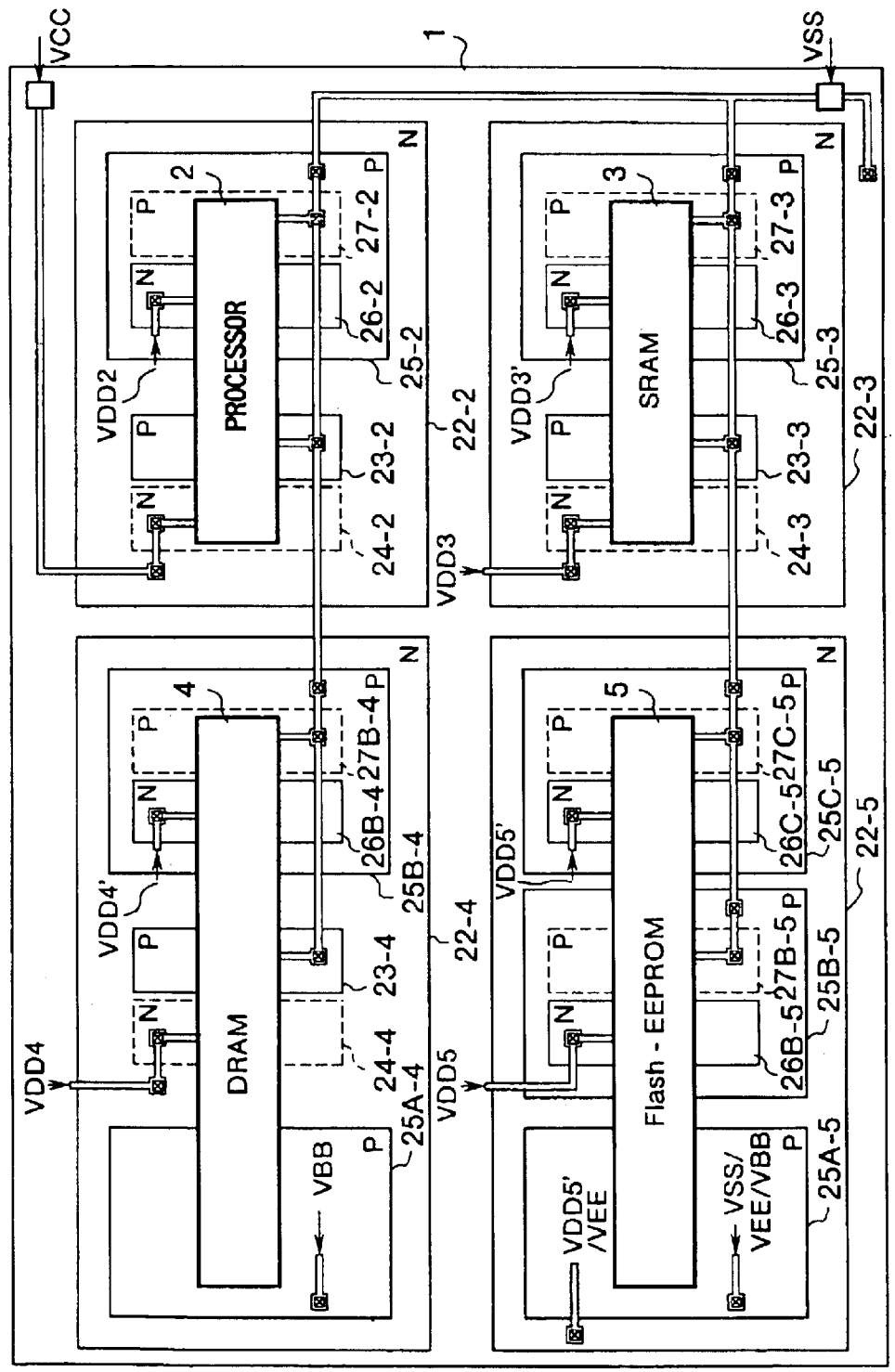
FIG. 29 is a plan view showing a basic structure of a semiconductor integrated circuit (IC) device chip according to the first to eleventh embodiments.

FIG. 29 is a plan view showing a basic structure of a semiconductor integrated circuit (IC) device chip according to the first to eleventh embodiments.

In the semiconductor IC device of the invention, as shown in FIG. 29, for example, the processor 2, SRAM 3, DRAM 4 and flash-EEPROM 5 are formed as functional circuits in the mutually isolated wells 22-2 to 22-5. Thus, even if a plurality of chips formed on a wafer is tested at a time, the functional circuits included in each chip are hardly influenced by one another. As has been described with reference to FIG. 5, each functional circuit can be tested with high precision. Since tests can be performed with high precision, the yield of products being subjected to tests in the state in which the products are formed on the wafer can be increased.

According to the twelfth embodiment, for example, when a power voltage has lowered from 3.3V of the present level, the yield of products being subjected to tests in the state in which the products are formed on the wafer can be further increased.

In the basic structure of the semiconductor IC device according to the present invention, as shown in FIG. 29, two power systems VCC and VSS for the functional circuits are provided. Of the two, the power system VSS is common to a bias system of the substrate.

Figure 30:
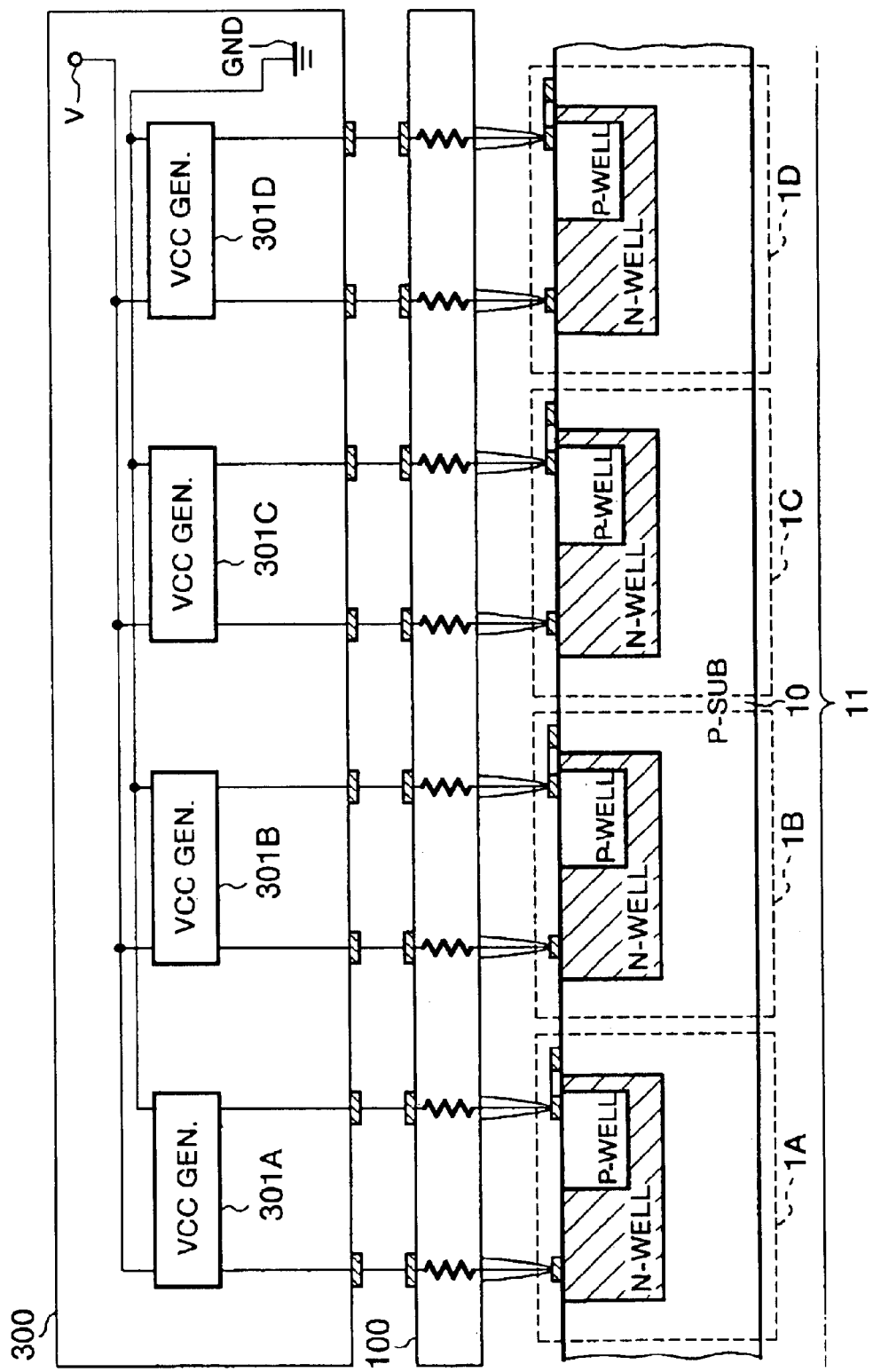
FIG. 30 schematically shows the state in which the chip shown in FIG. 29 is subjected to a multiple test.

FIG. 30 schematically shows the state in which the chip shown in FIG. 29 is subjected to a multiple test. FIG. 30 shows only the power system.

As is shown in FIG. 30, chips 1A to 1D are formed on a single wafer 11. A tester 300 has VCC generators 301A to 301D corresponding to the chips 1A to 1D. The VCC generator 301A to 301D generate powers for the chips 1A to 1D, i.e. high potential VCC and low potential VSS, from a potential difference between intra-tester high potential V and intra-tester ground potential GND. The generated high potential VCC and low potential VSS are supplied to the chips 1A to 1D. The high potential power VCC is used as high potential power for operating integrated circuits, and the low potential power VSS as low potential power for operating the integrated circuits and bias potential for the P-type substrate.

Figure 31:
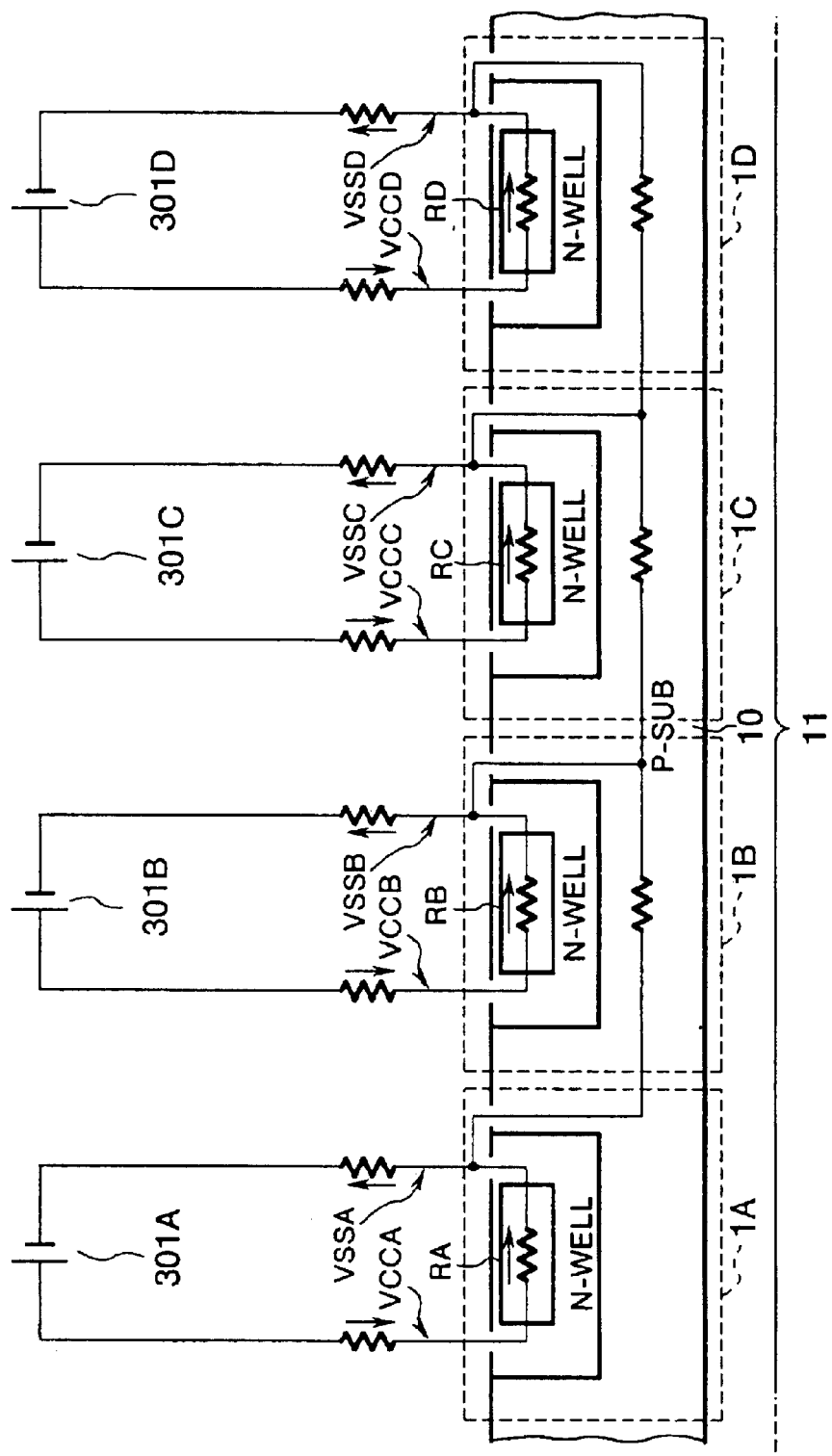
FIG. 31 is an equivalent circuit diagram of the structure shown in FIG. 30.

FIG. 31 is an equivalent circuit diagram of the structure shown in FIG. 30. In FIG. 31, the integrated circuits formed in the chips 1A to 1D are shown as loads RA to RD.

As is shown in FIG. 31, in the state in which the chips 1A to 1D are being tested at a time, electric currents are flowing through the loads RA to RD at the same time. The currents, which have passed through the loads RA to RD, flow to the low potential supplies VSS. The low potential supplies VSS are mutually connected via the wafer 11. Ripples of power (VCCA, VSSA) supplied to the chip 1A, . . . , power (VCCD, VSSD) supplied to the chip 1D become ripple high-frequency waves of the respective powers and are applied across the loads RA to RD. This state is shown in FIG. 32.

Figure 32:
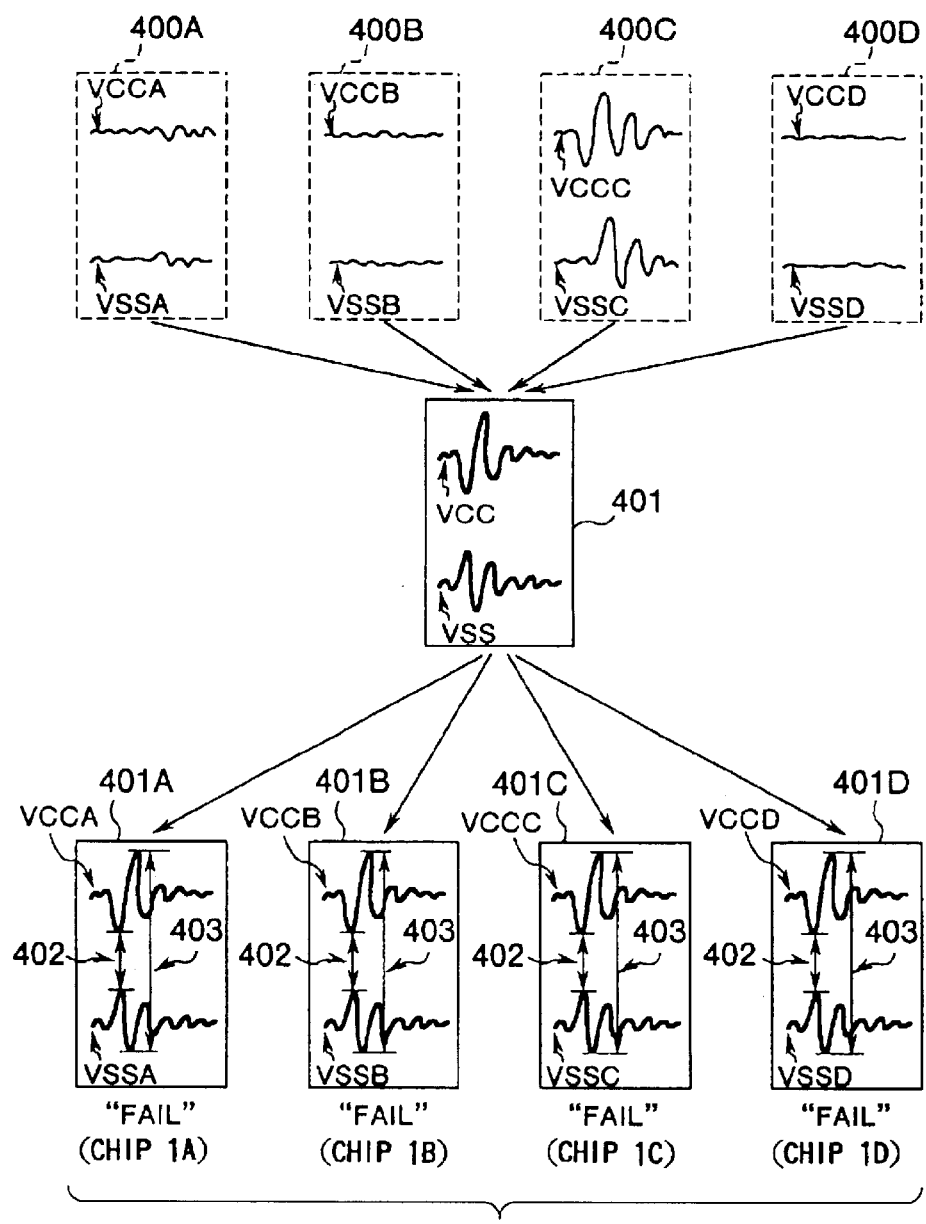
FIG. 32 shows a power ripple of each chip shown in FIG. 30.

FIG. 32 schematically shows ripples of powers supplied to the respective chips shown in FIG. 30.

In FIG. 32, reference numeral 400A is a ripple of power to the chip 1A, 400B a ripple of power to the chip 1B, 400C a ripple of power to the chip 1C, and 400D a ripple of power to the chip 1D. When the chips 1A to 1D are tested one by one, ripples of powers to the chips 1A to 1D will occur, as indicated by reference numerals 400A to 400D.

However, when the chips 1A to 1D are tested at the same time, the ripples of the powers, indicated by numerals 400A to 400D, overlap one another and become high-frequency waves, as indicated by numeral 401. Thus, the ripples of powers to the chips 1A to 1D become high-frequency waves, as indicated by reference numerals 401A to 401D.

Suppose that while the chips 1A to 1D are being tested at a time, a large current has flown from the high potential VCCC to low potential VSSC of the chip 1C owing to a defect in the chip 1C. In this case, as indicated by reference numeral 400C, the ripple of power to chip IC increases and becomes a great high-frequency wave 401. Consequently, the ripples of powers to the chips, which are indicated by reference numerals 401A to 401D increase. With reduction in size of transistors, the power voltage has been gradually decreased from 5V to 3.3V to 2.5V, . . . If a large ripple occurs in the power when the power voltage has decreased to a very low level, the power voltage decreases below a guaranteed operational voltage of the transistor, as indicated by reference numeral 402, or increases above a guaranteed withstand voltage of the operational transistor. If the power voltage decreases below the guaranteed operational voltage, operational defects will occur in the chips 1A, 1B and 1D, in addition to the defective chip IC, and these chips will be determined to be defective at the time of tests. On the other hand, if the power voltage rises above the guaranteed withstand voltage of transistors, the transistors of chips 1A, 1B and 1C will be broken. Such problems would become more serious as the reduction in size and power voltage of transistors will progress.

At present, the number of chips to be tested simultaneously is small, for example, four, eight or 16. In the future, however, the number will increase to 32, 64, and more, and at last all chips on the wafer 11 will be tested. In this case, for example, 31 chips, 63 chips or, in the worst case, all chips on the wafer 11 will become defective because of the presence of one defective chip.

Under the circumstances, it is expected that when chips operable at lower voltage are tested in a multiple manner, the yield of tested products on the wafer will decrease in the future.

In order to solve this problem, there is an idea of testing chips 1A to 1D one by one. In this case, however, the time for a test for one wafer increases, resulting in a decrease in through-put.

Figure 33:
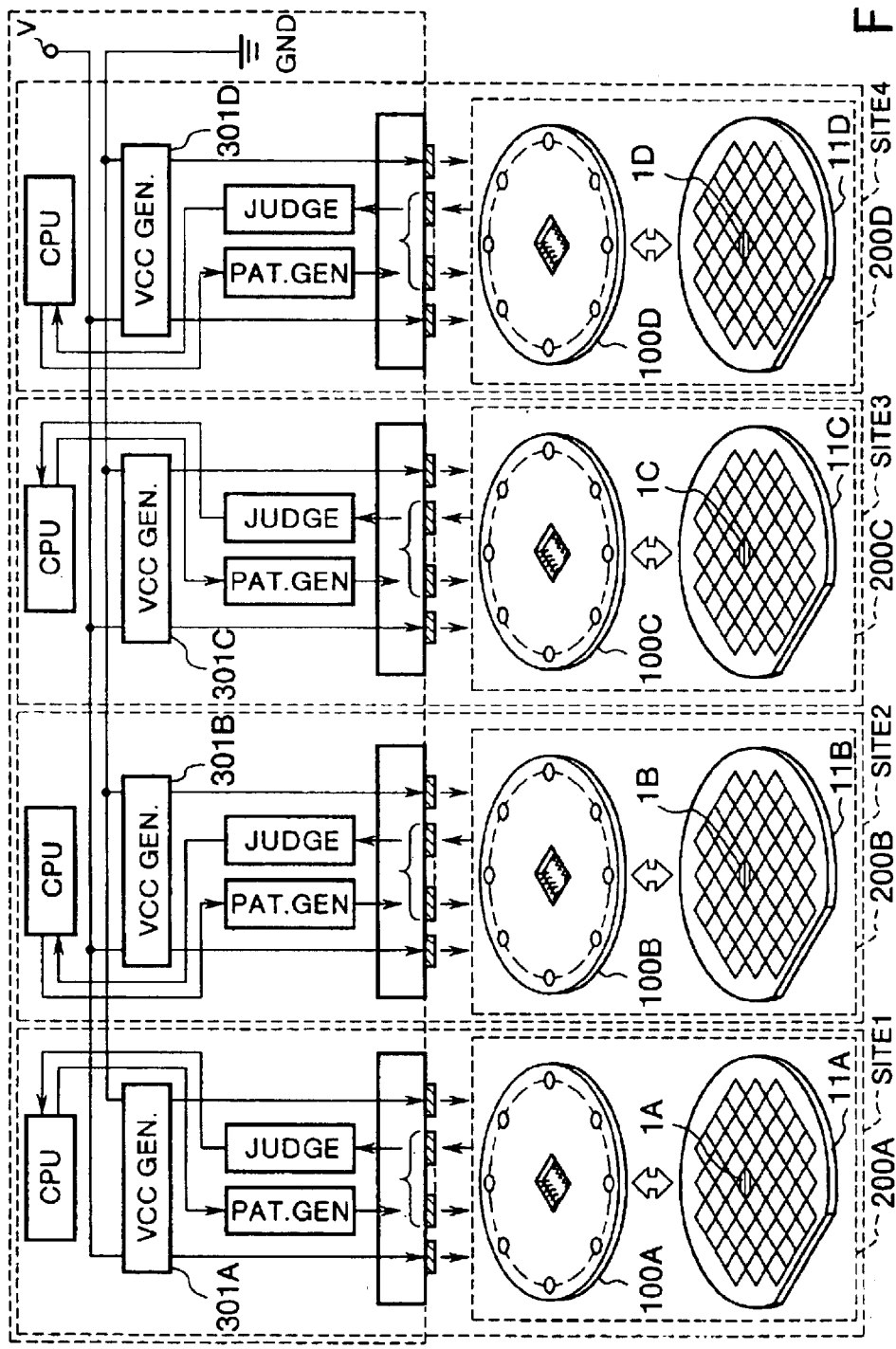
FIG. 33 shows a system configuration of a test system according to a twelfth embodiment of the invention.

FIG. 33 shows a system configuration of the test system according to the twelfth embodiment of the invention.

In order to prevent a decrease in through-put and yield of tested products, it would be advisable to use a per-site type test system, as shown in FIG. 33, and to test a plurality of wafers 11A to 11D at a time. In the per-site type test system, one chip of each of wafers 11A to 11D is tested.

As has been described above, if the semiconductor IC devices of the first to eleventh embodiments are tested by the per-site test system of the twelfth embodiment, the decrease in through-put and yield of tested products can be prevented.

A 13th embodiment and a 14th embodiment of the present invention will now be described.

The per-site type test system having a plurality of test stations 200A to 200D, as shown in FIG. 33, is expensive. The per-site test system thus incurs a great deal of facility investment.

The 13th embodiment of the invention provides a semiconductor IC device, wherein even if a plurality of chips formed on a single wafer are tested simultaneously, it is possible to suppress high-frequency waves due to ripple of power and to prevent a decrease in yield of tested products on the wafer. The 14th embodiment provides a test system for the IC device of the 13th embodiment.

Figure 34:
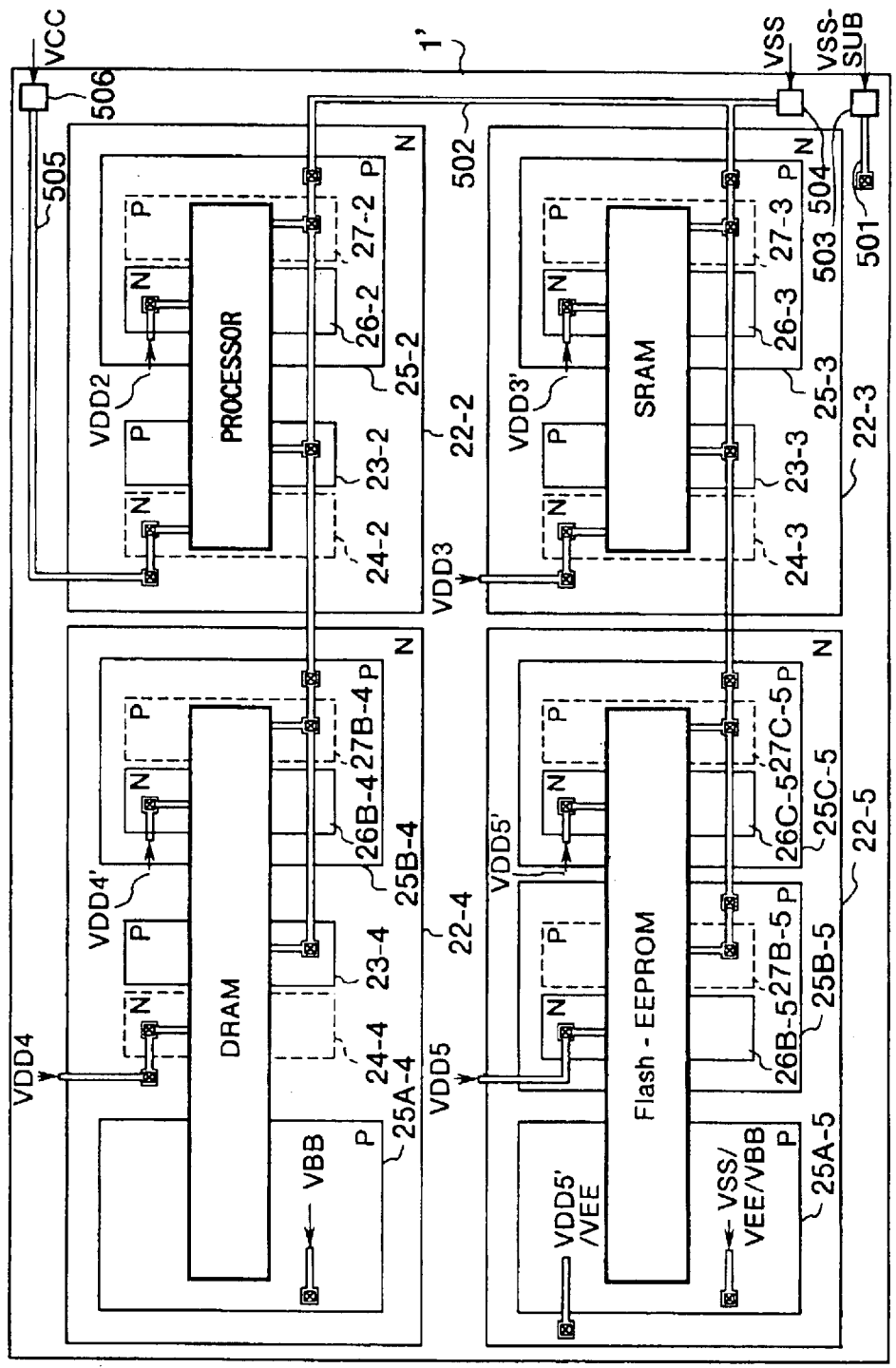
FIG. 34 is a plan view showing a basic structure of a semiconductor IC device according to a 13th embodiment of the invention.

FIG. 34 is a plan view showing a basic structure of the semiconductor IC device according to the 13th embodiment.

In the semiconductor IC device according to the 13th embodiment, as shown in FIG. 34, a power supply system (VCC, VSS) of the IC is separated from a bias system (VSS–SUB) of the substrate on chip 1'. Specifically, within the chip 1', a line 501 of low potential VSS–SUB used for bias of the substrate is not connected to a line 502 of low potential VSS used for power to the 1C. The line 501 is supplied with low potential VSS–SUB via a pad 503, and the line 502 is supplied with low potential VSS via a pad 504 different from the pad 503. A line 505 is used to supply high potential VCC. The line 505 is supplied with high potential VCC via a pad 506.

Figure 35:
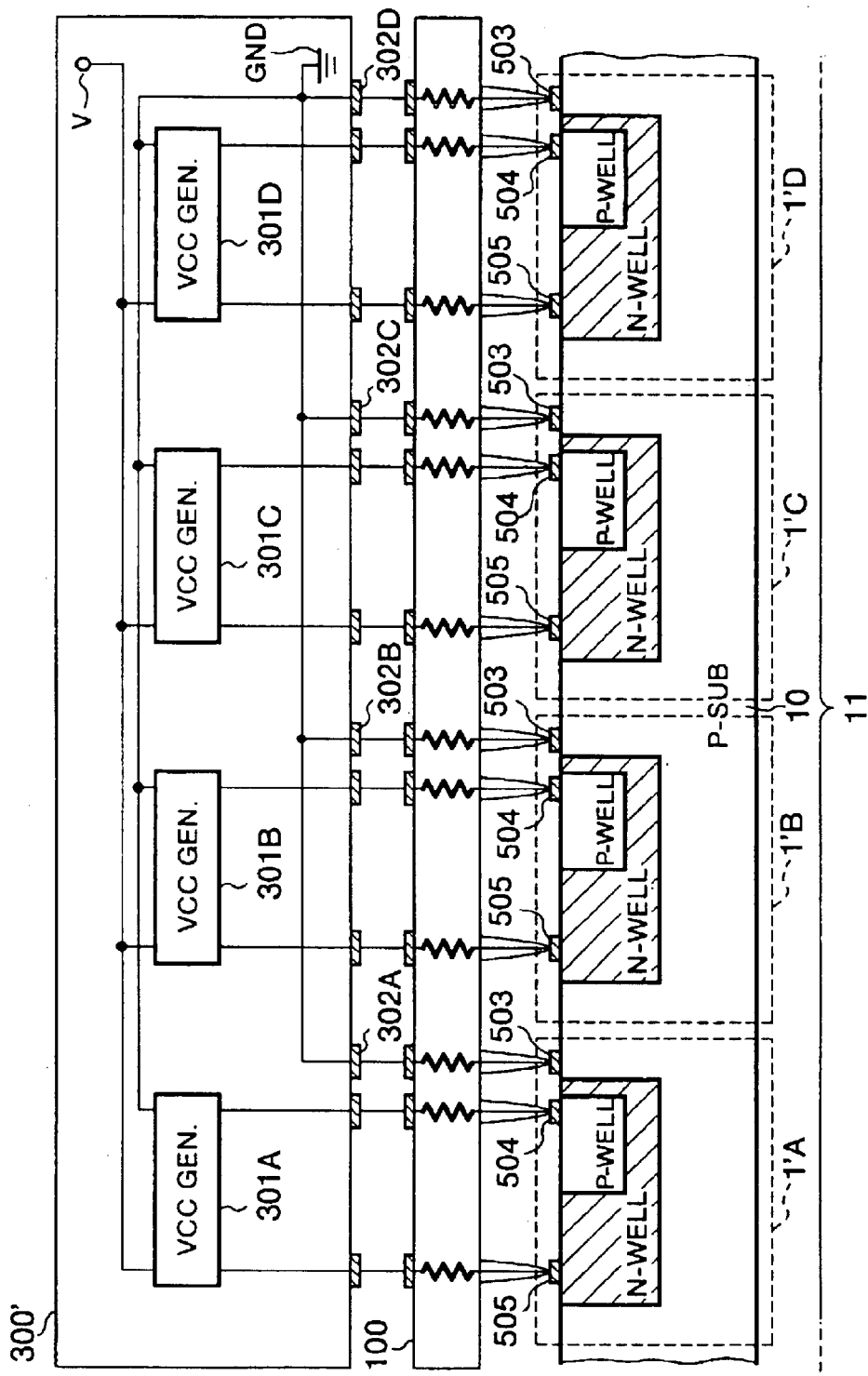
FIG. 35 schematically shows the state in which the chip shown in FIG. 34 is subjected to a multiple test.

FIG. 35 schematically shows the state in which the chip shown in FIG. 34 is subjected to a multiple-test. FIG. 35 shows the power supply system alone.

As is shown in FIG. 35, a tester 300' has VCC generators 301A to 301D associated with chips 1'A to 1'D. A high potential VCC generated by the VCC generators 301A to 301D and a low potential VSS are supplied to the chips 1'A to 1'D. The high potential VCC is used as high potential power supply for operating the IC, and the low potential VSS is used as low potential power supply for operating the IC.

The tester 300' has bias power terminals 302A to 302D for applying a bias potential to the substrates associated with chips 1'A to 1'D. In the tester 300', since the wafer 11 is formed of P-type silicon, the bias power terminals 302A to 302D are connected to a ground GND within the tester. If the IC device formed on the N-type silicon wafer is to be tested, the bias power terminals 302A to 302D are connected to a VCC generator (not shown) provided within the tester 300'. It is desirable in this case that the VCC generator be provided to exclusively produce a bias potential, separately from the VCC generators 301A to 301D for the IC.

Figure 36:
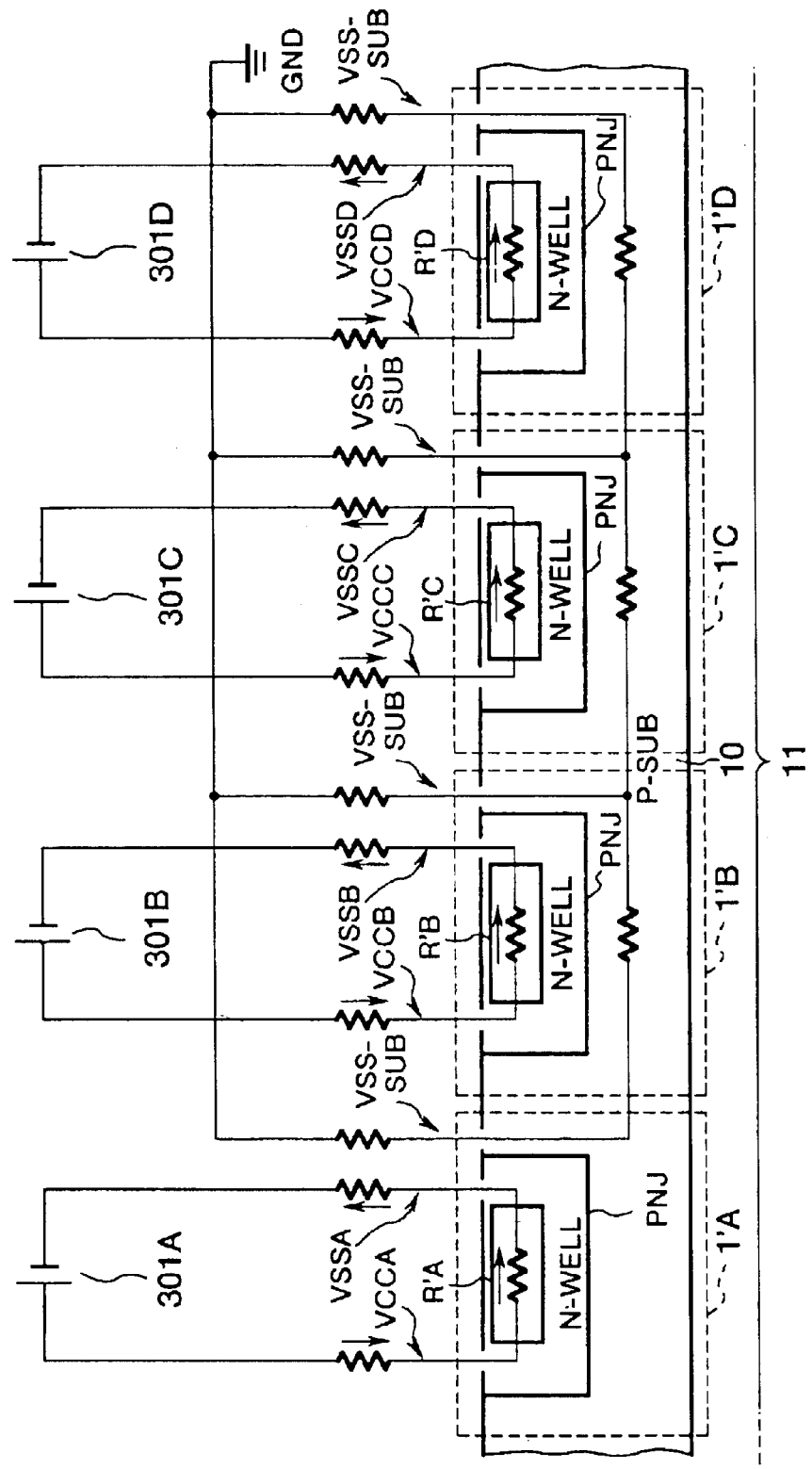
FIG. 36 is an equivalent circuit diagram of the structure shown in FIG. 35.

FIG. 36 is an equivalent circuit diagram of the structure shown in FIG. 35. In FIG. 36, the integrated. circuits formed in the chips 1'A to 1'D are shown as loads R'A to R'D.

As is shown in FIG. 36, in the state in which the chips 1'A to 1'D are being tested at a time, electric currents are flowing through the loads R'A to R'D at the same time. The currents, which have passed through the loads R'A to R'D, flow to low potential supplies VSSA to VSSD. The low potentials VSSA to VSSD are separated from the bias potential VSS–SUB of the wafer 11 via PN junctions (PNJ). In addition, the bias potential VSS–SUB is supplied by the tester 300' from a power supply system different from the power supply system of the low potentials VSSA to VSSD. Thus, ripple of power (VCCA, VSSA) supplied to the chip 1'A, . . . , ripple of power (VCCD, VSSD) supplied to the chip 1'D are independent of one another. This condition is shown in FIG. 37.

Figure 37:
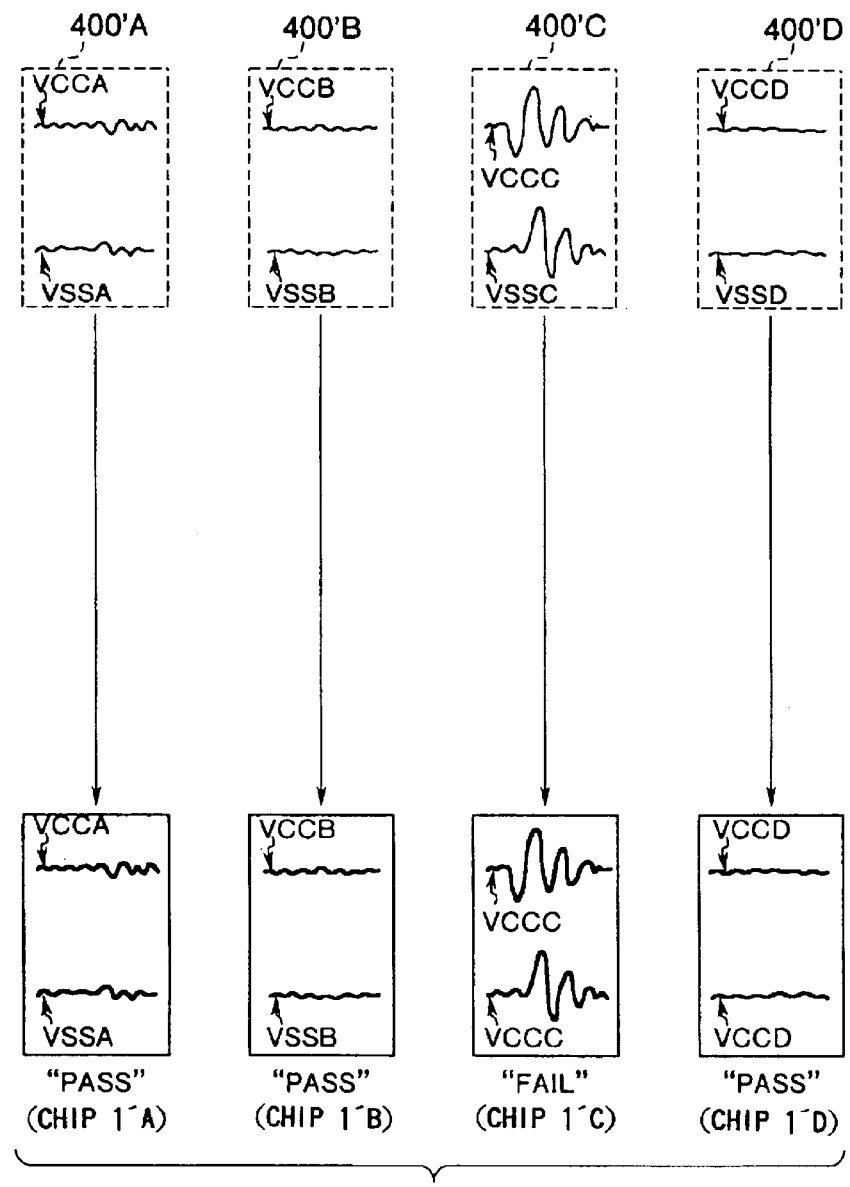
FIG. 37 shows a power ripple of each chip shown in FIG. 35.

FIG. 37 schematically shows the ripples of powers to the respective chips shown in FIG. 35.

In FIG. 37, reference numeral 400'A denotes a ripple of power to the chip 1'A, numeral 400'B a ripple of power to the chip 1'B, numeral 400'C a ripple of power to the chip 1'C, and numeral 400'D a ripple of power to the chip 1'D. When the chips 1'A to 1'D are tested one by one, ripples of powers to the chips 1'A to 1'D will occur, as indicated by reference numerals 400'A to 400'D.

In addition, since the powers (VCCA to VCCD, VSSA to VSSD) of the chips 1'A to 1'D are separated from the bias potential (Vss–SUB) of the wafer 11 by the PN junctions, ripples of powers to the chips 1'A to 1'D will hardly become such as are shown in FIG. 32 even if the chips 1'A to 1'D are tested simultaneously. Accordingly, the ripples of powers to the chips 1'A to 1'D will remain the same, as shown in FIG. 37.

By virtue of these advantages, in the case where the supply voltage has decreased from 5V to 3.3V to 2.5V and, for example, a great ripple has occurred in the power to the chip 1'C due to its own defect, the powers to the other chips 1'A, 1'B and 1'C will scarcely be influenced. It is thus possible to eliminate causes of malfunctions of the chips 1'A, 1'B and 1'D other than the defective chip 1'C, as well as causes of destruction of the chips 1'A, 1'B and 1'C.

Figure 38:
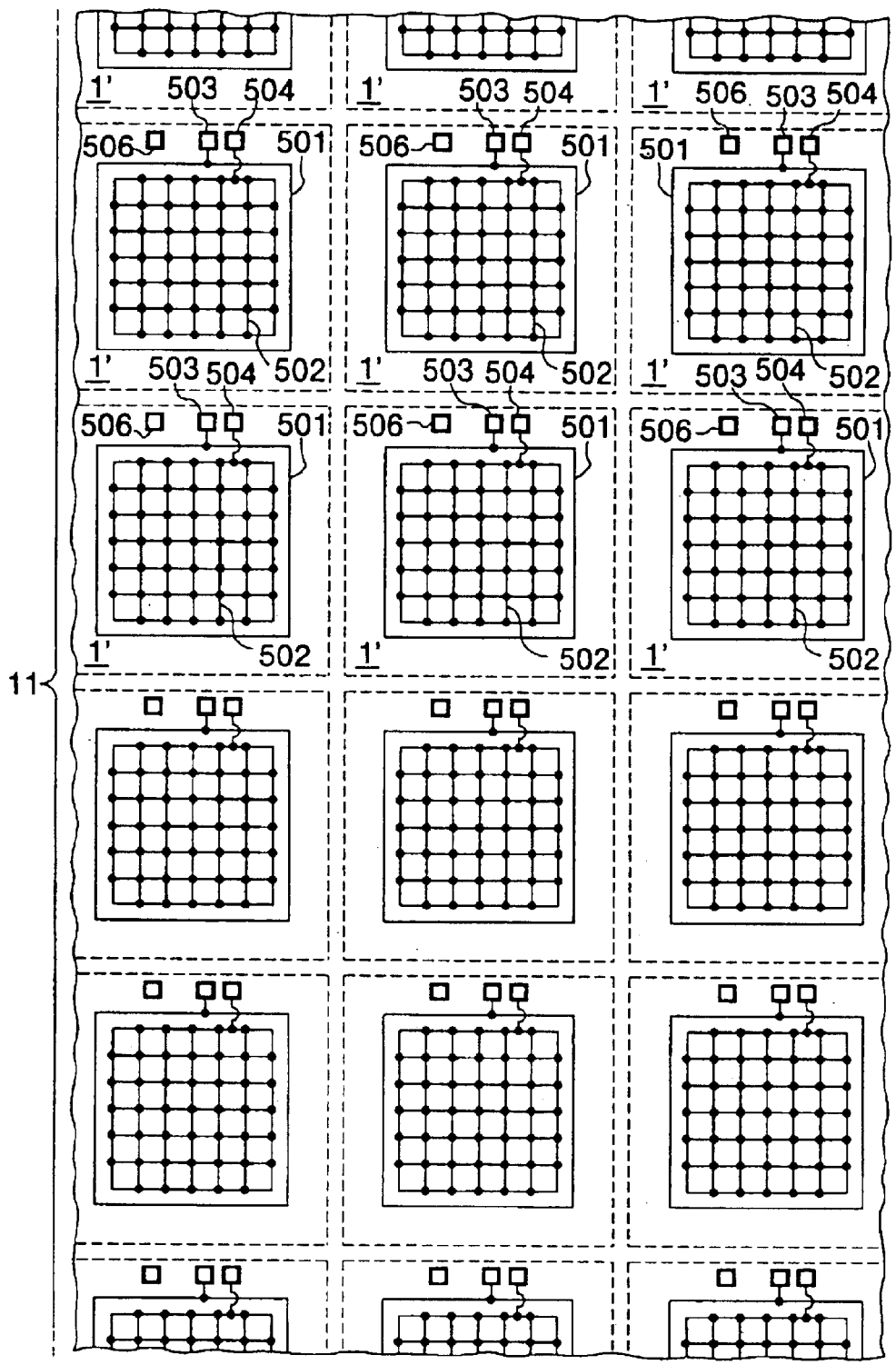
FIG. 38 is a plan view showing the state in which the semiconductor IC device chip according to the 13th embodiment of the invention is formed on the wafer 11.

FIG. 38 is a plan view showing the state in which the semiconductor IC device chip according to the 13th embodiment of the invention is formed on the wafer 11.

In the chip 1' shown in FIG. 38, VSS wiring 502 is formed in a mesh-like manner and VSS–SUB wiring 501 is formed in a loop around the VSS wiring 502. In FIG. 38, VCC wiring 505 is omitted for the purpose of simplification of the drawing.

As is shown in FIG. 38, each of the chips 1' is provided with a pad 503 for supplying potential VSS–SUB, a pad 504 for supplying low potential VSS, and a pad 506 for supplying high potential VCC. The VSS–SUB wiring 501 is separated from the VSS wiring 502 within the chip 1'.

Figure 39:
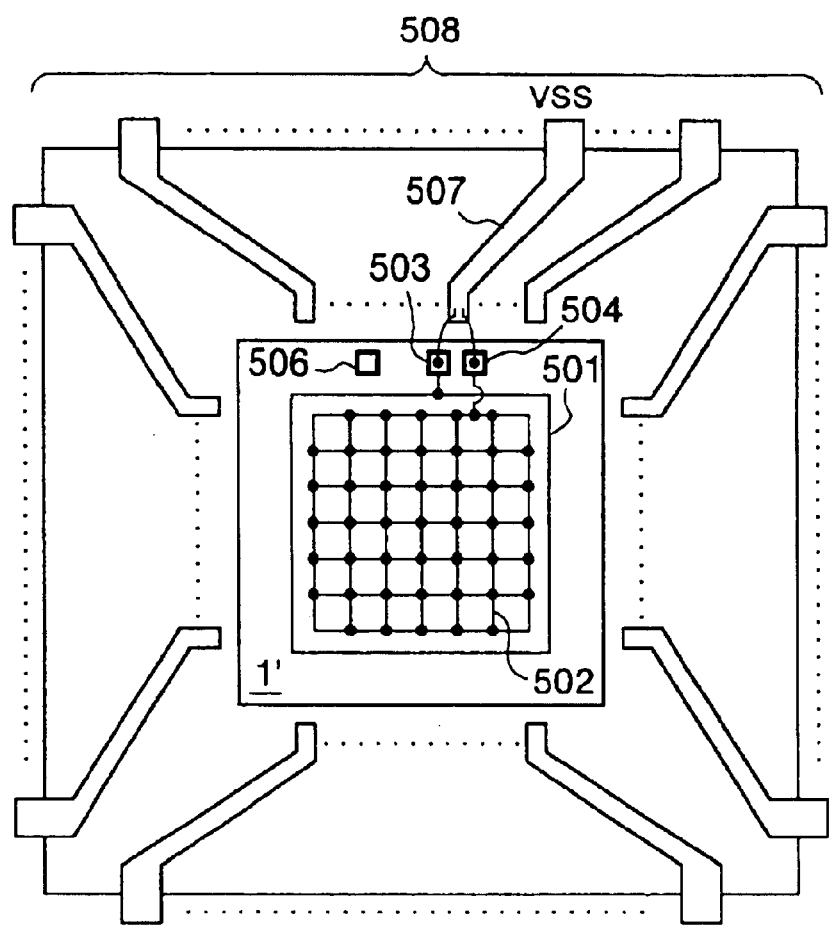
FIG. 39 is a plan view of a packaged chip of the semiconductor IC device according to the 13th embodiment of the invention.

FIG. 39 is a plan view of a packaged chip of the semiconductor IC device according to the 13th embodiment of the invention.

When the chips 1' of the 13th embodiment is to be packaged, the pad 503 for biasing of the substrate and the pad 504 for the power of the 1C are connected to a lead terminal 507. The lead terminal 507 is a terminal for VSS. Accordingly, the potential of each of the low power supplies of the substrate and IC is set at low potential VSS and the substrate is biased to the low potential VSS. The substrate is biased to the potential VSS and the IC operates normally.

The structure shown in FIG. 39 is merely an example. The pads 503 and 504 may be connected to different terminals, and low potential VSS may be supplied via the different terminals.

Figure 40:
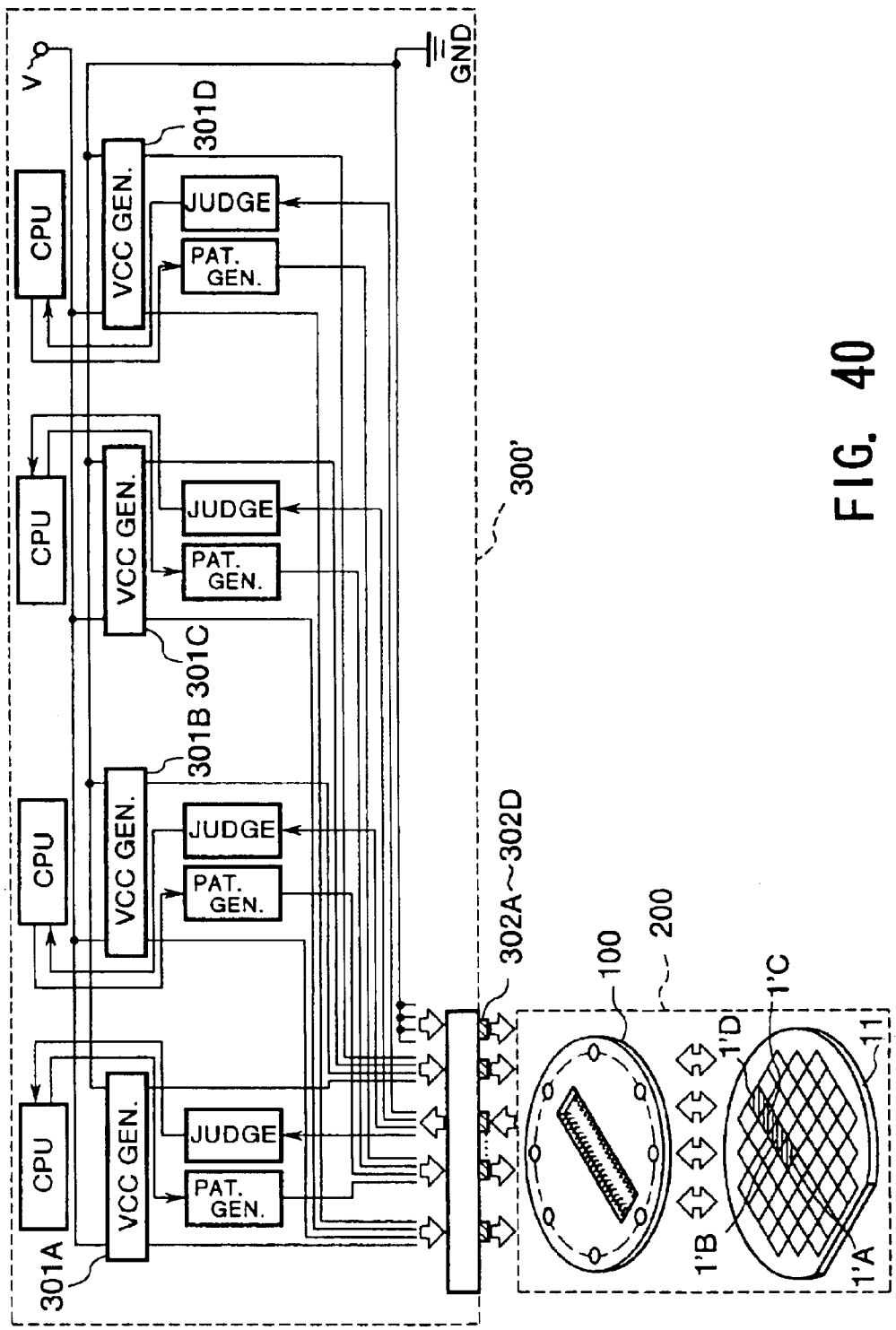
FIG. 40 shows a system configuration of a test system according to a 14th embodiment of the invention.

FIG. 40 shows a system configuration of a test system according to a 14th embodiment of the present invention.

As is shown in FIG. 40, in the test system according to the 14th embodiment, a tester 300' is used and four chips 1'A to 1'D formed on a wafer 11 are tested at the same time. With this system, too, a problem in which a power ripple becomes a high-frequency component can be solved. Accordingly, the test system shown in FIG. 40 can have the same test precision as the per-site type test system shown in FIG. 33 which comprises four test stations 200A to 200D. In addition, as compared to the per-site test system, the number of test stations 200 can be decreased and the amount of facility investment reduced.

If a facility investment is made in an equal level to the per-site test system and, for example, the number of test stations is increased up to the number of test stations of the per-site system, the number of chips which can be tested at a time can be increased. In other words, from the standpoint of the facility investment, the processing performance of the test system of the 14th embodiment is higher than that of the test system of the twelfth embodiment.

As has been described above, in the semiconductor IC device and test system of the 13th and 14th embodiments, even when a plurality of chips formed on a single wafer are tested at a time, the problem of high-frequency components due to power ripple can be solved and a decrease in yield of tested products on the wafer can be prevented.

A 15th embodiment of the invention will now be described.

The 15th embodiment is an improvement of the tester 300' described in the 13th and 14th embodiments, wherein power ripple occurring at the time of a multi-test can be suppressed more surely.

Figure 41:
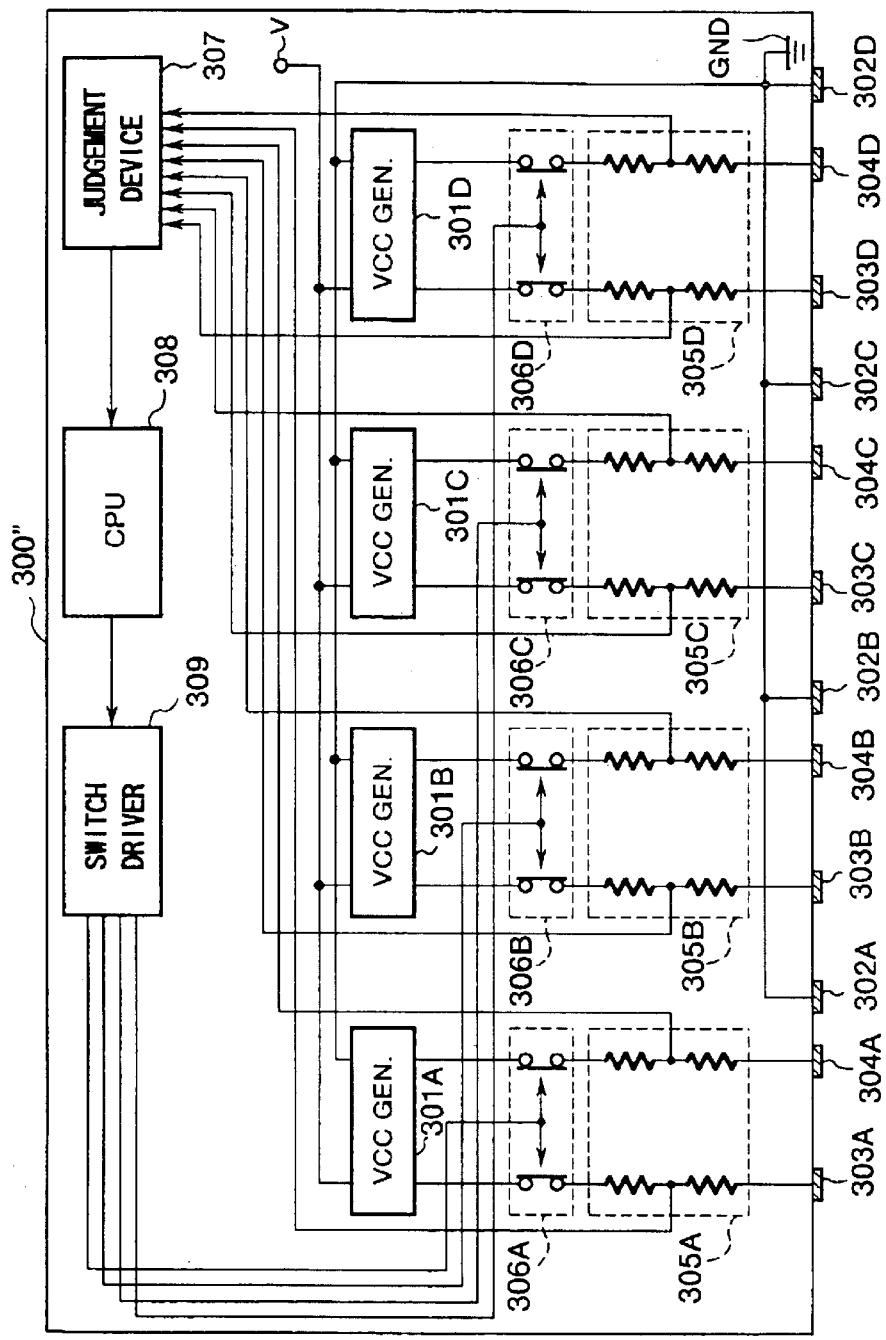
FIG. 41 shows the structure of a tester according to a 15th embodiment of the invention.

FIG. 41 shows the structure of a tester according be to the 15th embodiment. FIG. 41 shows the power supply system alone.

As is shown in FIG. 41, a tester 300" has VCC generators 301A to 301D associated with the respective chips. The VCC generator 301A supplies high potential VCCA to the chip 1'A (not shown) via a high potential power terminal 303A, and supplies low potential VSSA to the chip 1'A via a low potential power terminal 304A. Similarly, the VCC generator 301B supplies high potential VCCB to the chip 1'B (not shown) via a high potential power terminal 303B, and supplies low potential VSSB to the chip 1'B via a low potential power terminal 304B. The VCC generator 301C supplies high potential VCCC to the chip 1'C (not shown) via a high potential power terminal 303C, and supplies low potential VSSC to the chip 1'C via a low potential power terminal 304C. The VCC generator 301D supplies high potential VCCD to the chips 1'D (not shown) via a high potential power terminal 303D, and supplies low potential VSSD to the chips 1'D via a low potential power terminal 304D.

The tester 300" includes power voltage detectors 305A to 305D and shut-off switches 306A to 306D, which are provided between the VCC generators 301A to 301D and the power terminals 303A to 303D and 304A to 3040. In addition, the tester 300" includes a detection voltage determination device (judgement device) 307 for determining whether detected voltages detected by the detectors 305A to 305D fall within a normal range, and switch drivers 309 for driving the shut-off switches 306A to 306D.

The operation of the tester 300" will now be described.

The detectors 305A to 305D detect variations in power voltages to the chips 1'A to 1'D while the chips 1'A to 1'D are being operated. The voltages detected by the detectors 305A to 305D are sent to the detected voltage determination device 307. The detected voltage determination device 307 determines whether the variations in power voltages to the chips 1'A to 1'D fall within the normal range. If it is determined that the variation in voltage falls out of the normal range, the determination device 307 outputs to the CPU 308 a signal representing the chip in which the variation in voltage outside the normal range has occurred. Suppose that a voltage variation without the normal range has occurred in the chip 1'C. In this case, the determination device 307 outputs to the CPU 308 a signal indicating that a voltage variation outside the normal range has occurred in the chip 1'C. The CPU 308 outputs to the switch driver 309 a command (signal) to shut off the power to the chip 1'C. The switch driver 309 drives the shut-off switch 306C to shut off the power line for supplying a power voltage to the chip 1'C. The driven shut-off switch 306C cuts off the connection between the VCC generator 301C and power terminals 303C and 304C. As a result, no power is supplied to the chip 1'C in which the voltage variation without the normal range has occurred, and the operation of the chip 1'C is stopped.

According to the tester 300", when a great ripple has occurred in the chip 1'C among the simultaneously tested chips, for example, as shown in FIG. 37, the operation of the chip 1'C can be stopped. Thus, power ripples in the other chips 1'A, 1'B and 1'D can be further decreased.

This tester 300" capable of further decreasing power ripples can enhance its own test precision through the above operation, for example, in an IDDQ (static current measurement in a functional test) in which precision, among the other test items of semiconductor IC devices, is required.

A description will now be given of 16th, 17th, 18th and 19th embodiments of the present invention.

The chip according to the 13th embodiment is applied to a semiconductor IC device (system-on-silicon technique) wherein a desired semiconductor device system constituted by a combination of a processor, an SRAM, a DRAM and a flash-EEPROM is integrated in one chip. However, the chip according to the 13th embodiment, i.e. the chip with enhanced test precision in a multi-test, is applicable not only to the system-on-silicon technique, but also to a product with a single function such as a processor chip, an SRAM chip, a DRAM chip, or a flash-EEPROM chip. These products with single functions are interconnected on a circuit board to constitute a desired semiconductor device system.

Typical examples of chips according to the 13th embodiment, which are applied to semiconductor IC devices with single functions, will now be described. First, a processor (16th embodiment) will be described; second, a DRAM (17th embodiment); third, a NAND type flash-EEPROM (18th embodiment); and fourth, a D/A converter (19th embodiment). Needless to say, the chip of the 13th embodiment is applicable to other semiconductor IC devices with single functions, e.g. an SRAM, an analog product, a logic product, etc.

FIGS. 42A and 42B show the processor according to the 16th embodiment of the invention. FIG. 42A is a plan view, and FIG. 42B is a cross-sectional view taken along line 42B—42B in FIG. 42A. In FIGS. 42A and 42B, the circuit configuration of the processor is divided into three blocks: an internal voltage generator 51-2 for generating an internal voltage; logic circuits 52-2 for constituting an arithmetic operation circuit, a register circuit, etc.; I/O circuits 53-2 for outputting a signal processed within the chip and inputting a signal to the chip.

As is shown in FIGS. 42A and 42B, a large N-well 22-2 is formed in a P-type silicon substrate 10. the three circuit blocks constituting the processor, i.e. the internal voltage generator 51-2, logic circuits 52-2 and I/O circuits 53-2, are arranged in the large well 22-2.

High-concentration P+ wells 23A-2 and 23B-2, high-concentration wells 24A-2 and 24B-2 having higher concentrations than the N-well 22-2, and a P-well 25-2 are formed in the N-well 22-2. A high-concentration N+ well 26-2 and a high-concentration P+ well 27-2 having a higher concentration than the P-well 25-2 are formed in the P-well 25-2.

The N-well 22-2 is supplied with external high potential VCC as bias potential. The P-well 25-2 is supplied with external low potential VSS as bias potential.

The internal voltage generator 51-2 comprises an NMOS (not shown) formed in the P+ well 23A-2 and a PMOS (not shown) formed in the N+ well 24A-2. The N+ well 24A-2 is supplied with power VCC as back-gate bias and source potential of the PMOS. The P+ well 23A-2'is supplied with external low potential VSS as back-gate bias and source potential of the NMOS. The internal voltage generator 51-2 is driven by potential difference (VCC–VSS) to produce a predetermined internal potential VDD'.

The logic circuits 52-2 comprise an NMOS (not shown) formed in the P+ well 27-2 and a PMOS (not shown) formed in the N+ well 26-2. The N+ well 26-2 is supplied with internal potential VDD' as back-gate bias and source potential of the PMOS. The P+ well 27-2 is supplied with external low potential VSS as back-gate bias and source potential of the NMOS. The logic circuits 52-2 are driven by potential difference (VDD'-VSS) to perform predetermined arithmetic operations.

The I/O circuits 53-2 comprise an NMOS (not shown) formed in the P+ well 23B-2 and a PMOS (not shown) formed in the N+ well 24B-2. The N+ well 24B-2 is supplied with power VCC as back-gate bias and source potential of the PMOS. The P+ well 23B-2 is supplied with external low potential VSS as back-gate bias and source potential of the NMOS. The I/O circuits 53-2 are driven by potential difference (VCC-VSS) to effect input/output of predetermined signals.

As is shown in FIG. 42A, the power VCC is supplied to a VCC line 505 within the chip via a pad 506. Power VSS is supplied to a VSS line 502 within the chip via a pad 504. A VSS-SUB line 501 for applying a substrate bias potential to the P-type substrate 10 is provided within the chip, separately from the VSS line 502. As is shown in FIG. 42B, power VSS is supplied to the VSS-SUB line 501 via pad 503 during actual use. While the devices formed on the wafer are being tested, a substrate power VSS-SUB, which is different from the power VSS though being equal in potential, is supplied to the VSS-SUB line 501.

This processor, like the chips described in the 13th and 14th embodiments, has, within the chip, a power system for substrate bias and a power system for the IC separately. Accordingly, even if a plurality of chips formed on the wafer are tested at the same time (i.e. subjected to a multi-test), ripple of power to each chip can be reduced. Thus, a multi-test can be performed with high precision, and the yield of tested products on the wafer can be increased.

Figures 43A, 43B:
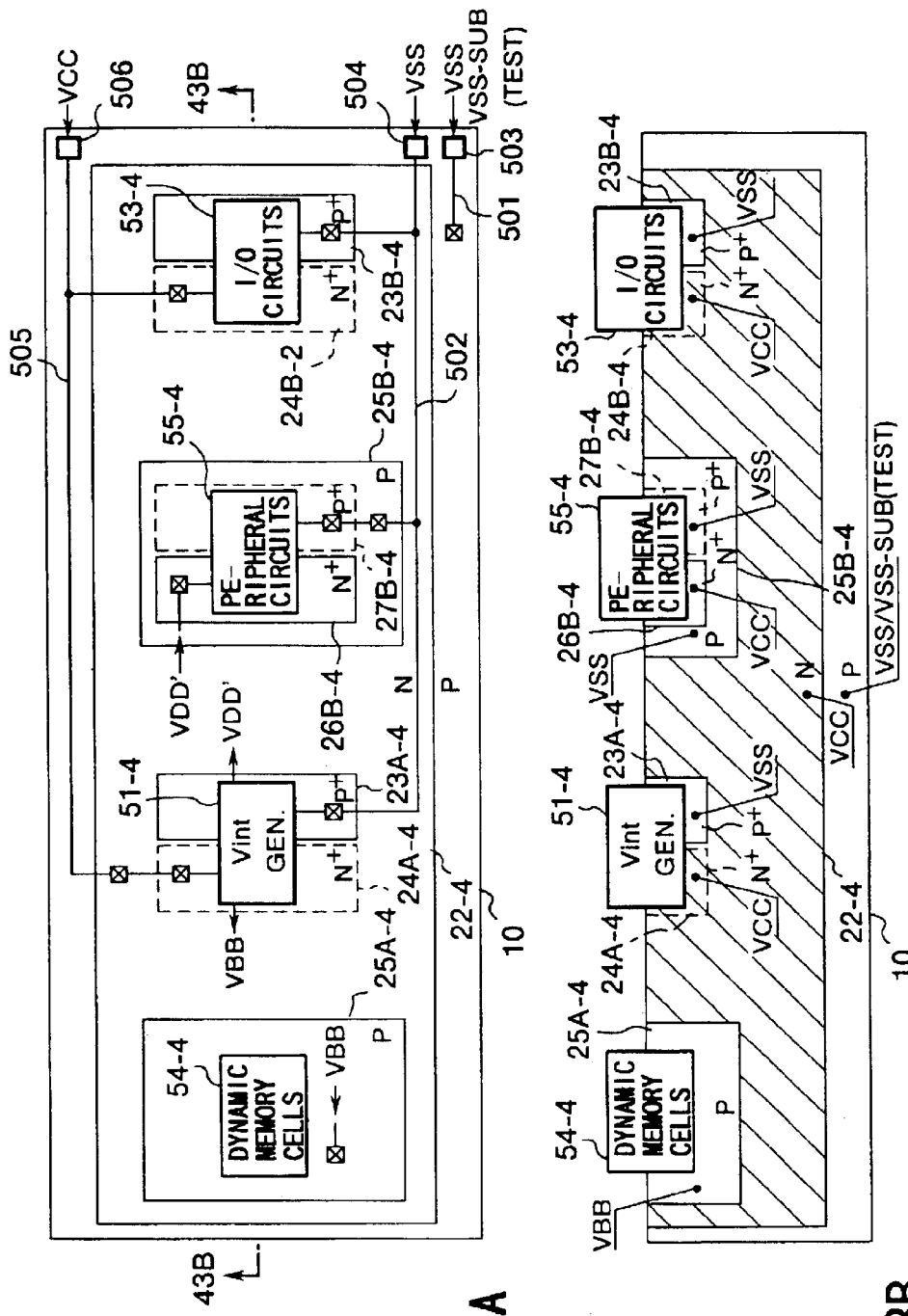
FIG. 43A is a plan view of a semiconductor IC device according to a 17th embodiment of the invention.
FIG. 43B is a cross-sectional view taken along line 43B—43B in FIG. 43A.

FIGS. 43A and 43B show a DRAM according to the 17th embodiment of the invention. FIG. 43A is a plan view, and FIG. 43B is a cross-sectional view taken along line 43B—43B in FIG. 43A. In FIGS. 43A and 43B, the circuit configuration of the DRAM is divided into four blocks: an internal voltage generator 51-4 for generating an internal voltage, memory cells 54-4 for storing information, memory peripheral circuits 55-4 for writing/reading data in/from the memory cells, and I/O circuits 53-4.

As is shown in FIGS. 43A and 43B, a large N-well 22-4 is formed in a P-type silicon substrate 10. The four circuit blocks constituting the DRAM, i.e. the internal voltage generator 51-4, memory cells 54-4, peripheral circuits 55-4 and I/O circuits 53-4, are arranged in the large well 22-4.

High-concentration P+ wells 23A-4 and 23B-4, high-concentration N+ wells 24A-4 and 24B-4, and P-wells 25A-4 and 25B-4 are formed in the N-well 22-4. In addition, a high-concentration N+ well 26B-4 and a high-concentration P+ well 27B-4 are formed in the P-well 25B-4.

The N-well 22-4 is supplied with external high potential VCC as bias potential, like the 16th embodiment. The P-well 25B-2 is supplied with external low potential VSS as bias potential.

The internal voltage generator 51-4 is constituted by an NMOS (not shown) formed in the P+ well 23A-4 and a PMOS (not shown) formed in the N+ well 24A-4. The N+ well 24A-4 is supplied with power VCC as back-gate bias of the PMOS and source potential of the PMOS. The P+ well 23A-4 is supplied with external low potential VSS as back-gate bias and source potential of the NMOS. The internal voltage generator 51-4 is driven by a potential difference (VCC-VSS) to generate a positive internal potential VDD' and a negative internal potential VBB.

A currently available DRAM is provided with internal potentials: potential VPP for boosting and driving word lines (not shown), plate potential VPL applied to a plate electrode of a capacitor, and precharge potential VBL for precharging bit lines (not shown) before reading out data. These internal potentials, however, are omitted in the 17th embodiment. Similarly, peripheral circuits using internal potentials VPP, VPL and VBL are omitted.

The memory cells 54-4 are formed in the P-well 25A-4. The memory cells 54-4 are of dynamic type. The dynamic memory cell 54-4 comprises a capacitor (not shown) for storing information as charge, and an NMOS (transfer transistor, not shown) having a source connected to the capacitor, a drain to the bit line (not shown) and a gate to the word line (not shown). The P-well 25A-4 is supplied with internal negative potential VBB as back-gate bias of the NMOS (transfer transistor).

Each of the peripheral circuits 55-4 is constituted by a combination of an NMOS (not shown) formed in the P+ well 27B-4 and a PMOS (not shown) formed in the N+ well 26B-4. The N+ well 26B-4 is supplied with internal potential VDD' as back-gate bias and source potential of the PMOS. The P+ well 27B-4 is supplied with external low potential VSS as back-gate bias and source potential of the NMOS. The peripheral circuits 55-4 is driven by a potential difference (VDD'-VSS).

Each of the I/O circuits 53-4 comprises a combination of an NMOS (not shown) formed in the P+ well 23B-4 and a PMOS (not shown) formed in the N+ well 24B-4. The N+ well 24B-4 is supplied with power VCC as back-gate bias and source potential of the PMOS. The P+ well 23B-4 is supplied with external low potential VSS as back-gate bias and source potential of the NMOS. The I/O circuits 53-4 are driven by a potential difference (VCC-VSS).

As shown, in particular, in FIG. 43A, like the 16th embodiment, the VSS line 502 for applying power voltage to the DRAM formed in the N-well 22-4 is separated from the VSS-SUB line 501 for applying bias voltage to the P-type substrate 10.

Thus, in the DRAM according to the 17th embodiment, too, the VSS line 502 can be supplied with potential VSS and the VSS-SUB line 501 with potential VSS-SUB in the test of the wafer, as shown in FIG. 43B, in particular.

In the 17th embodiment, like the 16th embodiment, the power VSS to the DRAM formed in the N-well 22-4 and the bias potential VSS-SUB to the P-type substrate can be supplied separately during the test of the wafer. Accordingly, even if a plurality of chips formed on the wafer are tested simultaneously, ripple of power to each chip can be reduced. Therefore, a multi-test can be performed with high precision and the yield in tested products on the wafer improved.

Figure 44A:
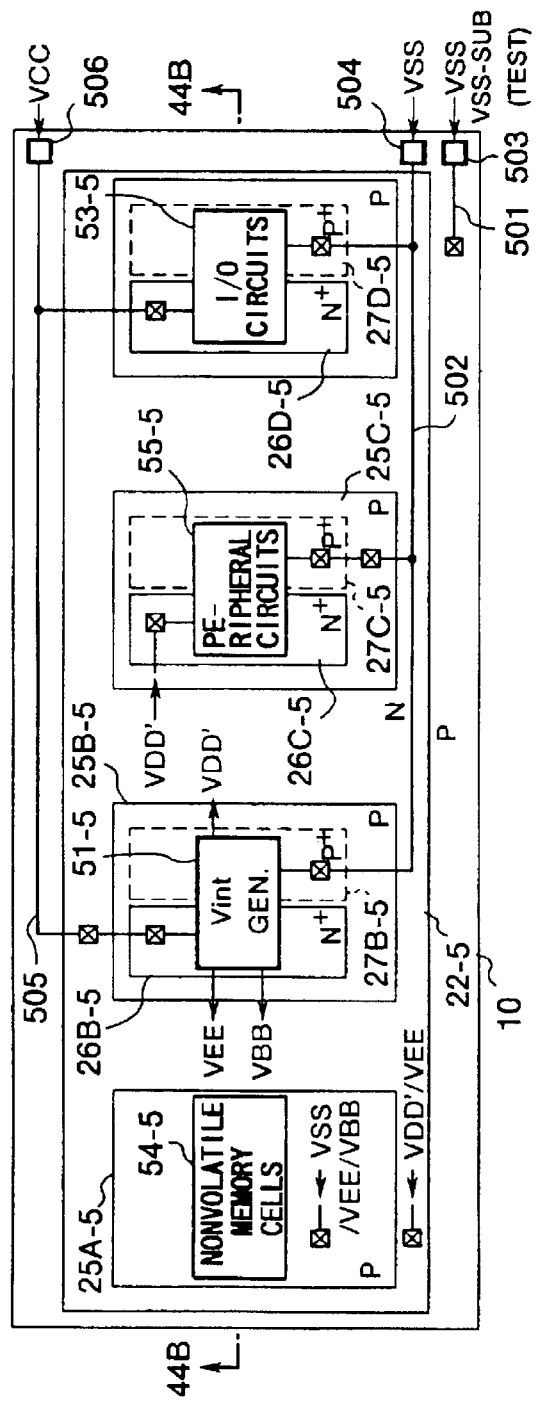
FIG. 44A is a plan view of a semiconductor IC device according to an 18th embodiment of the invention.
Figure 44B:
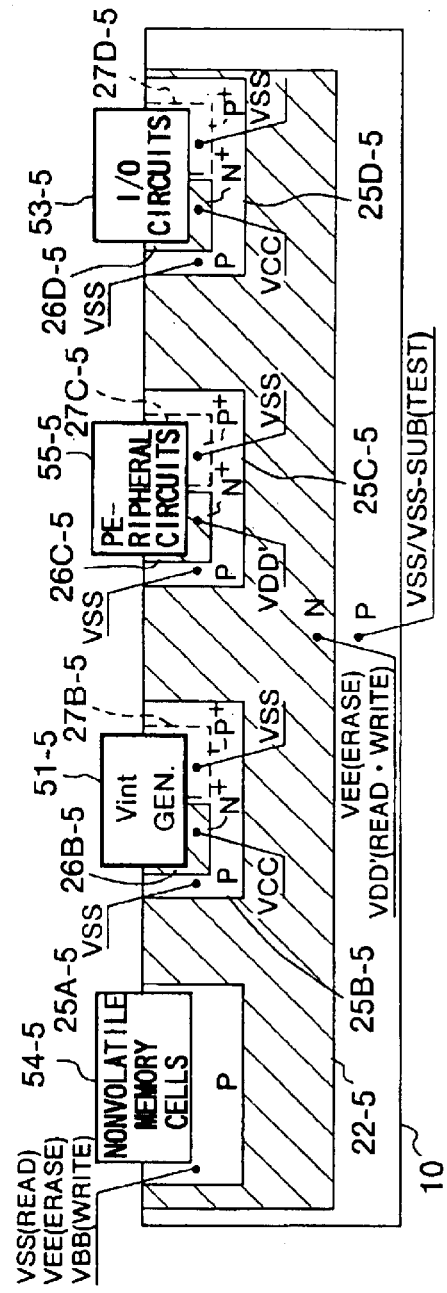
FIG. 44B is a cross-sectional view taken along line 44B—44B in FIG. 44A.

FIGS. 44A and 44B show a flash-EEPROM according to the 18th embodiment of the invention. FIG. 44A is a plan view, and FIG. 44B is a cross-sectional view taken along line 44B—44B in FIG. 44A. In FIGS. 44A and 44B, the circuit configuration of the flash-EEPROM is divided into four blocks: an internal voltage generator 51-5 for generating an internal voltage, memory cells 54-5 for storing information, memory peripheral circuits 55-5 for writing/reading data in/from the memory cells, and I/O circuits 53-5.

As is shown in FIGS. 44A and 44B, a large N-well 22-5 is formed in a P-type silicon substrate 10. The four circuit blocks constituting the EEPROM, i.e. the internal voltage generator 51-5, memory cells 54-5, peripheral circuits 55-5 and I/O circuits 53-5, are arranged in the large well 22-5.

In the N-well 22-5, P-wells 25A-5, 25B-5, 25C-5 and 25D-5 are formed. Of these-P-wells, the P-well 25B-5 includes a high-concentration N+ well 26B-5 and a high-concentration P+ well 27B-5 are formed. Similarly, a high-concentration N+ well 26C-5 and a high-concentration P+ well 27C-5 are formed in the P-well 25C-5, and a high-concentration N+ well 26D-5 and a high-concentration P+ well 27D-5 are formed in the P-well 25D-5.

The bias potential of the N-well 22-5 is switched according to the three basic operational modes of the flash-EEPROM. In a data write mode (WRITE), the power to the N-well 22-5 is biased to external high potential VCC or internal power VDD', as shown in FIGS. 44A and 44B. In a data read-out mode (READ), like the data write mode (WRITE), the N-well 22-5 is biased to external high potential VCC or internal power VDD', as shown in FIGS. 44A and 44B. In a data erase mode (ERASE), the N-well 22-5 is set at a positive potential VEE higher than power VCC.

The P-wells 25B-5, 25C-5 and 25D-5 are biased to external low potential VSS.

The internal voltage generator 51-5 is constituted by an NMOS (not shown) formed in the P+ well 27B-5 and a PMOS (not shown) formed in the N+ well 26B-5. The N+ well 26B-5 is supplied with power VCC as back-gate bias of the PMOS and source potential of the PMOS. The P+ well 27B-5 is supplied with external low potential VSS as back-gate bias and source potential of the NMOS. The internal voltage generator 51-5 is driven by a potential difference (VCC–VSS) to generate a positive internal potential VDD', a positive internal potential VEE higher than the power VCC, and a negative internal potential VBB.

A currently available flash-EEPROM, in particular, a NAND type flash-EEPROM, is provided with internal potentials: potential VPP supplied to a selected word (not shown) in the data write mode, an internal potential of VM, etc. supplied to non-selected word lines in the write mode, and/or external potential. In the 18th embodiment, these potentials are not described. Similarly, peripheral circuits using potentials VPP and VM are omitted.

The memory cells 54-5 are formed in the P-well 25A-5. The memory cells 54-5 are of non-volatile type. The non-volatile memory cell 54-5 comprises a threshold variable transistor which stores information in the form of a threshold voltage. The threshold variable transistor has a floating gate in a gate insulating film. According to the amount of electrons accumulated in the floating gate, the threshold voltage is varied. The memory cells 54-5 have a so-called unit cell structure wherein 8 or 16 threshold-variable transistors are series-connected, and the memory cells 54-5 are of NAND type. The source of the unit cell is connected to a source line (not shown) and the drain thereof to a bit line (not shown).

The bias potential of the P-well 25A-5 is switched according to the three basic operational modes of the flash-EEPROM. In the data write mode (WRITE), the bias potential to the P-well 25A-5 is set at a negative internal potential VBB. In the data read-out mode (READ), the bias potential to the P-well 25A-5 is set at power VSS. In the data erase mode (ERASE), the bias at potential to the P-well 25A-5 is set at potential VEE.

Each of the peripheral circuits 55-5 is constituted by a combination of an NMOS (not shown) formed in the P+ well 27C-5 and a PMOS (not shown) formed in the N+ well 26C-5. The N+ well 26C-5 is supplied with internal potential VDD' as back-gate bias and source potential of the PMOS. The P+ well 27C-5 is supplied with external low potential VSS as back-gate bias and source potential of the NMOS. The peripheral circuits 55-5 is driven by a potential difference (VDD'–VSS).

Each of the I/O circuits 53-5 comprises a combination of an NMOS (not shown) formed in the P+ well 27D-5 and a PMOS (not shown) formed in the N+ well 26D-5. The N+ well 26D-5 is supplied with power VCC as back-gate bias and source potential of the PMOS. The P+ well 27B-5 is supplied with external low potential VSS as back-gate bias and source potential of the NMOS. The I/O circuits 53-5 are driven by a potential difference (VCC–VSS).

As shown, in particular, in FIG. 44A, like the 16th and 17th embodiments, the VSS line 502 for applying power voltage to the flash-EEPROM formed in the N-well 22-5 is separated from the VSS–SUB line 501 for applying bias voltage to the P-type substrate 10.

Thus, in the flash-EEPROM according to the 18th embodiment, like the 16th and 17th embodiments, the VSS line 502 can be supplied with potential VSS and the VSS–SUB line 501 with potential VSS–SUB in the test of the wafer, as shown in FIG. 44B, in particular.

Accordingly, the power VSS to the flash-EEPROM and the bias potential VSS–SUB to the P-type substrate 10 can be supplied separately during the test of the wafer. Therefore, a multi-test can be performed with high precision and the yield in tested products on the wafer improved.

FIGS. 45A and 45B show a D/A converter according to the 19th embodiment of the invention. FIG. 45A is a plan view, and FIG. 45B is a cross-sectional view taken along line 45B—45B in FIG. 45A. In FIGS. 45A and 45B, the circuit configuration of the D/A converter is divided into four blocks: an internal voltage generator 51-6 for generating an internal voltage, analog circuits 56-6, digital circuits 57-6 and I/O circuits 53-6.

As is shown in FIGS. 45A and 45B, a large N-well 22-6 is formed in a P-type silicon substrate 10. The four circuit blocks constituting the D/A converter, i.e. the internal voltage generator 51-6, analog circuits 56-6, digital circuits 57-6 and I/O circuits 53-6.

In the N-well 22-6, high-concentration P+ wells 23A-6 and 23B-6, high-concentration N+ wells 24A-6 and 24B-6, and P-wells 25A-6 and 25B-6 are formed. Similarly, a high-concentration N+ well 26A-6 and a high-concentration P+ well 27A-6 are formed in the P-well 25A-6, and a high-concentration N+ well 26B-6 and a high-concentration P+ well 27B-6 are formed in the P-well 25B-6.

The N-well 22-6 is supplied with external high potential VCC as bias potential. The P-wells 25A-6 and 25B-6 are supplied with external low potential VSS as bias potential.

The internal voltage generator 51-6 is constituted by an NMOS (not shown) formed in the P+ well 23A-6 and a PMOS (not shown) formed in the N+ well 24A-6. The N+ well 24A-6 is supplied with power VCC as back-gate bias of the PMOS and source potential of the PMOS. The P+ well 23A-6 is supplied with external low potential VSS as back-gate bias and source potential of the NMOS. The internal voltage generator 51-6 is driven by a potential difference (VCC–VSS) to generate an internal potential VDD' for analog circuits and an internal potential VDD" for digital circuits.

Each of the analog circuits 56-6 is constituted by an NMOS (not shown) formed in the P+ well 27A-6 and a PMOS (not shown) formed in the N+ well 26A-6. The N+ well 26A-6 is supplied with internal potential VDD' as back-gate bias and source potential of the PMOS. The P+ well 27A-6 is supplied with external low potential VSS as back-gate bias and source potential of the NMOS. The analog circuits 56-6 are driven by a potential difference (VDD'–VSS).

Each of the digital circuits 57-6 is constituted by an NMOS (not shown) formed in the P+ well 27B-6 and a PMOS (not shown) formed in the N+ well 26B-6. The N+ well 26B-6 is supplied with internal potential VDD' as back-gate bias and source potential of the PMOS. The P+ well 27B-6 is supplied with external low potential VSS as back-gate bias and source potential of the NMOS. The digital circuits 57-6 are driven by a potential difference (VDD"–VSS).

Each of the I/O circuits 53-6 comprises a combination of an NMOS (not shown) formed in the P+ well 23B-6 and a PMOS (not shown) formed in the N+ well 24B-6. The N+ well 24B-6 is supplied with power VCC as back-gate bias and source potential of the PMOS. The P+ well 23B-6 is supplied with external low potential VSS as back-gate bias and source potential of the NMOS. The I/O circuits 53-6 are driven by a potential difference (VCC–VSS).

As shown, in particular, in FIG. 45A, like the 16th to 18th embodiments, the VSS line 502 for applying power voltage to the D/A converter formed in the N-well 22-6 is separated from the VSS–SUB line 501 for applying bias voltage to the P-type substrate 10.

Thus, in the D/A converter according to the 19th embodiment, like the 16th and 18th embodiments, the VSS line 502 can be supplied with potential VSS and the VSS–SUB line 501 with potential VSS–SUB in the test of the wafer, as shown in FIG. 45B, in particular.

Accordingly, the power VSS to the D/A converter and the bias potential VSS–SUB to the P-type substrate 10 can be supplied separately during the test of the wafer. Therefore, a multi-test can be performed with high precision and the yield in tested products on the wafer improved.

A 20th embodiment of the present invention will now be described.

The 20th embodiment aims at providing a semiconductor IC device, wherein even if a plurality of chips formed on a single wafer are tested simultaneously, ripple of the power can be reduced and a test can be performed with higher precision.

Of the circuit blocks constituting the IC, the I/O circuit block is supplied with power in which greatest ripple will occur. In particular, the output circuit in the I/O circuits directly drives an external terminal (e.g. a lead terminal shown in FIG. 39) of the semiconductor IC device. Specifically, the output circuit supplies a current to the external terminal from the VCC line in the chip (e.g. VCC line 505 shown in FIG. 42A) and charges the external terminal. Alternatively, a current is let to flow from the external terminal to the VCC line (e.g. VSS line 502 shown in FIG. 42A) in the chip, thus discharging the external terminal. In particular, the capacity of the external terminal is greater than that of the internal wiring of the IC. Thus, a decrease in potential of the VCC line, which occurs when the output circuit drives the external terminal, or an increase in potential of the VSS line is much greater than in the case of driving the internal circuit. As a result, ripple of power appearing at the VCC pad 506 and VSS pad 504 shown in, e.g. FIG. 42A increases.

In the 20th embodiment, attention is paid to this problem. The 20th embodiment aims at decreasing the ripple of power appearing at the VCC pad 506 and VSS pad 504.

Figures 46A, 46B:
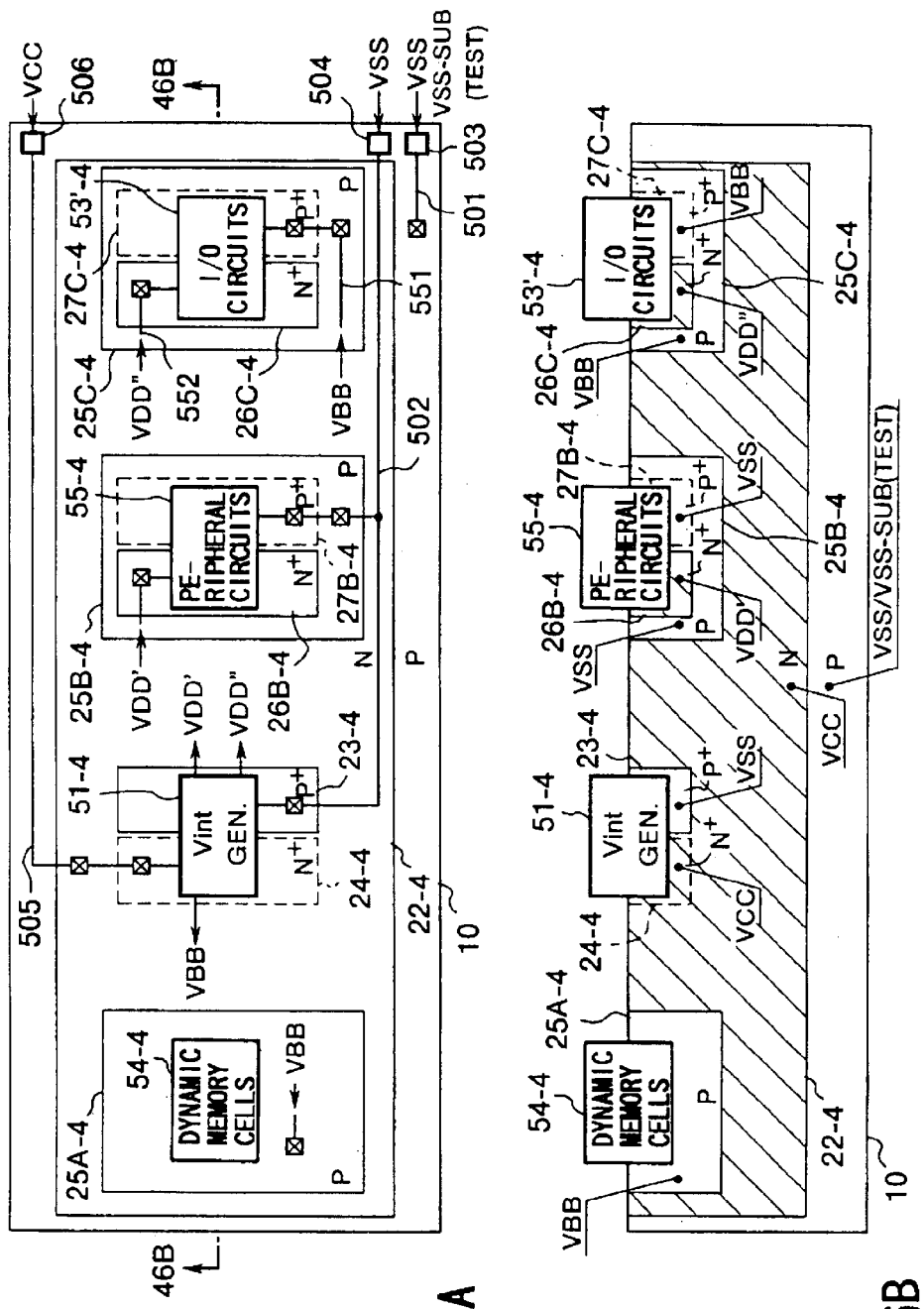
FIG. 46A is a plan view of a semiconductor IC device according to a 20th embodiment of the invention.
FIG. 46B is a cross-sectional view taken along line 46B—46B in FIG. 46A.

A DRAM according to the 20th embodiment will now be described;

FIGS. 46A and 46B show the DRAM according to the 20th embodiment of the invention. FIG. 46A is a plan view and FIG. 46B is a cross-sectional view taken along line 46B—46B in FIG. 46A. In FIGS. 46A and 46B, the structural elements common to those in FIGS. 42A and 42B are denoted by like reference numerals, and different elements alone will be described.

As is shown in FIGS. 46A and 46B, the DRAM according to the 20th embodiment differs from the DRAM according to the 17th embodiment with respect to I/O circuits 53'-4. The I/O circuits 53'-4 are formed in the P-well 25C-4 formed in the N-well 22-4. A bias potential to the P-well 25C-4 is applied not from the VSS line 502 but from another power line. In the DRAM shown in FIGS. 46A and 46B, the bias potential to the P-well 25C-4 is applied from a line 551 of negative internal potential VBB as the other power line. The negative internal potential VBB is generated by the internal potential generator 51-4 and supplied to the P-well 25C-4 via the line 551. The power VSS may be substituted. In this case, it is desirable that a VSS–WELL line be provided in the chip, in addition to the VSS line 502 and VSS–SUB line 501, and that potentials of different VSS levels be applied to the VSS line 502, VSS–SUB line 501 and VSS–WELL line during the test.

A high-concentration N+ well 26C-4 and a high-concentration P+ well 27C-4 are formed in the P-well 25C-4.

Each of the I/O circuits 53'-4 comprises a combination of an NMOS (not shown) formed in the P+ well 27C-4 and a PMOS (not shown) formed in the N+ well 26C-4. The N+ well 26C-4 is supplied with a positive internal potential VCC as back-gate bias and source potential of the PMOS. A positive internal potential VDD" is generated by the internal potential generator 51-4 and applied to the N+ well 26C-4 via a line 552 different from the VCC line 505. The P+ well 27C-4 is supplied with a negative internal potential VBB as back-gate bias and source potential of the NMOS. The I/O circuits 53-4 are driven by a potential difference (VDD"–VBB).

In the DRAM, when the output circuit, in particular, of the I/O circuits 53'-4 charges an external terminal (not shown), an electric current is let to flow to the external terminal from the line 552 different from the VCC line 505. When the external terminal is discharged, a current is let to flow to the line 551 different from the VSS line 502. Accordingly, the charge/discharge current does not directly flow from the VCC line 505 or to the VSS line 502. Thus, the problem of the decrease in potential of the VCC line, which occurs when the output circuit of I/O circuits 53'-4 drives the external terminal, or of the increase in potential of the VSS line is solved and the ripple of power appearing at the VCC pad 506 and VCC pad 504 is decreased.

Since ripple of small power, which occurs due to the operation of the chip, can be further decreased, a plurality of chips formed on a single wafer can be tested at a time with higher precision.

Needless to say, the I/O circuits in the semiconductor IC device according to the 20th embodiment is applicable not only to the DRAM but also to various semiconductor IC devices, such as a processor, a flash-EEPROM, a D/A converter and an SRAM, which are currently available.

A 21st embodiment of the present invention will now be described.

In the 21st embodiment, the semiconductor IC device according to the 20th embodiment is applied to a semiconductor IC device fabricated on the basis of system-on-silicon techniques.

Figure 47:
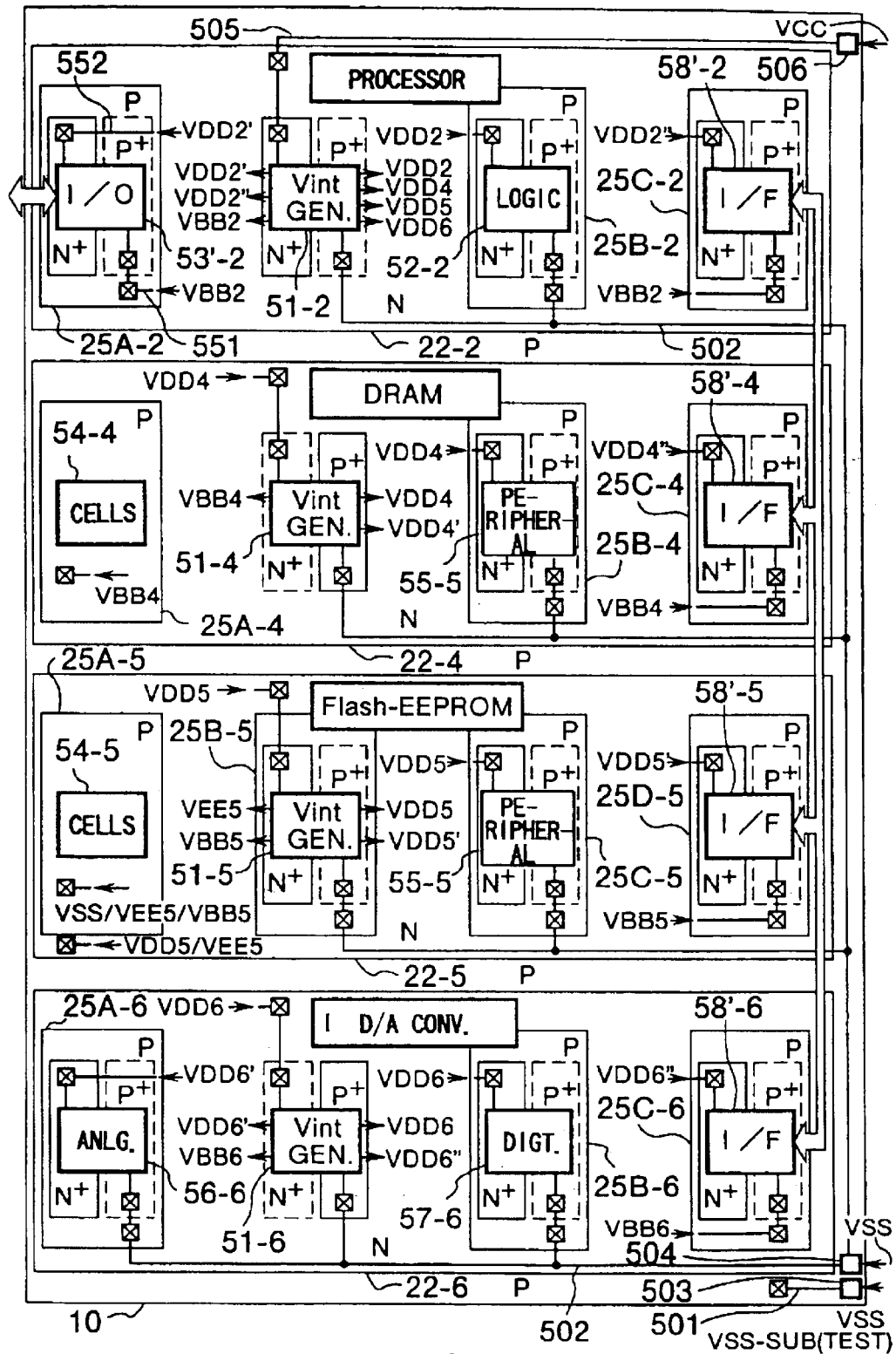
FIG. 47 is a plan view of a semiconductor IC device according to a 21st embodiment of the invention.

FIG. 47 is a plan view of the semiconductor IC device according to the 21st embodiment. In FIG. 47, the structural elements common to those in FIGS. 42A and 42B through FIGS. 46A and 46B are denoted by like reference numerals, and different elements alone will be described.

As is shown in FIG. 47, in the semiconductor IC device according to the 21st embodiment, the semiconductor device system comprising the processor, DRAM, flash-EEPROM and D/A converter, as described in the 16th to 19th embodiments, is integrated on single substrate 10 (hereinafter referred to as "1-chip hybrid semiconductor IC device").

The I/O circuits described in the 20th embodiment are used as I/O circuits of the 1-chip hybrid semiconductor IC device.

The I/O circuits 53'-2 are disposed in the processor block, or one of the four functional blocks. A P-well 25A-2 is formed in the N-well 22-2 in which the processor is formed. The I/O circuits 53'-2 are formed in the P-well 25A-2. A bias potential to the P-well 25A-2 is supplied not from the VSS line 502 but from another line. In the semiconductor IC device shown in FIG. 47, the bias potential is supplied from a line 551 of negative internal potential VBB as the other power line. The negative internal potential VBB is generated by the internal potential generator 51-2 and applied to the P-well 25A-2 via the line 551.

The I/O circuits 53'-2 are the same as the I/O circuits 53'-4 which have been described in detail with reference to FIGS. 46A and 46B.

In this 1-chip hybrid semiconductor IC device, like the 20th embodiment, when the output circuit, in particular, of the I/O circuits 53'-2 charges an external terminal, an electric current is let to flow to the external terminal from the line 552 different from the VCC line 505. When the external terminal is to be discharged, a current is let to flow to the line 551 different from the VSS line 502. Accordingly, ripple of small power, which occurs due to the operation of the chip, can be further decreased, and a plurality of chips formed on a single wafer can be tested at a time with higher precision.

Tests of the 1-chip hybrid semiconductor IC device includes a test of the entire chip and a test of each functional block, as mentioned above. The precision in tests should be enhanced not only in the test of the entire chip, but also in the test of each functional block.

In 1-chip hybrid semiconductor IC devices, the functional blocks are often connected to one another via an interface circuit (I/F circuit) formed within the chip. In this case, the structure of the I/F circuit may be the same as that of each of the I/O circuits 53-2, 53-4, 53-5 and 53-6 shown in FIGS. 42A and 42B to 45A and 45B. However, it is expected that there is an influence of power ripple caused by each functional block.

In consideration of these circumstances, the power supplies for the I/F circuits 58'-2, 58'-4, 58'-5 and 58'-6 are separated from VCC line 505 and VSS line 502, like the structures of the I/O circuits 53'-2 and 53'-4. Thereby, ripple of power produced from each functional block can be reduced.

Accordingly, small power ripple resulting from the operation of each functional block can be further reduced. The functional blocks on chips formed on a single wafer can be tested at a time with high precision.

A 22nd embodiment of the present invention will now be described.

The 22nd embodiment of the invention relates to a semiconductor IC device having I/O circuits matching with power voltages VCC of different levels.

Currently available semiconductor products include those with power voltage VCC of 5V and those with power voltage VCC of 3.3V, such as high-integration memories, e.g. 64 MDAMS.

In a semiconductor device system comprising these semiconductor products, products with different power voltage levels are formed in a hybrid manner on a single circuit substrate, as a matter of course. In the system constituted by combining products with different power voltage levels in a hybrid manner, an interface circuit is mounted to interconnect these products. The products with different power voltage levels are interconnected on the circuit substrate via the interface circuit.

This system, however, has the following problems due to the provision of the interface circuit: 1) difficulty in reducing the size of the circuit substrate, 2) a delay in transmission of signals since the signals (data) are transmitted via the interface circuit, and 3) a rise in cost of the system itself due to the provision of the interface circuit.

In a principal technique currently adopted to solve these problems, a chip is provided with an interface function. In brief, the operational voltage of the I/O circuits is switched from 5V (VCCA[5V])–VSS[0V]) to (VCCB[3.3V]–VSS [0V]). In these I/O circuits, when the operational voltage of the I/O circuits is 5V, the output amplitude is about 5V; when the operational voltage is 3.3V, the output amplitude is about 3.3V.

In the semiconductor product having such I/O circuits, the output amplitude of the I/O circuits is 5V or 3.3V. Thus, the semiconductor product can be connected to a product with, power voltage of 5V or to a product with power voltage of 3.3V without using an interface circuit.

The above product, however, has a problem in that input/output characteristics slightly vary between a case where the operational voltage of the I/O circuits is 5V and a case where the operational voltage of the I/O circuits is 3.3V. In the present condition in which supply voltages 5V and 3.3V are connected via an interface, such a slight variation in input/output characteristics is ignorable. However, even such a slight variation cannot be ignored in future when supply voltages 3.3V and 2.5V are connected via an interface. If the supply voltage lowers than the present level, an operational voltage margin of the semiconductor IC device will be narrowed.

In addition, it is expected that the data transfer speed within the system will be further increased from the present level. If the data transfer speed is increased, the specifications on input/output characteristics will become stricter.

Under the circumstances, the 22nd embodiment provides a semiconductor I/C device having I/O circuits matching with supply voltages VCC of different levels, wherein the output characteristics of the I/O circuits can be made substantially uniform with no deterioration.

Figure 48A:
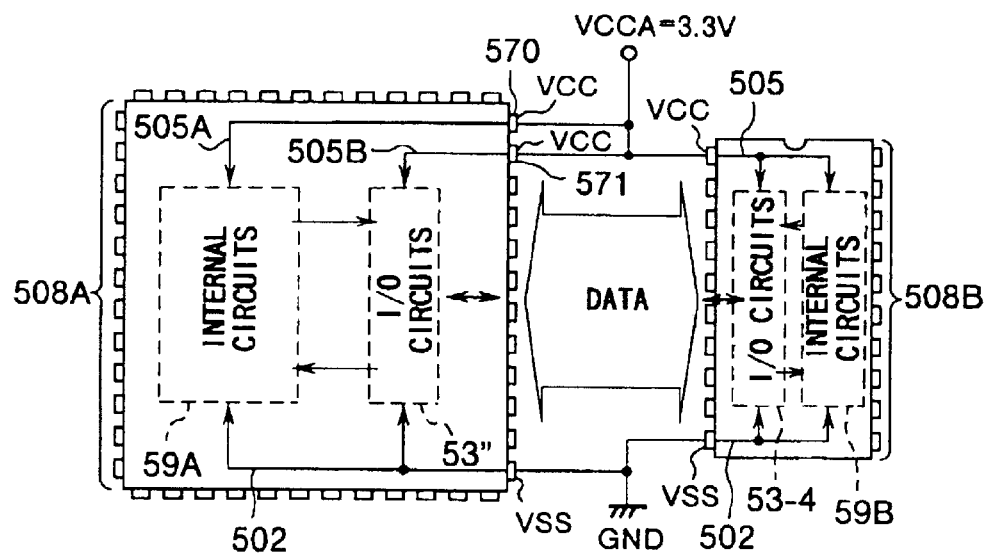
FIG. 48A schematically shows a system constituted by using a semiconductor IC device according to a 22nd embodiment of the invention, wherein products with equal power voltage levels are connected.
Figure 48B:
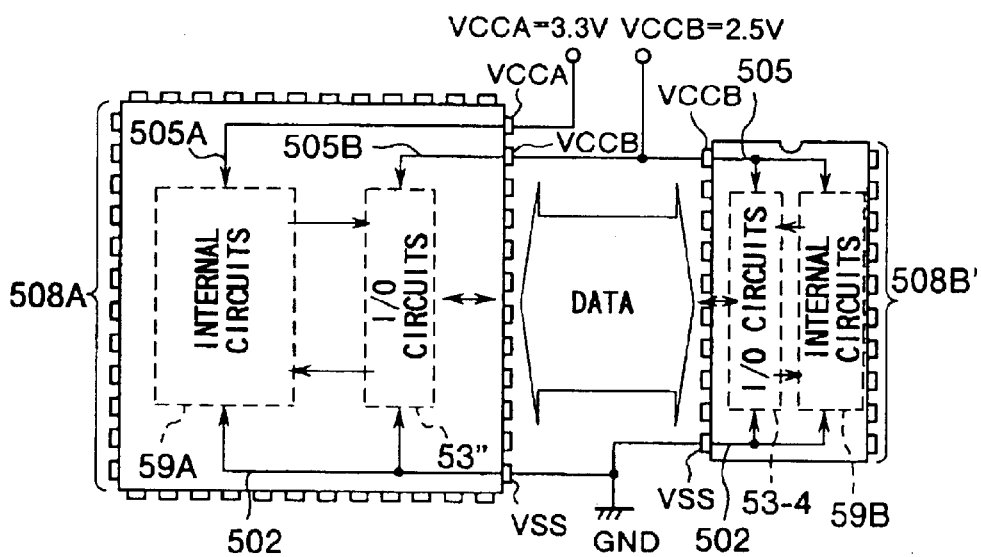
FIG. 48B schematically shows a system constituted by using the semiconductor IC device according to the 22nd embodiment of the invention, wherein products with different power voltage levels are connected.

FIGS. 48A and 48B schematically show systems constituted by using the semiconductor IC device according to the 22nd embodiment of the invention. FIG. 48A shows a system wherein products with equal power voltage levels are connected, and FIG. 48B shows a system wherein products with different power voltage levels are connected.

The system shown in FIG. 48A comprises a processor 508A and a DRAM 508B which the processor 508A uses as a memory. The power voltages for the processor 508A and DRAM 508B are 3.3V (VCC=3.3V, VSS=0V), respectively.

The chip of the DRAM 508B comprises I/0 circuits 53-4 and internal circuits 59B. The internal circuits 59B include the internal potential generator 51-4, memory cells 54-4 and peripheral circuits 55-5, as shown in FIGS. 43A and 43B. The I/O circuits 53-4 and internal circuits 59B are supplied with high potential VCC via VCC line 505.

The chip of the processor 508A comprises the I/O circuits 53" according to the 22nd embodiment and the internal circuits 59A. The internal circuits 59A includes internal potential generator 51-2 and logic circuits 52-2 as shown in, e.g. FIGS. 42A and 42B. The internal circuits 59A are supplied with high potential VCC via VCC line 505A. The I/O circuits 53" are supplied with high potential VCC via VCC line 505B different from VCC line 505A. The VCC line 505A is connected to an external power terminal 570, and the VCC line 505B is connected to an external power terminal 571 different from the external power terminal 570.

When the supply voltage to the DRAM 508B is 2.5V (VCCB=2.5V, VSS=0V), as shown in FIG. 48B, the I/O circuits 53" of processor 508A are supplied with high potential VCCB(2.5V) via VCC line 505B different from VCC line 505A. The internal circuits 59A are supplied with high potential VCCA(3.3V) via VCC line 505A.

Specific circuit configuration and circuit elements of the I/O circuits 53" will now be described.

Figure 49A:
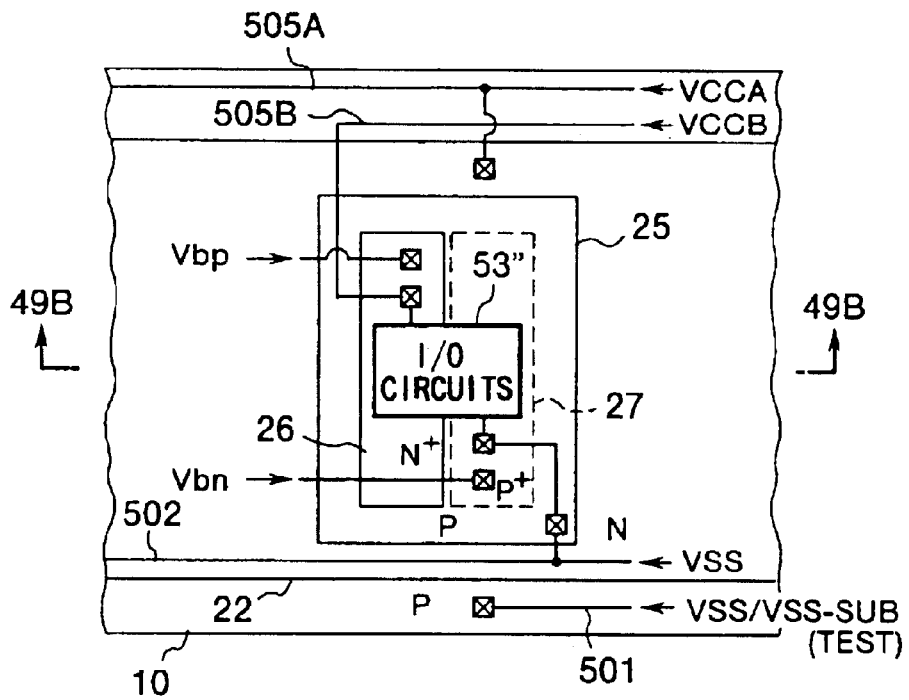
FIG. 49A is a plan view of a semiconductor IC device according to a 22nd embodiment of the invention.
Figure 49B:
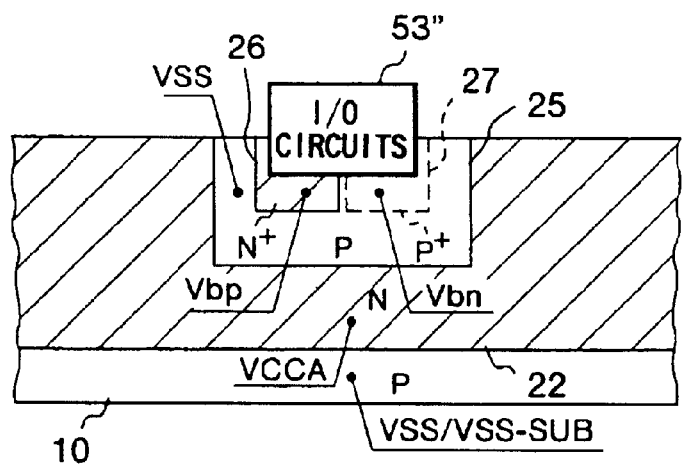
FIG. 49B is a cross-sectional view taken along line 49B—49B in FIG. 49A.

FIGS. 49A and 49B show the semiconductor IC device according to the 22nd embodiment of the invention. FIG. 49A is a plan view and FIG. 49B is a cross-sectional view taken along line 49B—49B in FIG. 49A. FIGS. 49A and 49B show only a region near the I/O circuits 53".

As is shown in FIGS. 49A and 49B, a large N-well 22 is formed in a P-type silicon substrate 10. I/O circuits 53" and internal circuits (not shown) are arranged within the large N-well 22.

A P-well 25 is formed in the N-well 22. A high-concentration N+ well 26 and a high-concentration P+ well 27 are formed in the P-well 25.

The N-well 22 is supplied with external high potential power VCCA as bias potential. The P-well 25 is supplied with external low potential power VSS as bias potential.

The I/O circuits 53" is constituted by an NMOS (not shown) formed in the P+ well 27 and a PMOS (not shown) formed in the N+ well 26. The N+ well 26 is supplied with potential Vbp as back-gate bias of the PMOS. The P+ well 27 is supplied with potential Vbn as backgate bias of the NMOS. The I/O circuits 53", are driven by potential difference (VDDB–VSS).

The potentials Vbp and Vbn have values which vary between a case where the operational voltage (VDDB–VSS, hereinafter referred to as "interface voltage") of the I/O circuits 53" is 3.3V and a case where the operational voltage is 2.5V. The circuit threshold voltage of the I/O circuits 53" can be varied according to the level of interface voltage of the I/O circuits 53", when the interface voltage is 3.3V and when it is 2.5V. A slight variation in input/output characteristics can be further reduced by varying the circuit threshold voltage of the I/O circuits 53" in accordance with the level of the interface voltage.

For example, suppose that the circuit threshold voltage at the time the interface voltage is 3.3V is "Vth=1.0V." In this case, the circuit threshold voltage at the time the interface voltage is 2.5V is set to be lower than "Vth=1.0V", for example, at "Vth=0.7V." Thereby, in the input circuit, the level of "1" or "0" of an input signal having a voltage amplitude of about 2.5V can be detected at the same timing as in the case of the voltage amplitude of about 3.3V.

According to the I/O circuits 53" having the semiconductor IC device according to the 22nd embodiment, a difference in input/output characteristics between the case where the interface voltage is 3.3V and the case where it is 2.5V can be reduced, and a variation in input/output characteristics of the I/O circuits 53" can be further decreased.

If the variation in input/output characteristics of the I/O circuits 53" due to the interface voltage is decreased, power ripple produced by the I/O circuits 53" when the interface voltage is 3.3V and power ripple produced by the I/O circuits 53" when the interface voltage is 2.5V are made uniform. Thus, when a plurality of chips formed on a single wafer are tested at a time, occurrence of unexpectable high-frequency waves can be suppressed and high-precision tests performed.

If the I/O circuits 53" are built in the 1-chip hybrid semiconductor IC device described in the first to 15th and 21st embodiments of the invention, this IC device can be connected to other semiconductor devices or electric devices with different supply voltage, without using an interface circuit. Needless to say, the same advantage can be obtained and the system can be constituted easily even if the I/O circuits 53" are built in the semiconductor IC device with the single function as described in the 16 to 20th embodiments. The constituted system permits easy extension.

An example of a back-gate bias potential setting circuit for producing potentials Vbp and Vbn will now be described.

Figures 50A, 50B:
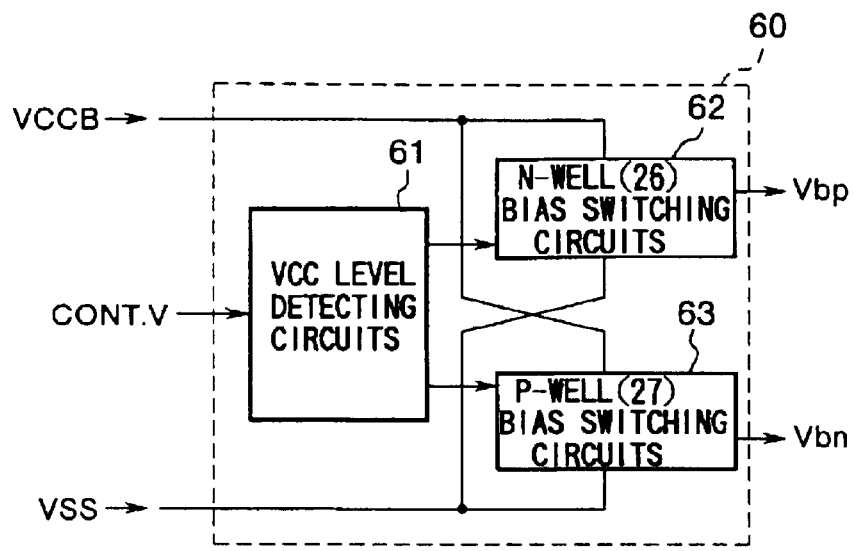
FIG. 50A shows the structure of a well-bias potential switching circuit included in the semiconductor IC device according to the 22nd embodiment.
FIG. 50B shows a relationship between supply voltage and well-bias potential.

FIGS. 50A and 50B show a back-gate bias potential setting circuit provided in the semiconductor IC device according to the 22nd embodiment of the invention. FIG. 50A shows a structure of the back-gate bias potential setting circuit, and FIG. 50B shows a relationship between supply voltage and well bias potential.

As is shown in FIG. 50A, the back-gate bias potential setting circuit 60 comprises a VCC level detection circuit 61 for detecting whether the supply voltage VCC is 3.3V or 2.5V; an N-well (26) potential switching circuit 62 for switching the level of potential Vbp according to a detection signal from the detection circuit 61; and a P-well (27) potential switching circuit 63 for switching the level of potential Vbn.

FIG. 50B shows the relationship between the value of supply power VCC and potential Vbp, Vbn output from the voltage setting circuit 60.

As is shown in FIG. 50B, suppose that a set signal CONT.V is at "1" level, when the operational voltage VCCA of the internal circuits is 3.3V and the interface voltage VCCB is 2.5V. When the set signal CONT.V is at "1" level, the detection circuit 61 outputs a signal for activating the switching circuits 62 and 63. while the switching circuit 62 is being activated, the switching circuit 62 outputs potential Vbp of about 4.5V. Similarly, while the switching circuit 63 is being activated, the switching circuit 63 outputs potential Vbn of about −1.5V.

Suppose that the set signal CONT.V is at "0" level, when the operational voltage VCCA of the internal circuits is 3.3V and the interface voltage VCCB is 3.3V. When the set signal CONT.V is at "0" level, the detection circuit 61 outputs a signal for rendering the switching circuits 62 and 63 inactive while the switching circuit 62 is being inactive, the switching circuit 62 outputs potential Vbp of about 3.3V (=VCCB). Similarly, while the switching circuit 63 is being inactive, the switching circuit 63 outputs potential Vbn of about 0V (=VSS).

As indicated in the table of FIG. 50B showing the relationship between the input and output, the detection circuit 61 and switching circuits 62 and 63 basically switch the values of potentials Vbp and Vbn, depending on whether the level of set signal CONT.V is "1" or "0." Accordingly, if the potential Vbp=4.5V and potential Vbn=–1.5V are generated by the internal potential generating circuit, the detection circuit 61 and switching circuits 62 and 62 can be formed of combinations of logic circuits.

It is also possible to incorporate in the switching circuit 62 a boosting circuit for boosting the interface potential VCCB (2.5V or 3.3V) or supply voltage VCC (3.3V), thereby boosting the interface potential VCCB or supply voltage VCC and setting the potential Vbp at 4.5V while the switching circuit 62 is being active. In this case, while the switching circuit 62 is being inactive, the potential Vbp is set at 3.3V by using the interface potential VCCB or supply voltage VCC.

Similarly, it is possible to incorporate in the switching circuit 63 a voltage-dropping circuit for lowering low-potential supply power VSS(0V) and to lower the low-potential supply power VSS (0V) while the switching circuit 63 is activated and set the potential Vbp at –1.5V. In this case, while the switching circuit 63 is being inactive, the potential Vbp is set at 0V by using low-potential supply power VSS.

An example of the I/O circuits 53" will now be described.

Figure 51:
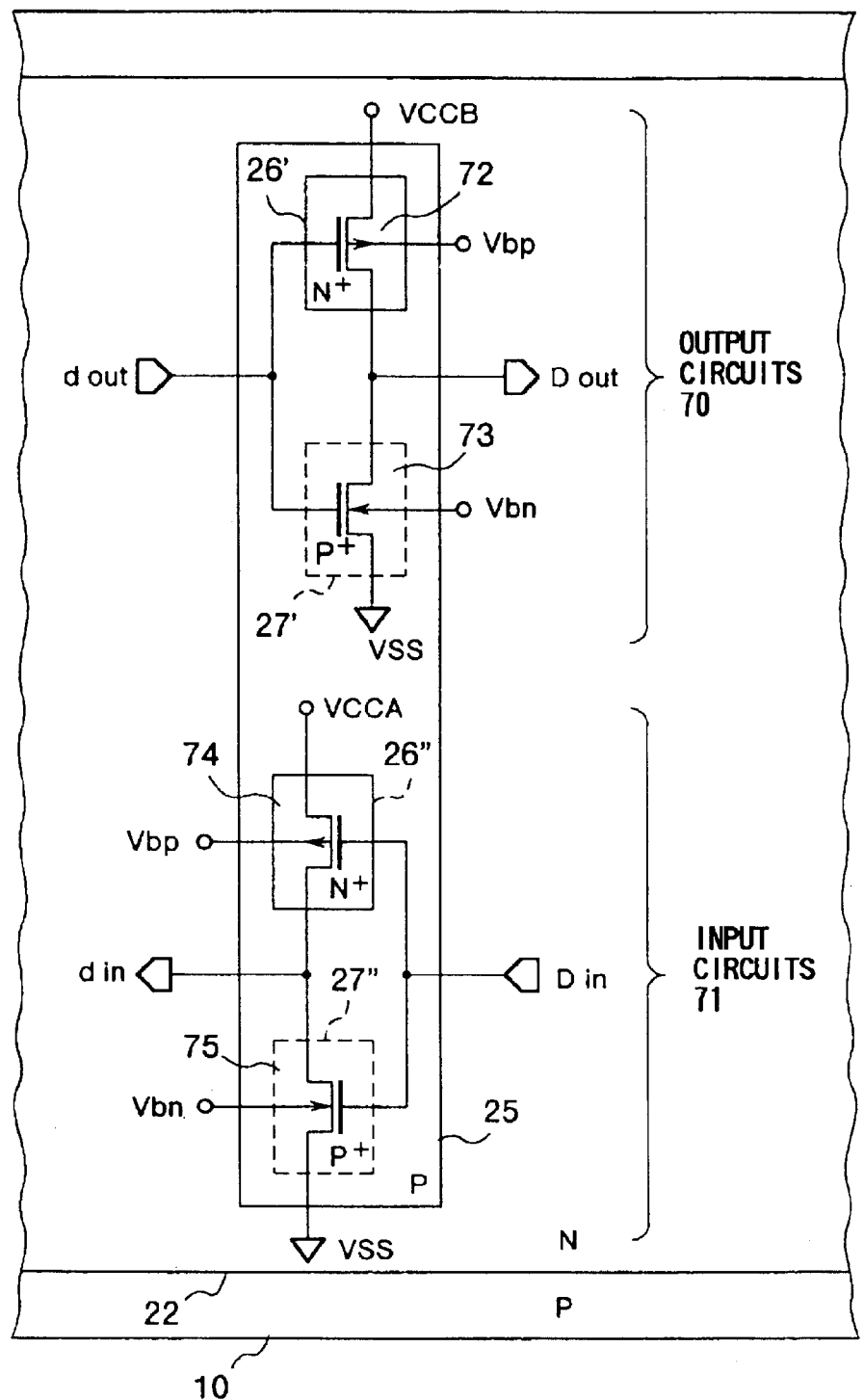
FIG. 51 shows an input circuit and an output circuit included in the semiconductor IC device according to the 22nd embodiment of the invention.

FIG. 51 shows an input circuit and an output circuit included in the semiconductor IC device according to the 22nd embodiment of the invention.

As is shown in FIG. 51, an output circuit 70 and an input circuit 71 are both CMOS inverters.

The output circuit 70 comprises a PMOS 72 having a source connected to interface voltage VCCB, and an NMOS 73 having a drain connected to the drain of the PMOS 72 and a source connected to low-potential power supply VSS. The gates of the PMOS 72 and NMOS 73 are supplied with an internal signal dout. A connection node between the drain of PMOS 72 and the drain of NMOS 73 is connected to an output pad (not shown). When the internal signal dout is at "0" level, the PMOS 72 charges an external terminal (not shown) up to a level of interface voltage VCCB via the output pad. When the internal signal dout is at "1" level, the NMOS 73 discharges the external terminal to the level of power supply VSS via the output pad. Thus, the internal signals dout with logical levels "0" and "1" are converted to output signals Dout with logical levels "0" and "1."

The input circuit 71 comprises a PMOS 74 having a source connected to high-potential power supply VCCA, and an NMOS 75 having a drain connected to the drain of the PMOS 74 and a source connected to low-potential power supply VSS. The gates of the PMOS 74 and NMOS 75 are supplied with an input signal Din via an input pad (not shown). A connection node between the drain of PMOS 74 and the drain of NMOS 75 is an output node of internal signal din. When the internal signal Din is at "0" level, the PMOS 74 sets the level of internal signal din at the level of power supply VCCA. When the input signal Din is at "1" level, the NMOS 75 sets the level of internal signal din at the level of power supply VSS. Thus, the logical level "1" or "0" of the input signal Din is detected, and the input signal Din is input to the internal circuit of the chip as internal signal din with logical level "0" or "1."

FIGS. 52A and 52B show cross-sectional structures of the PMOS 72, PMOS 74, NMOS 73 and NMOS 75.

Specifically, FIG. 52A is a cross-sectional structure of the output circuit and FIG. 52B is a cross-sectional structure of the input circuit.

As is shown in FIG. 52A, the PMOS 72 is formed in an N+ well 26', and the back-gate of PMOS 72 is supplied with potential Vbp. The NMOS 73 is formed in a P+ well 27', and the back-gate of NMOS 73 is supplied with potential Vbn.

As is shown in FIG. 52B, the PMOS 74 is formed in an N+ well 26", and the back-gate of PMOS 74 is supplied with potential Vbp. The NMOS 75 is formed in a P+ well 27", and the back-gate of NMOS 75 is supplied with potential Vbn.

The P+ wells 27' and 27" are formed directly in a P-well 25. The P-well 25 is supplied with supply voltage VSS, and the P+ wells 27' and 27" are supplied with potential Vbn. As has been described with reference to FIG. 50B, the potential Vbn may be set at –1.5V. At this time, a potential difference of 1.5V occurs between the P well 25 and P+ wells 27' and 27". In this case, if a current flows from the P well 25 to the P+ wells 27' and 27", the potential of –1.5V of the P+ wells 27' and 27" increases toward the potential of power supply VSS. This problem can be solved by increasing the resistance of the P well 25 and decreasing the resistance of the P+ wells 27' and 27". Preferably, a parasitic resistance R corresponding to a voltage drop of about 1.5V is provided between the P well 25 and P+ wells 27' and 27". The resistance values of the P well 25 and P+ wells 27' and 27", can be varied by controlling the concentration of P-type impurities. For example, the resistance value of the P well is decreased if the concentration of P-type impurities is increased. If the concentration of P-type impurities is decreased, the resistance value of the P well is increased.

Needless to say, the I/O circuits in the semiconductor IC device according to the 22nd embodiment is applicable not only to the processor but also to various semiconductor IC devices, such as a DRAM, a flash-EEPROM, a D/A converter and an SRAM, which are currently available, as well as to semiconductor IC products using system-on-silicon techniques.

A 23rd embodiment of the present invention will now be described.

FIGS. 53A and 53B show a DRAM according to the 23rd embodiment of the invention. FIG. 53A is a plan view and FIG. 53B is a cross-sectional view taken along line 53B—53B in FIG. 53A. In FIGS. 53A and 53B, the structural elements common to those in FIGS. 46A and 46B are denoted by like reference numerals, and different elements alone will be described.

As is shown in FIGS. 53A and 53B, the DRAM according to the 23rd embodiment differs from that according to the 20th embodiment, in particular, in that the large N-well 22 is divided into an N-well 22A-4 for the memory cells 54-4, an N-well 22B-4 for the internal potential generator 51-4, and an N-well 22C-4 for the peripheral circuits 55-4-and I/O circuits 53'-4.

The N-well 22 may be divided into parts associated with the respective circuit functions, as described above. If the N-well 22 is divided according to the respective circuit functions, an influence of electric noise among the circuits is prevented in tests, and tests with high precision can be carried out.

A 24th embodiment of the present invention will now be described.

FIGS. 54A and 54B show a DRAM according to the 24th embodiment of the invention. FIG. 54A is a plan view and FIG. 54B is a cross-sectional view taken along line 54B—54B in FIG. 54A. In FIGS. 54A and 54B, the structural elements common to those in FIGS. 53A and 53B are denoted by like reference numerals, and different elements alone will be described.

As is shown in FIGS. 54A and 54B, the DRAM according to the 24th embodiment differs from that according to the 23th embodiment, in particular, in that a bias potential to the N-wells 22A-4 and 22B-4 is separated from a bias potential to the N-well 22C-4.

As described above, the N-well 22 may be divided into parts associated with the respective circuit functions and optimal bias potentials may be applied to the divided wells. If optimal bias potentials are applied to the divided wells, an influence of electric noise among the circuits is prevented in tests, ripple of supply power is decreased, and tests with high precision can be carried out.

The well structures according to the 23rd and 24th embodiments are applicable not only to the DRAM but also to various semiconductor products such as a processor, a flash-EEPROM, a D/A converter and an SRAM.

A 25th embodiment of the invention wherein the well structures of the 23rd and 24th embodiments are applied to a flash-EEPROM will now be described.

Figures 55A, 55B:
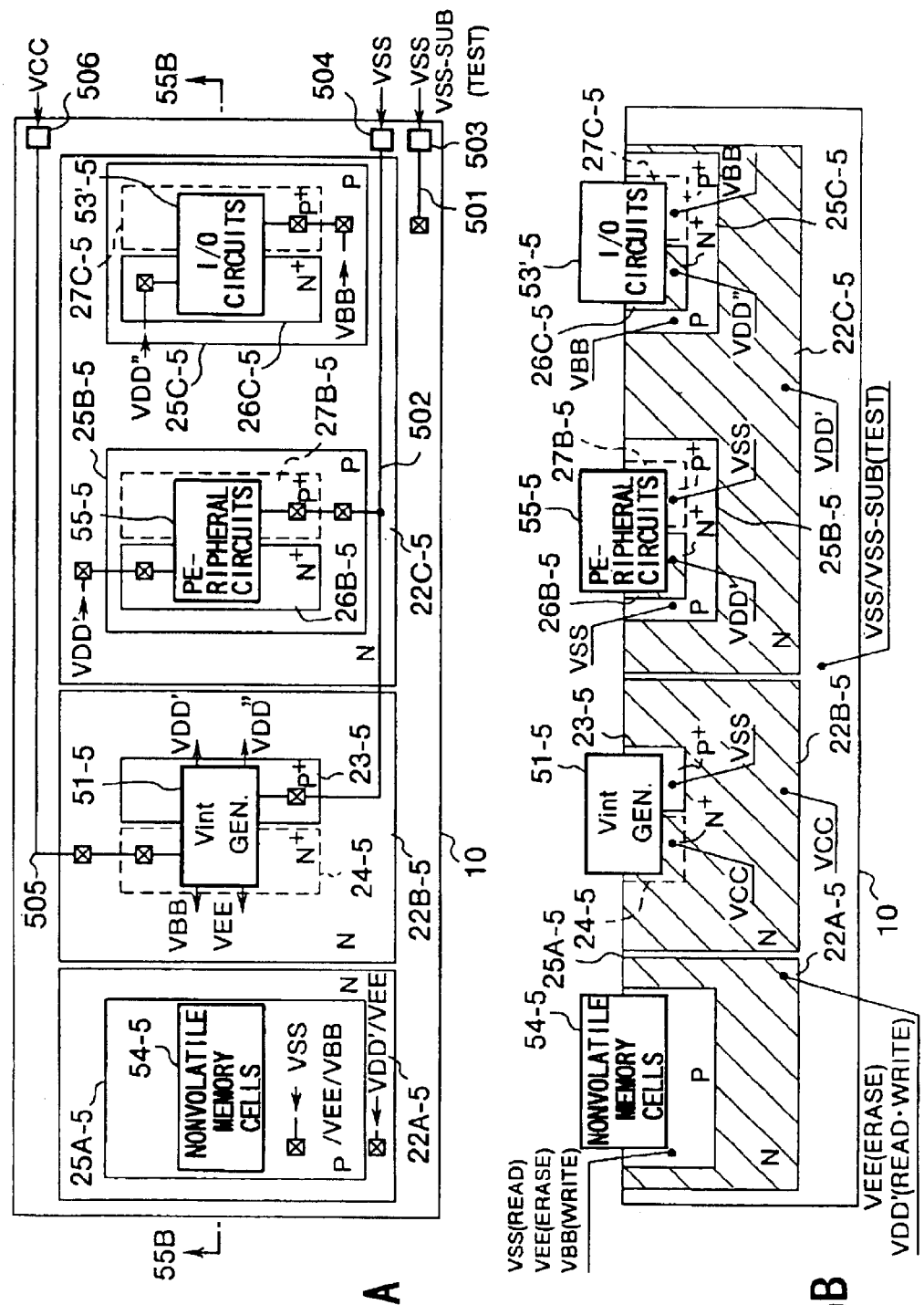
FIG. 55A is a plan view of a semiconductor IC device according to a 25th embodiment of the invention.
FIG. 55B is a cross-sectional view taken along line 55B—55B in FIG. 55A.

FIGS. 55A and 55B show a flash-EEPROM according to the 25th embodiment of the invention. FIG. 55A is a plan view and FIG. 55B is a cross-sectional view taken along line 55B—55B in FIG. 55A. In FIGS. 55A and 55B, the structural elements common to those in FIGS. 44A and 44B are denoted by like reference numerals, and different elements alone will be described.

The flash-EEPROM according to the 25th embodiment differs from that according to the 18th embodiment, in particular, in that the large N-well 22 is divided into an N-well 22A-5 for memory cells 54-5, an N-well 22B-5 for internal potential generator 51-5, and an N-well 22C-5 for the peripheral circuits 55-5 and I/O circuits 53-5.

In this flash-EEPROM, the N-well 22 is divided into parts associated with the respective circuit functions. Thus, like the 23rd and 24th embodiments, an influence of electric noise among the circuits is prevented in tests, and tests with high precision can be carried out.

A bias potential, in particular, to the divided well 25A-5 can be switched irrespective of the other wells. Accordingly, for example, when the memory cells 54-5 are tested by using the peripheral circuits 55-5, a variation in potential of the well 25A-5 does not easily influence the well 22C-5. Therefore, tests with high precision can be carried out.

A 26th embodiment of the invention will now be described.

FIGS. 56A and 56B show a DRAM according to the 26th embodiment of the invention. FIG. 56A is a plan view and FIG. 56B is a cross-sectional view taken along line 56B—56B in FIG. 56A. In FIGS. 56A and 56B, the structural elements common to those in FIGS. 54A and 54B are denoted by like reference numerals, and different elements alone will be described.

As is shown in FIGS. 56A and 56B, the DRAM according to the 26th embodiment differs from that according to the 23rd embodiment, in particular, in that the N-well for I/O circuits 53'-4 is separated from the N-well for peripheral circuits 55-4. In the figures, the peripheral circuits 55-4 are formed in the N-well 22C-4 and the I/O circuits 53'-4 are in the N-well 22D-4. In addition, the potential to the N-well 22A-4 in which the memory cells 54-4 are formed is biased to internal potential VDD" generated by the internal voltage generator 51-4.

Power supply noise increases in the I/O circuits 53'-4, as described above. Since the well for the I/O circuits 53'-4 is separated from the wells for the other circuits, the other circuits are hardly influenced by electric noise produced by the I/O circuits 53'-4. Thereby, tests with higher precision can be performed.

In addition, the potential to the N-well 22A-4 for the memory cells 54-4 is biased not to external supply voltage VCC but to internal potential VDD" generated by the internal voltage generator 51-4. Thereby, the memory cells 54-4 are still less influenced by the ripple of external supply voltage VCC and the memory cells 54-4 can be tested with high precision.

In FIGS. 56A and 56B, the high-potential power to the I/O circuits 53'-4 is external power VCC. However, it may be internal potential VDD", as in the 20th embodiment. If the internal potential VDD" is used as high-potential power to the I/O circuits 53'-4, it is desirable to set the bias potential of the N-well 22A-4 at a potential different from the internal potential VDD". Thereby, the memory cells 54-4 are still less influenced by electric noise of the I/O circuits 53'-4, and the precision in tests can be further improved.

The well structure of the 26th embodiment wherein the I/O circuits are separated from the other circuits can be applied not only to the DRAM but also to various semiconductor products such as a processor, a flash-EEPROM, a D/A converter and an SRAM.

A 27th embodiment of the present invention will now be described.

The 27th embodiment relates to a test of a flash-EEPROM, in particular, to a test of a flash-EEPROM wherein data is erased by releasing electrons to the substrate.

A NAND type flash-EEPROM is known as an example of the flash-EEPROM wherein data is erased by releasing electrons to the substrate.

The NAND type flash-EEPROM comprises integrated memory cells each having a floating gate and a control gate capacitive-coupled to a channel via the floating gate. Such an amount of electrons that corresponds to the level of data is accumulated in the floating gate. The electrons in the amount corresponding to the level of data varies the threshold voltage of the memory cell in accordance with the level of data. The memory cell stores predetermined data on the basis of the threshold voltage.

In the NAND type flash-EEPROM, when data is to be erased, voltage VSS is applied to the control gate and high positive voltage VEE to the substrate and a P well in which the channel of the memory cell is formed. Thereby, electrons accumulated in the floating gate are released to the well.

When data is to be written, a voltage is applied between the source and drain and positive voltage VM is applied to the control gate to render the memory cell conductive, in the state in which voltage VCC is applied to the substrate and negative voltage VBB is applied to the well. In this state, positive voltage VPP, which is higher than voltage VM, is applied to the control gate of the selected memory cell selected for data write. Thus, electrons are injected in the floating gate.

The erase/write characteristics of the memory cells which erase/write data in the above manner vary, depending on a structurally parasitic capacitance such as capacitance Ccf between the control gate and floating gate or capacitance Cfc between the floating gate and channel. Recently developed memory cells have been miniaturized to such a degree that the erase/write characteristics are influenced by a slight variation in structurally parasitic capacitance due to, in particular, "fluctuation in manufacture." Such a variance in capacitance is small among chips or location areas, but large among wafers in which chips are integrated. For example, even if a conductive film or an insulating film is deposited/grown on the wafer, the thickness and quality of the film are not uniform. There is a great difference in film thickness/ quality, for example, between the central portion and peripheral portion of the wafer.

Recently, in order to solve this problem, when data is written or erased, optimal voltages VPP, VEE and VBB are applied to memory cells, wells in which the memory cells are formed, and substrates in which the wells are formed, on a chip-by-chip basis.

However, in the case of flash-EEPROMs in which optimal voltages VPP, VEE and VBB are set for individual chips, tests for data erase ("erase tests") cannot be performed at the same time on the chips formed on a single wafer. Specifically, since an N-type silicon substrate is an N-type silicon wafer itself, only one voltage VEE can be set even if erasure tests are to be performed simultaneously on the chips formed on the single wafer. Thus, in the case of flash-EEPROMs in which optimal voltage VEE is set for individual chips, erasure tests are performed on the chips on the wafer one by one. As a result, the test time for one wafer increases, resulting a lower through-put.

However, in the one-chip hybrid semiconductor IC devices, as described in the first to 15th and 21st embodiments, and in the flash-EEPROMs, as described in the 18th and 25th embodiments, the flash-EEPROM is formed in the well 22-5 provided in the substrate 10. Even if the erase tests are conducted on the chips formed on a single wafer, optimal voltage VEE can be set for each chip.

FIGS. 57A and 57B illustrate a multi-test method for a flash-EEPROM according to a 27th embodiment of the invention. FIG. 57A is a plan view of a wafer on which a plurality of flash-EEPROM chips are formed, and FIG. 57B is a cross-sectional view taken along line 57B—57B in FIG. 57A.

As is shown in FIGS. 57A and 57B, voltages VEE with different values are applied to the respective wells 22-5. The voltages VEE with the different values are optimally set for the respective chips.

According to this multi-test method, erase tests for the flash-EEPROMs in which voltage VEE is set at optimal value on a chip-by-chip basis can be performed simultaneously on the chips formed on the single wafer. Thus, the test time for each wafer can be reduced.

In the flash-EEPROM having the structure as shown in FIGS. 57A and 57B, not only the value of voltage but also the time of application of voltage VEE can be set at optimal value. In addition, erase tests for the flash-EEPROMs in which the time of application of voltage VEE is set at optimal value on a chip-by-chip basis can be performed simultaneously on the chips formed on the single wafer.

Furthermore, both the optimal voltage VEE and the optimal time of application of voltage VEE can be set for each chip, and erase tests for the flash-EEPROMs in which the voltage VEE and the time of application of voltage VEE are set at optimal values on a chip-by-chip basis can be performed simultaneously on the chips formed on the single wafer.

This multi-test is applicable not only to a flash-EEPROM product but also to a one-chip hybrid product in which the flash-EEPROM is integrated.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

What is claimed is:

1. A semiconductor device comprising:
a semiconductor substrate of a first conductivity type;
at least one first well of a second conductivity type formed in the semiconductor substrate;
at least one second well of the first conductivity type formed in at least one first well; and
at least one third well of the second conductivity type formed in at least one first well, wherein
the semiconductor device is composed of semiconductor circuits each formed in at least one first well, at least one second well and at least one third well.

2. The semiconductor device according to claim 1, wherein potentials different from each other are supplied to the first and second wells.

3. The semiconductor device according to claim 1, wherein potentials different from each other are supplied to the first, second and third wells.

4. A semiconductor integrated circuit device comprising:
a semiconductor substrate of a first conductivity type;
at least two first well regions of a second conductivity type formed separately in the semiconductor substrate;
a second well region of the first conductivity type formed in each of the at least two first well regions; and
integrated circuits which are formed on the at least two first well regions and the second well region, respectively, and which have different functions,
wherein the second well region of the first conductivity type having a third well region of the second conductivity type formed therein, formed in each of the at least two first well regions and one of the integrated circuits formed in the each of the at least two first well region, the second well region and the third well region.

5. The semiconductor integrated circuit device according to claim 4, wherein a potential is supplied to the at least two first well regions.

6. The semiconductor integrated circuit device according to claim 4, wherein a potential supplied to the at least two first well regions differs from a potential supplied to the second well region.

7. The semiconductor integrated circuit device according to claim 4, further comprising:
a bias wiring system for supplying a bias potential to the semiconductor substrate; and
a power supply wiring system for supplying operation power to the integrated circuits,
wherein the bias wiring system and the power supply wiring system are located such that the bias wiring system and the power supply wiring system are independent of and not connected to each other.

8. A semiconductor integrated circuit device comprising:
a semiconductor substrate of a first conductivity type;
at least two first well regions of a second conductivity type formed separately in the semiconductor substrate;
a second well region of the first conductivity type formed in each of the at least two first well regions;
a third well region of the second conductivity type formed in each of the at least two first well regions; and
the integrated circuits formed on each of the at least two first well regions, the second well region and the third well region.

9. The semiconductor integrated circuit device according to claim 8, wherein a potential supplied to the at least two first well regions differs from a potential supplied to the second well region and the third well region.

10. The semiconductor integrated circuit device according to claim 8, wherein at least one of the integrated circuits is one of a non-volatile memory circuit, an analog circuit, a digital circuit, a digital/analog circuit, a static memory circuit, a random-access memory circuit, and a processor circuit.

11. The semiconductor integrated circuit device according to claim 10, wherein each of the integrated circuits has a potential application terminal for receiving a different potential applied thereto.

12. The semiconductor integrated circuit device according to claim 11, wherein each of the integrated circuits has a dedicated output terminal for outputting an output signal when the potential is applied to the potential application terminal thereof.

13. The semiconductor integrated circuit device according to claim 12, wherein each of the integrated circuits includes a control circuit for performing on/off control of application of the potential to the potential application terminal thereof.

14. The semiconductor integrated circuit device according to claim 13, wherein each of the integrated circuits includes a voltage generating circuit for application of the potential to the potential application terminal thereof.

15. The semiconductor integrated circuit device according to claim 8, wherein a back gate bias is supplied to the at least two first well regions, the second well region and the third well region, and an input/output circuit or an interface circuit is formed in the at least two first well regions, the second well regions and the third well region.

* * * * *